United States Patent
Yoo et al.

(10) Patent No.: US 10,856,430 B2
(45) Date of Patent: *Dec. 1, 2020

(54) ELECTRONIC DEVICE INCLUDING FLEXIBLE DISPLAY

(71) Applicant: SAMSUNG ELECTRONICS CO., LTD., Suwon-si (KR)

(72) Inventors: Chung-Keun Yoo, Suwon-si (KR); Jung-Jin Kim, Suwon-si (KR); Jong-Yoon Kim, Yongin-si (KR); Gi-Dae Kim, Seoul (KR); Young-Sun Park, Yongin-si (KR); Moo-Hyun Baek, Suwon-si (KR); Hyun-Woo Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/727,606

(22) Filed: Dec. 26, 2019

(65) Prior Publication Data

US 2020/0137908 A1    Apr. 30, 2020

Related U.S. Application Data

(63) Continuation of application No. 15/966,364, filed on Apr. 30, 2018.

(30) Foreign Application Priority Data

May 2, 2017    (KR) ........................ 10-2017-0056440

(51) Int. Cl.
*H05K 5/02*    (2006.01)
*H05K 5/00*    (2006.01)
(Continued)

(52) U.S. Cl.
CPC ........... *H05K 5/0226* (2013.01); *E05D 3/122* (2013.01); *E05D 3/18* (2013.01); *E05D 11/06* (2013.01);
(Continued)

(58) Field of Classification Search
CPC .. H05K 5/0226; H05K 5/0217; H05K 5/0017; E05D 2/122; E05D 3/18;
(Continued)

(56) References Cited

U.S. PATENT DOCUMENTS 6,510,325 B1    1/2003    Mack, II et al.
8,804,349 B2    8/2014    Lee et al.
(Continued)

FOREIGN PATENT DOCUMENTS

CN    205858944 U    1/2017

OTHER PUBLICATIONS

Search Report dated Aug. 2, 2018 in counterpart International Patent Application No. PCT/KR2018/004830.
(Continued)

*Primary Examiner* — Hoa C Nguyen
(74) *Attorney, Agent, or Firm* — Nixon & Vanderhye P.C.

(57)    ABSTRACT

According to an embodiment of the present disclosure, an electronic device may comprise a first housing including a first surface and a second surface facing in a direction opposite the first surface, a second housing including a third surface and a fourth surface facing in a direction opposite the third surface, a hinge disposed between the first housing and the second housing configured to provide rotational motion between the first housing and the second housing, and a flexible display disposed from the first surface of the first housing across the hinge to the third surface of the second housing, at least part of the flexible display configured to form a curved surface as the hinge structure is folded,
(Continued)

wherein the hinge may include dual-axis hinges configured to provide a first rotational axis allowing the first housing to rotate about the second housing and a second rotational axis allowing the second housing to rotate about the first housing and slides coupled with the first housing and the second housing and configured to provide sliding motion perpendicular to a lengthwise direction of the first housing and the second housing.

30 Claims, 34 Drawing Sheets

(51) Int. Cl.
| | |
|---|---|
| *H05K 7/14* | (2006.01) |
| *H05K 5/03* | (2006.01) |
| *E05D 3/12* | (2006.01) |
| *E05D 11/06* | (2006.01) |
| *F16C 29/02* | (2006.01) |
| *E05D 3/18* | (2006.01) |
| *G06F 1/16* | (2006.01) |
| *H01Q 1/22* | (2006.01) |

(52) U.S. Cl.
CPC ............ *F16C 29/02* (2013.01); *G06F 1/1616* (2013.01); *G06F 1/1652* (2013.01); *G06F 1/1681* (2013.01); *H01Q 1/2266* (2013.01); *H05K 5/0017* (2013.01); *H05K 5/03* (2013.01); *H05K 7/1427* (2013.01); *E05Y 2201/224* (2013.01); *E05Y 2900/606* (2013.01); *F16C 2380/00* (2013.01)

(58) Field of Classification Search
CPC ...... E05D 3/183; E05D 11/06; H04M 1/0216; H04M 1/0268; G06F 1/1652; G06F 1/1681
See application file for complete search history.

(56) References Cited

U.S. PATENT DOCUMENTS

| | | | |
|---|---|---|---|
| 9,119,316 B2 | 8/2015 | Lee | |
| 9,173,287 B1 | 10/2015 | Kim et al. | |
| 9,204,565 B1 | 12/2015 | Lee et al. | |
| 9,572,272 B2 | 2/2017 | Lee | |
| 9,848,502 B1* | 12/2017 | Chu | E05D 7/00 |
| 9,874,906 B1 | 1/2018 | Hsu | |
| 2012/0264489 A1 | 10/2012 | Choi et al. | |
| 2012/0307472 A1 | 12/2012 | Bohn et al. | |
| 2013/0010405 A1 | 1/2013 | Rothkopf et al. | |
| 2014/0126121 A1 | 5/2014 | Griffin et al. | |
| 2014/0226275 A1 | 8/2014 | Ko et al. | |
| 2014/0355195 A1* | 12/2014 | Kee | G06F 1/1616 |
| | | | 361/679.27 |
| 2015/0013107 A1* | 1/2015 | Shin | E05D 3/06 |
| | | | 16/366 |
| 2015/0185788 A1* | 7/2015 | Matsuoka | B21D 53/40 |
| | | | 361/679.02 |
| 2015/0366089 A1 | 12/2015 | Park et al. | |
| 2016/0172623 A1 | 6/2016 | Lee | |
| 2017/0013729 A1 | 1/2017 | Rothkopf et al. | |
| 2017/0115701 A1* | 4/2017 | Bae | G06F 1/1652 |
| 2017/0160769 A1 | 6/2017 | Xu | |
| 2017/0192460 A1* | 7/2017 | Watanabe | G09F 9/00 |
| 2017/0227994 A1 | 8/2017 | Hsu | |
| 2019/0179373 A1 | 6/2019 | Cheng et al. | |
| 2019/0354138 A1* | 11/2019 | Araki | H04M 1/02 |

OTHER PUBLICATIONS

Written Opinion dated Aug. 2, 2018 in counterpart International Patent Application No. PCT/KR2018/004830.
Yoo et al, U.S. Appl. No. 15/966,364, filed Apr. 30, 2018.
Extended Search Report dated Feb. 19, 2020 in counterpart European Patent Application No. 18794153.9.
Office Action dated Mar. 26, 2020 in U.S. Appl. No. 15/966,364.

* cited by examiner

ELECTRONIC DEVICE INCLUDING FLEXIBLE DISPLAY

CROSS-REFERENCE TO RELATED APPLICATIONS

This application is a continuation of U.S. application Ser. No. 15/966,364, filed on Apr. 30, 2018, which claims priority to Korean Patent Application No. 10-2017-0056440, filed May 2, 2017. The contents of each of these applications are incorporated herein in their entirety.

TECHNICAL FIELD

The present disclosure relates to electronic devices, and for example, to electronic devices with a foldable flexible display on the outer surface thereof.

DISCUSSION OF RELATED ART

Advancing information communication and semiconductor technologies accelerate the spread and use of various electronic devices. In particular, recent electronic devices are being developed to carry out communication while being carried.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

As mobile communication services extend up to multimedia service sectors, electronic devices require a larger display to allow users satisfactory use of multimedia services as well as voice call or text messaging services. This, however, trades off the trend of electronic devices being compact.

An electronic device (e.g., a portable terminal) includes a display with a flat surface or both a flat and curved surface. An electronic device with an existing type of display may need another terminal to implement a larger size than that of the electronic device due to the fixed display structure.

In a foldable electronic device structure, the area where the display is folded is split into portions which are implemented to move about each other, rendering it difficult for the display to rest in a fixed position in the electronic device. Where the electronic device repeats between the flat position and folded position, the foldable area of the display may deform, failing to maintain the flat surface.

SUMMARY

According to an example embodiment of the present disclosure, there may be provided an electronic device with a flexible display that may be flattened or folded by the user's manipulation.

According to an example embodiment of the present disclosure, there may be provided an electronic device with a flexible display that may allow the flexible display to be freely varied between a small screen mode and a large screen mode.

According to an example embodiment of the present disclosure, there may be provided an electronic device with a flexible display, in which a hinge structure is provided in the area where the flexible display is folded to bear variations in length to the flexible display.

According to an example embodiment of the present disclosure, an electronic device may comprise a first housing including a first surface and a second surface facing in a direction opposite the first surface, a second housing including a third surface and a fourth surface facing in a direction opposite the third surface, a hinge disposed between the first housing and the second housing and configured to provide rotational motion between the first housing and the second housing, and a flexible display assembly disposed from the first surface of the first housing across the hinge to the third surface of the second housing, at least part of the flexible display assembly configured to form a curved surface as the hinge structure is folded, wherein the hinge may include dual-axis hinges providing a first rotational axis configured to allow the first housing to rotate about the second housing and a second rotational axis configured to allow the second housing to rotate about the first housing and slide assemblies coupled with the first housing and the second housing and configured to provide sliding motion perpendicular to a lengthwise direction of the first housing and the second housing.

Other aspects, advantages, and salient features of the disclosure will become apparent to those skilled in the art from the following detailed description, which, taken in conjunction with the annexed drawings, discloses example embodiments of the disclosure.

BRIEF DESCRIPTION OF THE DRAWINGS

The above and other aspects, features and attendant advantages of the present disclosure will become more apparent from the following detailed description, taken in conjunction with the accompanying drawings, wherein:

FIGS. 4A and 4B are diagrams illustrating a side surface of a folded electronic device according to an embodiment of the present disclosure, wherein FIG. 4A is a side view illustrating a curved area of the display assembly, and FIG. 4B is a side view opposite to FIG. 4A;

FIGS. 11A and 11B are diagrams illustrating a cross section of a gear unit of the dual-axis hinge module disposed in the electronic device according to an embodiment of the present disclosure, wherein FIG. 11A is a cross-sectional view illustrating the electronic device partially folded, and FIG. 11B is a cross-sectional view illustrating the electronic device fully folded;

Throughout the drawings, like reference numerals will be understood to refer to like parts, components, and structures.

DETAILED DESCRIPTION

Figure 1:
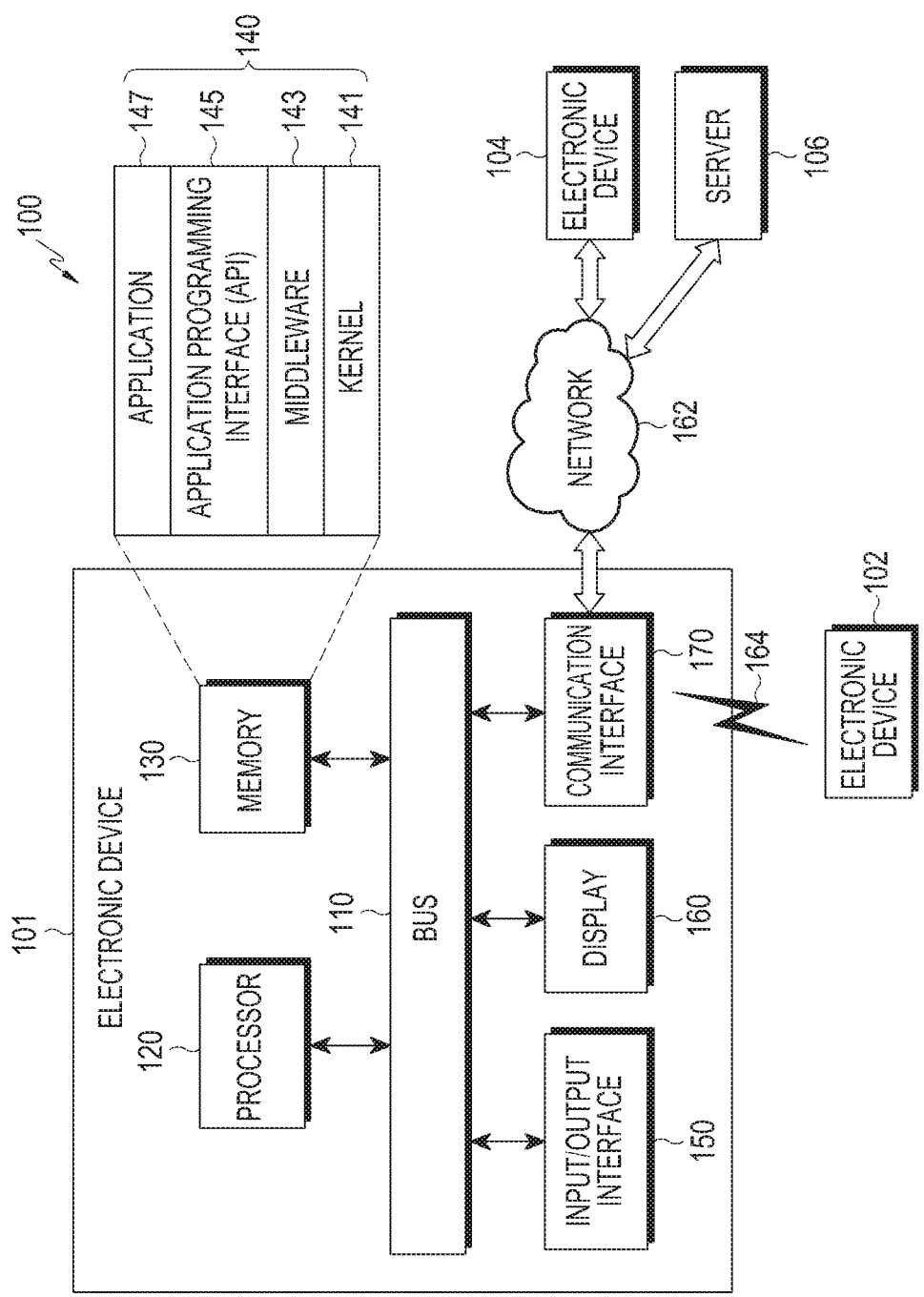
FIG. 1 is a diagram illustrating an electronic device in a network environment according to an embodiment of the present disclosure.

Hereinafter, various example embodiments of the present disclosure are described with reference to the accompanying drawings. However, it should be appreciated that the present disclosure is not limited to the embodiments, and all changes and/or equivalents and/or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may be used to reference various components regardless of importance and/or order and are used to distinguish a component from another without limiting the components. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. On the other hand, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be used interchangeably used with the terms "suitable for," "having the capacity to," "designed to," "adapted to," "made to," or "capable of" depending on circumstances. The term "configured (or set) to" does not necessarily refer to "specifically designed in hardware to." Rather, the term "configured to" may refer to a situation in which a device can perform an operation together with another device or parts. For example, the term "processor configured (or set) to perform A, B, and C" may refer, for example, and without limitation, to a generic-purpose processor (e.g., a CPU or application processor) that may perform the operations by executing one or more software programs stored in a memory device or a dedicated processor (e.g., an embedded processor) for performing the operations, or the like.

The terms as used herein are provided merely to describe some embodiments thereof, but not to limit the scope of other embodiments of the present disclosure. It is to be understood that the singular forms "a," "an," and "the" include plural references unless the context clearly dictates otherwise. The terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may not be interpreted to exclude embodiments of the present disclosure.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a mobile medical device, a camera, or a wearable device. According to an embodiment of the present disclosure, the wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit), or the like, but is not limited thereto.

According to an embodiment of the present disclosure, the electronic device may be a home appliance. Examples of the home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™ PlayStation™), an electronic dictionary, an electronic key, a camcorder, or an electronic picture frame, or the like, but is not limited thereto.

According to an embodiment of the present disclosure, examples of the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, automatic teller's machines (ATMs), point of sales (POS) devices, or internet of things (IoT) devices (e.g., a bulb, various sensors, an electric or gas meter, a sprinkler, a fire alarm, a thermostat, a street light, a toaster, fitness equipment, a hot water tank, a heater, or a boiler), or the like, but is not limited thereto.

According to various embodiments of the disclosure, examples of the electronic device may at least one of part of a piece of furniture or building/structure, an electronic board, an electronic signature receiving device, a projector, or various measurement devices (e.g., devices for measuring water, electricity, gas, or electromagnetic waves), or the like, but is not limited thereto.

According to an embodiment of the present disclosure, the electronic device may be one or a combination of the above-listed devices. According to an embodiment of the present disclosure, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments of the present disclosure. As used herein, the term "user' may denote a person or electronic device using an electronic device or accessory device, which is described below, or a device (e.g., an artificial intelligence electronic device) using the accessory device.

Referring to FIG. 1, according to an example embodiment of the present disclosure, an electronic device 100 is included in a network environment 101.

The electronic device 101 may include a bus 110, a processor (e.g., including processing circuitry) 120, a memory 130, an input/output interface (e.g., including input/output circuitry) 150, a display 160, and a communication interface (e.g., including communication circuitry) 170. In some embodiments, the electronic device 101 may exclude at least one of the components or may add another component.

The bus 110 may include a circuit for connecting the components 110 to 170 with one another and transferring communications (e.g., control messages or data) between the components.

The processor 120 may include various processing circuitry, such as, for example, and without limitation, one or more of a dedicated processor, a central processing unit (CPU), an application processor (AP), or a communication processor (CP), or the like. The processor 120 may perform control on at least one of the other components of the electronic device 101 or perform an operation or data processing relating to communication.

The memory 130 may include a volatile or non-volatile memory. For example, the memory 130 may store commands or data related to at least one other component of the electronic device 101. According to an embodiment of the present disclosure, the memory 130 may store software or a program 140. The program 140 may include, e.g., a kernel 141, middleware 143, an application programming interface (API) 145, or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147).

The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, or an electronic paper display, or the like, but is not limited thereto. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user.

For example, the communication interface 170 may set up communication between the electronic device 101 and an external device (e.g., a first electronic device 102, a second electronic device 104, or a server 106). For example, the communication interface 170 may be connected with the network 162 through wireless or wired communication to communicate with the external electronic device (e.g., the second external electronic device 104 or server 106).

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (Wi-Bro), or global system for mobile communication (GSM).

According to an embodiment of the present disclosure, the wireless communication may include at least one of, e.g., wireless-fidelity (Wi-Fi), light-fidelity (Li-Fi), bluetooth, bluetooth low power (BLE), zigbee, near-field communication (NFC), magnetic secure transmission (MST), radio frequency (RF), or body area network (BAN) as denoted with element 164 of FIG. 1. According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

According to an embodiment of the present disclosure, the electronic device 101 may be operated from an unfolded position to a folded position via a hinge structure placed inside. The electronic device in the unfolded position may be referred to as the 'unfolded electronic device' or 'electronic device with a plurality of housing arranged horizontally,' and the electronic device in the folded position may be referred to as the 'folded electronic device."

Figure 2A:
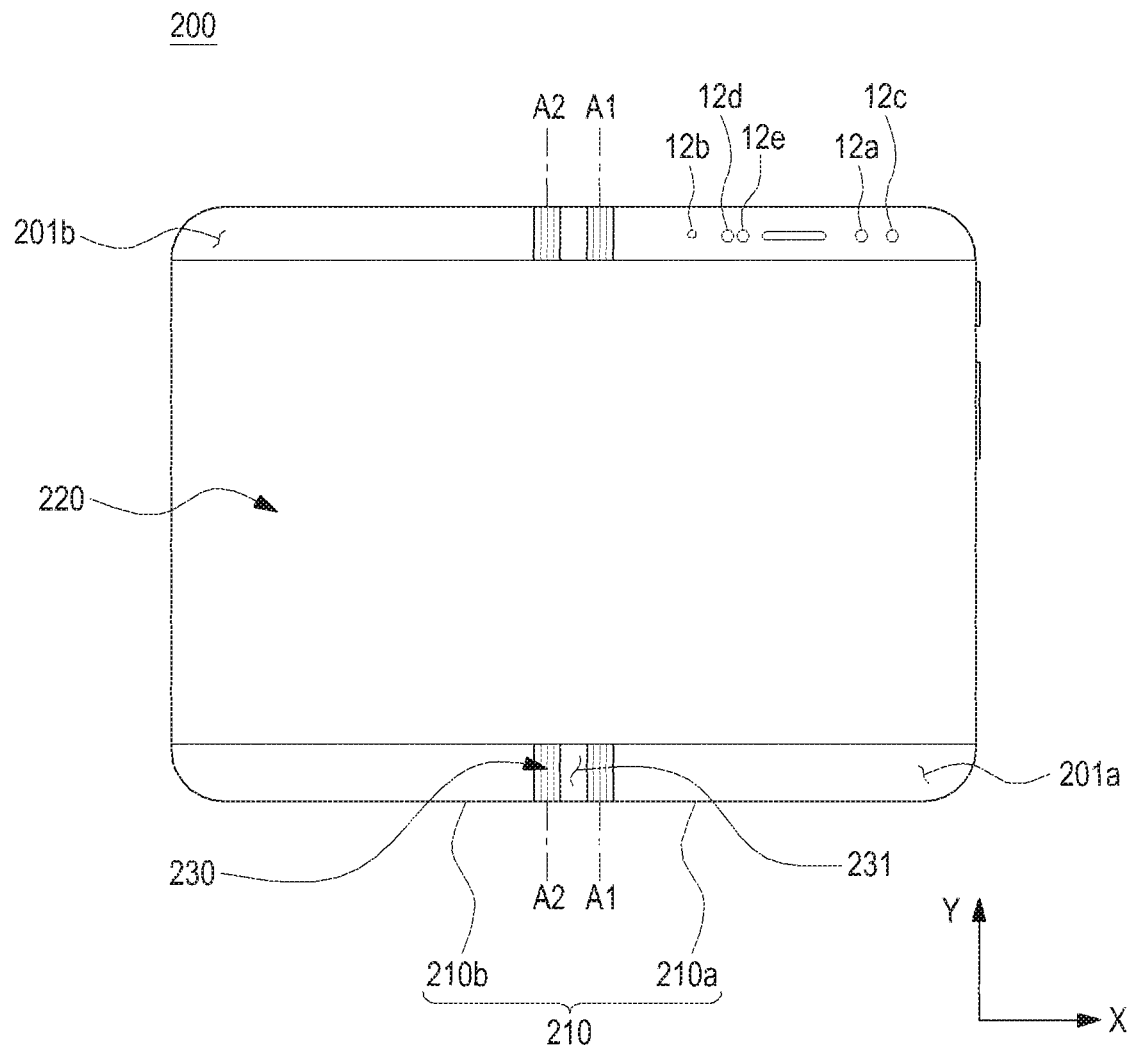
FIG. 2A is a front view illustrating an electronic device in an unfolded position according to an embodiment of the present disclosure.
Figure 2B:
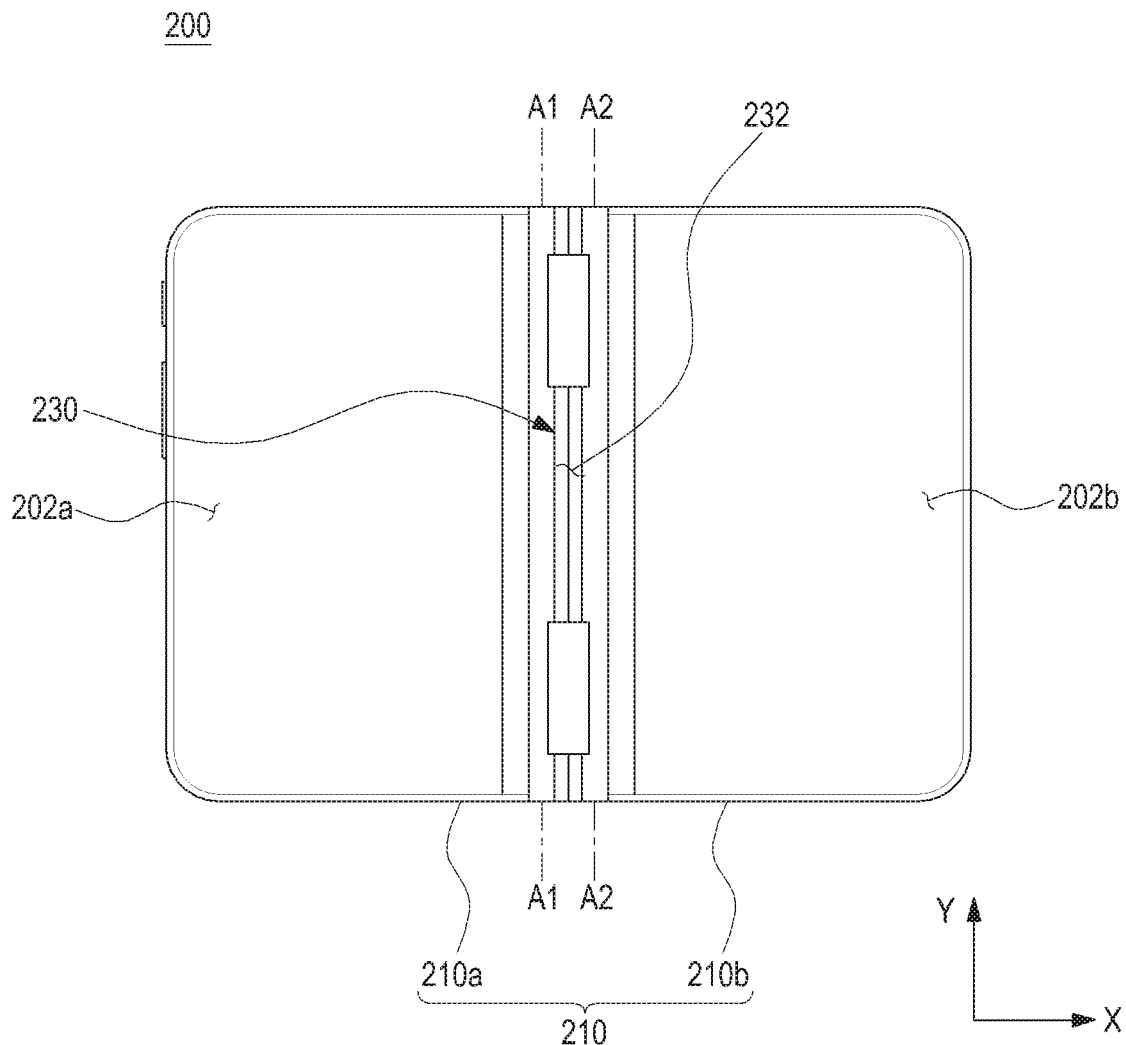
FIG. 2B is a rear view illustrating an electronic device in an unfolded position, which is viewed from a different direction, according to an embodiment of the present disclosure.
Figure 2C:
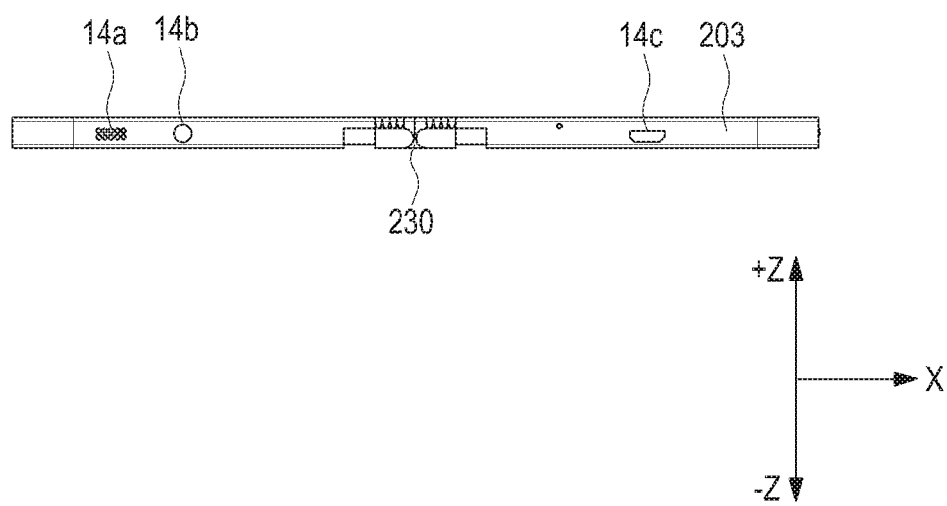
FIG. 2C is a side view illustrating an electronic device in an unfolded position, which is viewed from a side direction, according to an embodiment of the present disclosure.

FIG. 2A is a front view illustrating an electronic device 200 as unfolded according to an embodiment of the present disclosure. FIG. 2B is a rear view illustrating an electronic device 200 as unfolded, which is viewed from a different direction, according to an embodiment of the present disclosure. FIG. 2C is a side view illustrating an electronic device 200 as unfolded, which is viewed from a side direction, according to an embodiment of the present disclosure.

Referring to FIGS. 2A, 2B and 2C, the electronic device 200 may have the same structure, in whole or part, as the electronic device 101 of FIG. 1.

In the three-axis rectangular coordinate system as shown in FIGS. 2A to 2C, 'X,' 'Y,' and 'Z,' respectively, may denote the width, length, and height direction of the electronic device 200. According to an embodiment of the present disclosure, the 'Z axis' may mean the first direction (+Z) and the second direction (−Z).

As shown in FIGS. 2A to 2C, the electronic device 200 may include a plurality of housings 210, a display assembly 220, and a connection structure (e.g., a hinge structure 230). The housings 210 may include a first housing 210a and a second housing 210b. The first housing 210a may include a first surface 201a, which corresponds a first surface, a second surface 202a, which corresponds to a rear surface, and a side surface 203 surrounding part of the space between the first surface 201a and the second surface 202a. The second housing 210b may include a third surface 201b corresponding to a front surface, a fourth surface 202b corresponding to a rear surface, and a side surface 203 surrounding part of the space between the third surface 201b and the fourth surface 202b.

According to an embodiment of the present disclosure, at least part of the first surface 201a of the first housing 210a may be opened, and a transparent cover is mounted to form at least part of the first surface 201a of the first housing 210a to close the opened first surface 201a of the first housing 210a. As another example, at least part of the third surface 201b of the second housing 210b may be opened, and a transparent cover may be mounted to form at least part of the third surface 201b of the second housing 210b t close the opened third surface 201b of the second housing 210b.

According to an embodiment of the present disclosure, a keypad including buttons for delivering signals or touch keys (not shown) may be provided in an area (e.g., a bezel area or area overlapping the display) of the transparent cover, e.g., in the front surfaces 201a and 201b of the housing 210 of the electronic device 200. The touch keys may generate input signals as they are touched by the user's body. According to an embodiment of the present disclosure, the keypad may be implemented to include only mechanical buttons or only the touch keys. As another example, the keypad may be implemented in a mixed type of the mechanical button type and the touch type. The keypad may provide various screens on the display assembly corresponding to shorter or longer presses or touches on the buttons.

According to an embodiment of the present disclosure, the housing 210 has various circuit device inside, such as the processor 120, the memory 130, the input/output interface 150, and the communication interface 170 as described above in connection with FIG. 1, and the housing 210 may receive a battery (e.g., the battery 370 of FIG. 5 or the battery 380 of FIG. 6) inside to secure power.

According to an embodiment of the present disclosure, the electronic device 200 may include a first housing 210a, a second housing 210b, and a hinge structure 230. The hinge structure 230 may couple the first housing 210a and the second housing 210b so that the first housing 210a and the second housing 210b may rotate about each other. For example, the first housing 210a may be folded or unfolded about the second housing 210b.

According to an embodiment of the present disclosure, the first housing may be positioned on a right-hand side when the display assembly 220 is front-facing (e.g., the first direction +Z), and a first camera 12a, a light source unit 12b, or an iris camera 12c may be provided in an upper area of the front surface (the first surface 201a). For example, the light source unit 12b may be an infrared (IR) light emitting diode (LED). The iris camera 12c may take an image of the user's eye using, as a light source, near infrared light emitted from the IR LED, thereby recognizing iris information. As another example, a light source unit indication lamp 12d, an illuminance sensor or proximity sensor 12e may be included in the upper area of the front surface of the electronic device 200.

According to an embodiment of the present disclosure, the second housing 210b may be positioned on a left-hand side when the display assembly 220 is front-facing (e.g., the first direction +Z), and a second camera, a heart rate monitor (HRM), or a flash (not shown) may be provided in an upper area of the front surface (the third surface 201b). According to an embodiment of the present disclosure, although an example is described in which the modules are arranged in particular areas in a portion of the housing, embodiments of the present disclosure are not limited thereto, and the number, arrangement, and other configuration of the modules may be varied depending on the shape and structure of the electronic device.

According to an embodiment of the present disclosure, the display assembly 220 may be disposed on the front surface of the first housing 210a, the second housing 210b, and the hinge structure 230. The display assembly 220 is formed to extend from the first housing 210a through the hinge structure 230 to the second housing 210b and may be provided in a flexible structure that may be folded around virtual hinge axes A1 and A2 formed along the lengthwise direction of the hinge structure 230. The hinge structure 230 may include a fifth surface 231 front-facing_(the first direction +Z) and a sixth surface 232 facing in a direction (the second direction −Z) opposite to the front surface. According to an embodiment of the present disclosure, the second surface 202a of the first housing 210a and the fourth surface 202b of the second housing 210b are positioned facing in a second direction −Z which is opposite to the first direction +Z and may be formed of a material, e.g., reinforced glass or synthetic resin, that transmits radio waves or magnetic fields. As another example, the second surface 202a of the first housing 210a and the fourth surface 202b of the second housing 210b may be formed of a metal (e.g., aluminum, special treatment steel (STS), or magnesium), or at least partially, of a synthetic resin.

According to an embodiment of the present disclosure, the second surface 202a of the first housing 210a and the fourth surface 202b of the second housing 210b may be formed of the same material as the side surface 203. As another example, the second surface 202a and the fourth surface 202b of the housing 210 may be formed integral with the side surface 203. The second surface 202a and the fourth surface 202b, alongside the display assembly 220, may form the outer appearance of the electronic device 200.

According to an embodiment of the present disclosure, the side surface 203 may form a side surface of the housing 210, be positioned in a direction perpendicular to the first and third surfaces 201a and 201b and/or second and fourth surfaces 202a and 202b, and be formed of a material, e.g., reinforced glass or synthetic resin, which may transmit radio waves or magnetic fields. As another example, the side surface 203 may be formed of a metal (e.g., aluminum, STS, or magnesium), or at least partially, of a synthetic resin. In the side surface 203 may be formed a speaker hole 14a, an earphone jack 14b or charging terminal hole 14c enabling an external connection of a speaker enclosure, ear jack, or charging terminal embedded in the electronic device 200.

Figures 3A, 3B:
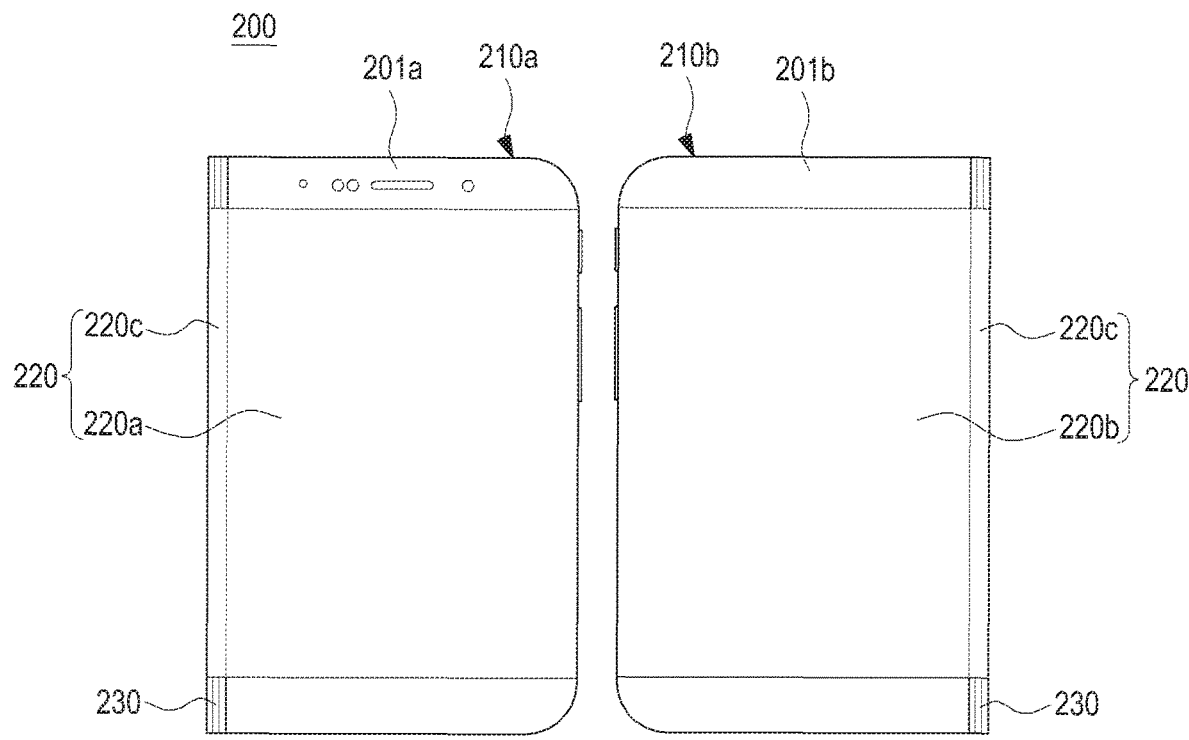
FIG. 3A is a front view illustrating a surface of an electronic device in a folded position which is viewed from a front direction according to an embodiment of the present disclosure.
FIG. 3B is a rear view illustrating another surface of the electronic device in a folded position which is viewed from another direction according to an embodiment of the present disclosure.
Figure 3C:
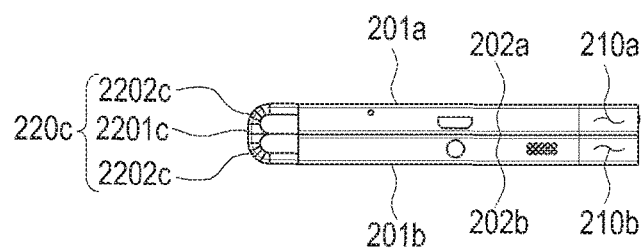
FIG. 3C is a side view illustrating an electronic device in a folded position which is viewed from a side direction according to an embodiment of the present disclosure.

FIG. 3A is a front view illustrating a surface of an electronic device 200 as folded which is viewed from a front direction according to an embodiment of the present disclosure. FIG. 3B is a rear view illustrating another surface of the electronic device 200 as folded which is viewed from another direction according to an embodiment of the present disclosure. FIG. 3C is a side view illustrating an electronic device 200 as folded which is viewed from a side direction according to an embodiment of the present disclosure.

The structure of the electronic device 200 shown in FIGS. 3A, 3B and to 3C may be the same in whole or part as the structure of the electronic device 200 of FIG. 2.

Referring to FIGS. 3A and 3C the electronic device 200 may include a first housing 210a, a second housing 210b, and a hinge structure 230. The hinge structure 230 may couple the first housing 210a and the second housing 210b so that the first housing 210a and the second housing 210b may rotate about each other.

According to an embodiment of the present disclosure, the first housing 210a of the electronic device 200 may rotate at 0 degrees to 180 degrees about the second housing 210b. As the first housing 210a rotates 180 degrees about the second housing 210b to fold the electronic device 200, the second surface 202a of the first housing 210a may be rendered to face the fourth surface 202b of the second housing 210b. As another example, the hinge structure 230 provided between the first housing 210a and the second housing 210b may form an outer surface that varies between flat and curved with respect to at least one virtual rotational axis (the rotational axes A1 and A2 of FIG. 2a). At least part of the right surface of the outer surface of the hinge structure 230, with respect to the virtual rotational axis (e.g., the virtual rotational axes A1 and A2 of FIG. 2a) formed along the lengthwise direction may extend from the first housing 210a, and at least part of the left surface may extend from the second housing 210b.

According to an embodiment of the present disclosure, the display assembly 220 may be disposed to extend from the first housing 210a through the outer surface of the hinge structure 230 to the second housing 210b. In the folded position of the electronic device 200, a first area 220a of the display assembly 220 disposed in the first housing 210a may be disposed to be front-facing (e.g., the +Z direction), and a second area 220b of the display assembly 220 disposed in the second housing 210b may be disposed to be rear-facing (e.g., the −Z direction).

As another example, a third area 220c disposed in the outer surface of the hinge structure 230 may be disposed in a side surface direction (e.g., a direction in which at least part thereof is perpendicular to the front surface or rear surface). The third area 220c may form a surface protruding from the side surface, and part of the protruding surface may include a flat surface 2201c and/or curved surfaces 2202c. For example, a middle of the third area 220c may be the flat surface 2201c, and the curved surfaces 2202c extending from both sides thereof may be curved surfaces smoothly extending from the first area 220a and/or the second area 220b.

Figure 4A:
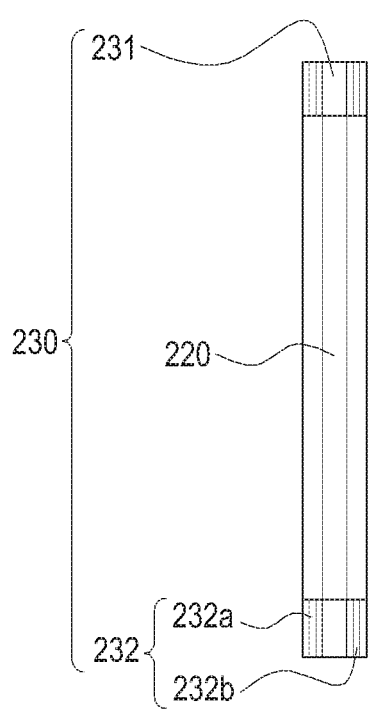
Figure 4B:
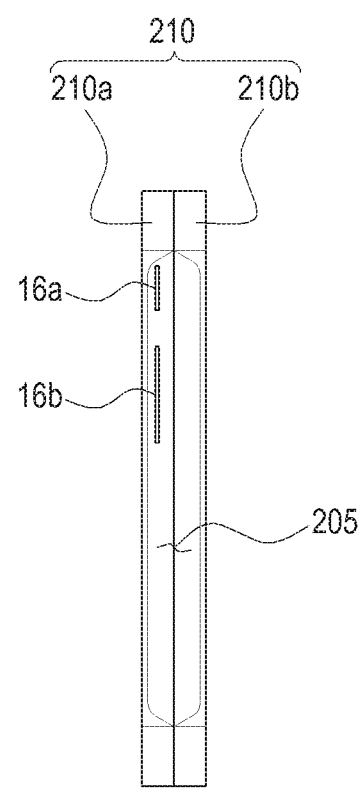

FIGS. 4A and 4B is a diagram illustrating a side surface of a folded electronic device 200 according to an embodiment of the present disclosure. FIG. 4A is a side view illustrating a curved area of the display assembly 220, and FIG. 4B is a side view opposite to FIG. 4A.

The structure of the electronic device 200 shown in FIGS. 4A and 4B may be the same in whole or part as the structure of the electronic device 200 of FIGS. 3A to 3C. According to an embodiment of the present disclosure, the electronic device 200 may include a first housing 210, a second housing 210b, and a hinge structure 230. The hinge structure 230 may couple the first housing 210a and the second housing 210b so that the first housing 210a and the second housing 210b may rotate about each other.

Referring to FIG. 4A, multi bars 232 may be disposed at both sides of a center bar forming the outer surface of the hinge structure 230, on the side surface of the electronic device 200, as folded, where the display assembly 220 is disposed. The center bar 231 may form the center of the outer surface of the hinge structure 230 and support the display assembly 220 to form a flat surface on the side. The multi bars 232 may be formed at both sides of the center bar 231 and may at least partially face the housings 210a and 210b. For example, a first multi bar 232a may be formed with a predetermined curvature from an end of the first housing 210a to the center bar 231. As another example, a second multi bar 232b may be formed with a predetermined curvature from an end of the second housing 210b to the center bar 231. The multi bars 232a and 232b may be transformed to have curvatures corresponding to the curvature of the display assembly 220. The center bar 231 and the multi bars 232 are described below in greater detail.

According to an embodiment of the present disclosure, the display assembly 220 may be disposed on at least part of the outer surface of the center bar 231 and multi bars 232. For example, the display assembly 220 may be folded to correspond to the transformation of the center bar 231 and multi bars 232 as the hinge structure 230 is folded. The display assembly 220 may be disposed on a majority of the front and/or rear surface of the electronic device 200 to be exposed to the outside but is not on the bezel which corresponds to an upper and/or lower portion of the front and/or rear surface of the electronic device 200 to prevent and/or reduce the effects of external impacts.

Referring to FIG. 4B, a side surface of the electronic device 200 which is positioned opposite the other surface where the display assembly 220 is positioned, e.g., a first surface of the first housing 210a and a side surface of the second housing 210b may be arranged side-by-side. An edge of the side surface of the first housing 210a and an edge of the side surface of the second housing 210b may meet each other, forming one surface inside which a recess 205 may be formed to the inside of the electronic device 200. For example, the recess 205 may be implemented as a groove allowing the user to easily fold or unfold the electronic device 200.

According to an embodiment of the present disclosure, a power key 16a and/or a volume key 16b may be disposed inside the recess 205. For example, the power key 16a and/or volume key 16b may selectively be disposed on the side surface of the first housing 210a or the side surface of the second housing 210b.

Figure 5:
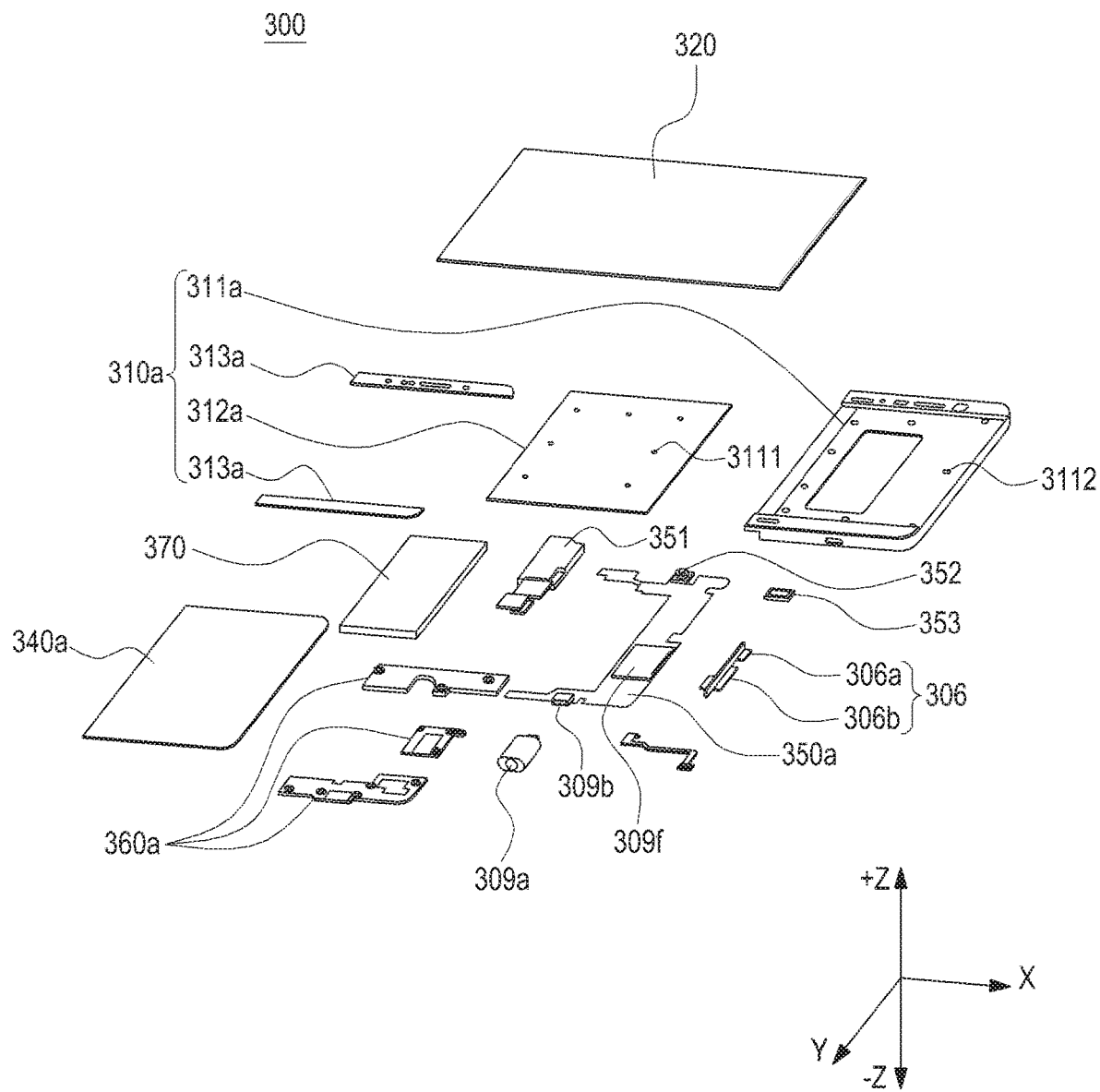
FIG. 5 is an exploded perspective view illustrating the configuration of a right-hand area of an electronic device according to an embodiment of the present disclosure.
Figure 6:
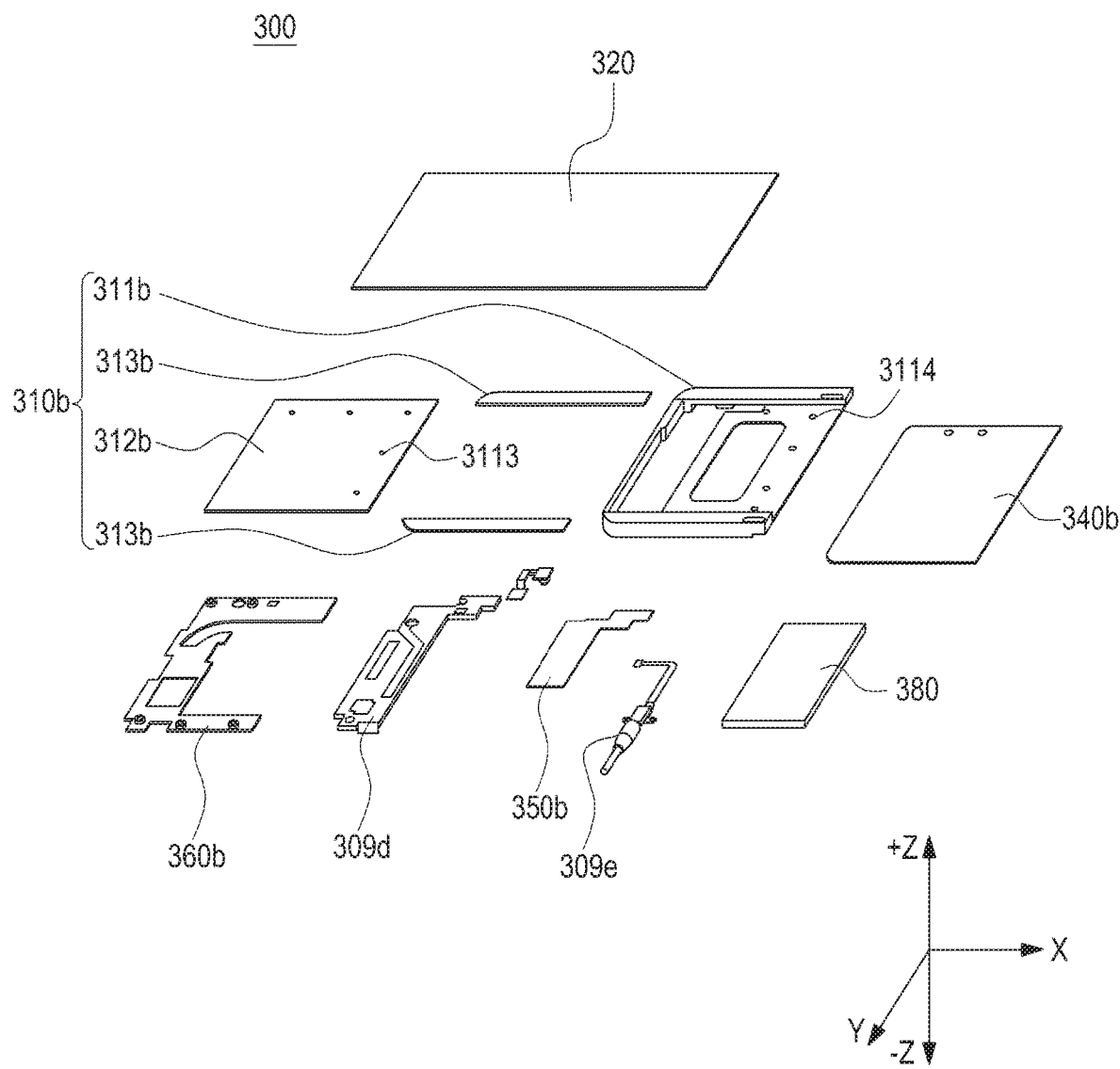
FIG. 6 is an exploded perspective view illustrating the configuration of a left-hand area of an electronic device according to an embodiment of the present disclosure.

FIGS. 5 and 6 are exploded perspective views illustrating the configuration of an electronic device 300 according to an embodiment of the present disclosure. FIG. 5 is an exploded perspective view illustrating the configuration of a right-hand part of the electronic device 300, and FIG. 6 is an exploded perspective view illustrating the configuration of a left-hand part of the electronic device 300.

Figure 7:
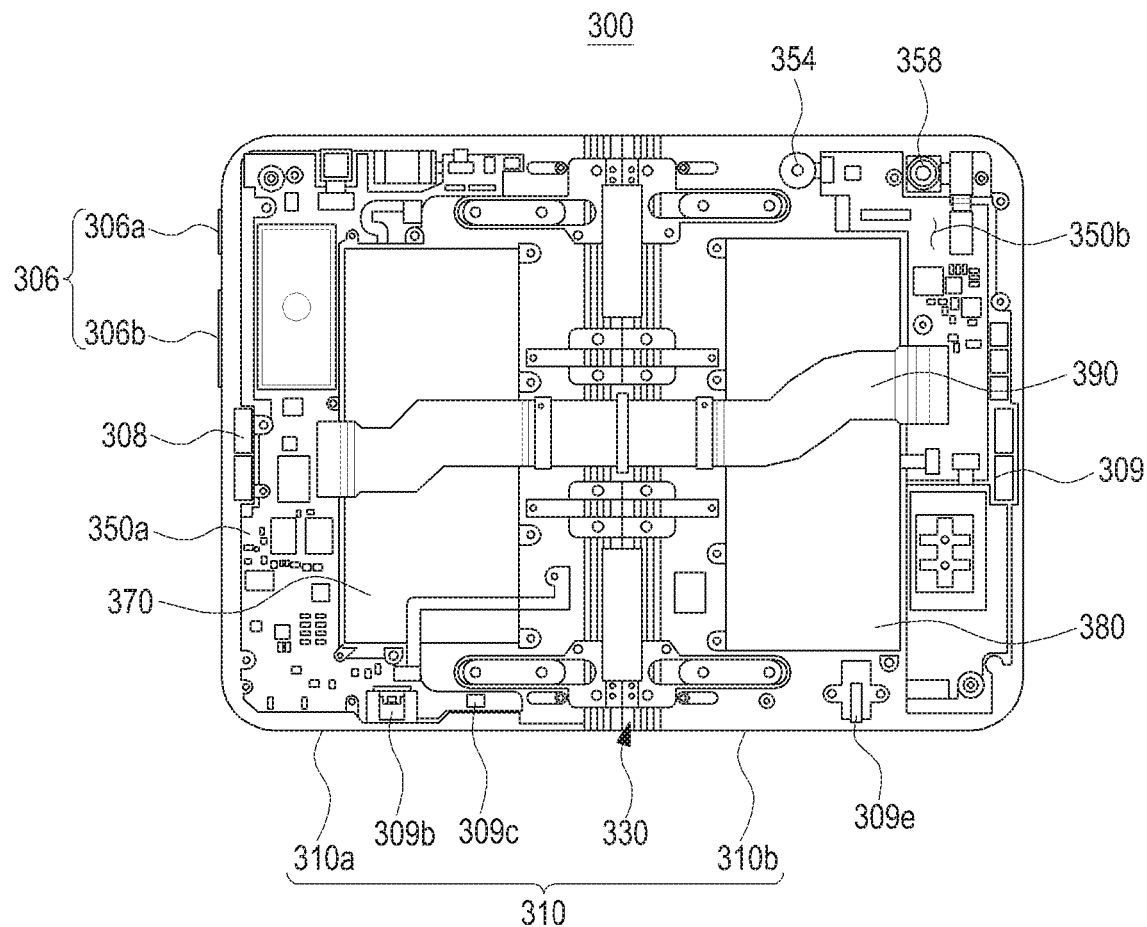
FIG. 7 is a projection view illustrating an arrangement of inner parts of an electronic device in a flat position according to an embodiment of the present disclosure.

FIG. 7 is a projection view illustrating an arrangement of inner parts of an electronic device 300 in a flat position according to an embodiment of the present disclosure.

The structure of the electronic device 300 shown in FIGS. 5, 6, and 7 may be the same in whole or part as the structure of the electronic device 200 of FIGS. 2 to 4.

Referring to FIGS. 5 to 7, according to an embodiment of the present disclosure, the electronic device 300 may include a first housing 310a, a second housing 310b, a display assembly 320, and a hinge structure 330. The hinge structure 330 may couple the first housing 310a and the second housing 310b so that the first housing 310a and the second housing 310b may rotate about each other. For example, the first housing 310a may be folded or unfolded about the second housing 310b.

Referring to FIGS. 5 and 7, the right-hand part of the electronic device 300 may include the first housing 310a, part of the display assembly 320, a main printed circuit board 350a, and a first battery 370.

According to an embodiment of the present disclosure, the first housing 310a may be an element for receiving various electronic parts. At least part of the first housing 310a may be formed of a conductive material. For example, the first housing 310a may have side walls that form outer side surfaces of the electronic device 300. Portions of the first housing 310a, which are exposed to the outside of the electronic device 300, may be formed of a metal. As another example, the first housing 310a may be formed of a metal (e.g., aluminum, STS, or magnesium), or at least partially, of a synthetic resin. The main printed circuit board 350a and/or the first battery 370 may be received inside the first housing 310a. For example, a processor, a communication module, various interfaces (e.g., the interfaces 150 and 170 of FIG. 1), and a power management module may be mounted on the main printed circuit board 350a in the form of an integrated circuit (IC) chip. The control circuit may also be configured in an IC chip that may be mounted on the printed circuit board 350a. For example, the control circuit may be part of the processor or the communication module. As another example, a shield can 351 may be disposed to shield the IC chips of the main printed circuit board 350a from external magnetic fields.

According to an embodiment of the present disclosure, a front camera 352 and a receiver 353 may be arranged in an upper area inside the first housing 310a, and a key module 306, which is a combination of the power key 306a and/or the volume key 306b, may be disposed on a side surface. On the side surface may be disposed at least one magnet 308 that induces a magnetic coupling with the second housing 310b. On a lower area inside the first housing 310a may be disposed a sim socket 309f for receiving a sim card, a charging unit 309a, a charging terminal (e.g., USB type-C) 309b, and/or a microphone (mic) module 309c. However, the arrangement of the parts is not limited thereto, but rather, the parts may be arranged in various areas inside the first housing 310a to configure an arrangement for efficient mounting inside the electronic device 300.

According to an embodiment of the present disclosure, a portion (e.g., the right-hand part of the display assembly 320) of the display assembly 320 may be exposed through the front surface of the first housing 310a. The display device 320 may be, at least partly, formed of a material that transmits radio waves or magnetic fields. The display device 320 may be mounted on the front surface of the first housing 310a (to face in the first direction +Z). The display assembly 320 may include a flexible window member (e.g., a polyimide film (PI)) and a display panel (e.g., OLED) mounted on an inner surface of the window member. A touch panel may be provided between the window member and the display panel. For example, the display assembly 320 may be utilized as an input device equipped with touchscreen functionality, not alone as an output device for outputting screen. According to an embodiment of the present disclosure, the display assembly 320 may include a separate digitizer panel (not shown), as an input panel, on the rear surface of the display panel. For example, the digitizer panel may detect a handwriting that is made by an input module (e.g., a pen) while communicating with the electronic device 300 in a wired or wireless manner, and the digitizer panel may deliver the detected handwriting to the electronic device 300. The digitizer panel may be formed of a flexible panel that is foldable or rollable to carry. For example, the digitizer panel, as an input panel, may generate an electromagnetic field when an alternating current (AC) is applied thereto.

According to an embodiment of the present disclosure, the first housing 310a may include a first middle plate 311a that may move to the left or right with respect to the hinge structure 330 which is disposed at the center of the electronic device 300, a first bracket 312a disposed on the front surface of the first middle plate 311a and supporting a portion of the display assembly 320, and upper and lower plates 313a disposed at both ends of the first middle plate 311a and exposed to form a bezel area which is an outer surface of the electronic device 300.

According to an embodiment of the present disclosure, various holes may be formed in the outer surfaces of the first middle plate 311a and/or the upper and lower plates 313a to expose portions of various electronic parts to the outside of the electronic device 300. Although not shown in the drawings, according to an embodiment of the present disclosure, various structures may be formed on the surface of the first middle plate 311a depending on the arrangement of electronic parts inside the electronic device 300 or connections within the first housing 310a. For example, each of spaces for receiving the IC chips mounted on the main printed circuit board 350a may be formed in the first middle plate 311a. The spaces for the IC chips may be formed in recessed shapes or ribs surrounding the IC chips.

According to an embodiment of the present disclosure, a hinge structure may be disposed at an edge of the first middle plate 311a. For example, part of the hinge structure may be connected with the first middle plate 311a, and the rest may be seated between the first middle plate 311a and the second middle plate 311b.

According to an embodiment of the present disclosure, the first bracket 312a may be prepared in a plate shape and may be coupled with the first middle plate 311a while having the right part of the display assembly 320 seated thereon. For example, the first bracket 312a may include first coupling holes 3111, and the first middle plate 311a may have second coupling holes 3112 corresponding to the first coupling holes 3111. Coupling members (not shown), e.g., screws, may fit into the first coupling holes 3111 and the second coupling holes 3112 to join the first bracket 312a with the first middle plate 311a.

According to an embodiment of the present disclosure, the electronic device 300 may include a first rear cover 340a to protect the rear surface of the first housing 310a. The first rear cover 340a is mounted opposite the display assembly 320 and may be formed of a material capable of transmitting radio waves or magnetic fields, e.g., reinforced glass or synthetic resin. As another example, the first rear cover 340a of the first housing 310a may be formed of a metal (e.g., aluminum, STS, or magnesium), or at least partially, of a synthetic resin. The first rear cover 340a, along with the display assembly 320, may form the outer appearance of the electronic device 300. For example, the second surface (e.g., the second surface 202a of FIG. 2b) facing in the second direction −Z of the first rear cover 340a may form the outer surface of the electronic device.

According to an embodiment of the present disclosure, the electronic device 300 may include a first antenna unit 360a having a conductive pattern and a radiating conductor unit (not shown). The first antenna unit 360a may be disposed between the main printed circuit board 350a and the first rear cover 340a. Magnetic fields generated by the conductive pattern of the first antenna unit 360a or radio waves transmitted or received through the conductive pattern of the first antenna unit 360a may be transmitted through the first rear cover 340a.

According to an embodiment of the present disclosure, one surface of the first antenna unit 360a may include a film formed of an insulator or dielectric material and may provide an area for forming the conductive pattern(s). For example, the first antenna unit 360a including the conductive pattern may be shaped as a flexible printed circuit board as viewed from the outside. Alternatively, the first antenna unit 360a may be a flexible printed circuit board in a multi-layer circuit board structure. For example, the conductive pattern(s) may be disposed on one surface, or its opposite surface, of the first antenna unit 360a. When the first antenna unit 360a has a multi-layer circuit board structure, a plurality of conductive patterns may be formed on appropriate ones of the layers comprising the first antenna unit 360a. For example, the conductive patterns may be formed by, e.g., printing, deposition, coating, and/or plating, and part of the conductive layer formed in the antenna layer 360 may be formed by etching (e.g., wet etching or dry etching). Or, the first antenna unit 360a may be part of an inner structure formed by laser direct structuring (LDS).

Referring to FIGS. 6 and 7, the left-hand part of the electronic device 300 may include the second housing 310b, part of the display assembly 320, a sub printed circuit board 350a, and a second battery 380.

According to an embodiment of the present disclosure, the second housing 310b may be an element for receiving various electronic parts. At least part of the second housing 310b may be formed of a conductive material. For example, the second housing 310b may have side walls that form outer side surfaces of the electronic device 300. Portions of the second housing 310b, which are exposed to the outside of the electronic device 300, may be formed of a metal. As another example, the second housing 310b may be formed of a metal (e.g., aluminum, STS, or magnesium), or at least partially, of a synthetic resin. The sub printed circuit board 350b and/or a second battery 380 may be received inside the second housing 310b. For example, a processor, a communication module, various interfaces (e.g., the interfaces 150 and 170 of FIG. 1), and a power management module (not shown) may be mounted on the sub printed circuit board 350b in the form of an integrated circuit (IC) chip. The control circuit may also be configured in an IC chip that may be mounted on the sub printed circuit board 350b. For example, the control circuit may be part of the processor or the communication module.

According to an embodiment of the present disclosure, a main camera 358, a hall sensor (not shown), and/or a vibration module 354 may be arranged on an upper area inside the second housing 310b, and at least one magnet 309 and/or a speaker enclosure 309d may be disposed on the side area to induce a magnetic coupling with the magnet 308 disposed inside the first housing 310a. An ear jack 309e may be disposed on a lower area inside the second housing 310b. However, the arrangement of the parts is not limited thereto, but rather, the parts may be arranged in various areas inside the second housing 310b to configure an efficient arrangement inside the electronic device 300.

According to an embodiment of the present disclosure, a portion (e.g., the left-hand part of the display 320) of the display assembly 320 may be exposed through the front surface of the second housing 310b. The display assembly 320 may be, at least partly, formed of a material that transmits radio waves or magnetic fields. The display assembly 320 may be mounted on the front surface of the second housing 310b (to face in the first direction +Z). The display assembly 320 may include a flexible window member (e.g., a polyimide film (PI)) and a display panel (e.g., OLED) mounted on an inner surface of the window member. A touch panel may be provided between the window member and the display panel. For example, the display assembly 320 may be utilized as an input device equipped with touchscreen functionality, not alone as an output device for outputting screen. According to an embodiment of the present disclosure, the display assembly 320 may include a separate digitizer panel (not shown), as an input panel, on the rear surface of the display panel.

According to an embodiment of the present disclosure, the second housing 310b may include a second middle plate 311b that may move to the left or right with respect to the hinge structure 330 which is disposed at the center of the electronic device 300, a second bracket 312b disposed on the front surface of the second middle plate 311b and supporting a portion of the display assembly 320, and upper and lower plates 313b disposed at both ends of the second middle plate 311b and exposed to form a bezel area which is an outer surface of the electronic device 300.

According to an embodiment of the present disclosure, various holes may be formed in the outer surfaces of the second middle plate 311b and/or the upper and lower plates 313b to expose portions of various electronic parts to the outside of the electronic device 300. Although not shown in the drawings, according to an embodiment of the present disclosure, various structures may be formed on the surface of the second middle plate 311b depending on the arrangement of electronic parts inside the electronic device 300 or connections within the second housing 310b. For example, each of spaces for receiving the IC chips mounted on the sub printed circuit board 350b may be formed in the second middle plate 311b. The spaces for the IC chips may be formed in recessed shapes or ribs surrounding the IC chips.

According to an embodiment of the present disclosure, a hinge structure may be disposed at an edge of the second middle plate 311b. For example, part of the hinge structure may be connected with the second middle plate 311b, and the rest may be seated between the second middle plate 311b and the first middle plate 311a.

According to an embodiment of the present disclosure, the second bracket 312b may be prepared in a plate shape and may be coupled with the second middle plate 311b while having the right part of the display assembly 320 seated thereon. For example, the second bracket 312b may include first coupling holes 3113, and the second middle plate 311b may have second coupling holes 3114 corresponding to the first coupling holes 3113. Coupling members (not shown), e.g., screws, may fit into the first coupling holes 3113 and the second coupling holes 3114 to join the second bracket 312b with the second middle plate 311b.

According to an embodiment of the present disclosure, the electronic device 300 may include a second rear cover 340b to protect the rear surface of the second housing 310b. The second rear cover 340b is mounted opposite the display assembly 320 and may be formed of a material capable of transmitting radio waves or magnetic fields, e.g., reinforced glass or synthetic resin. As another example, the first rear cover 340b of the second housing 310b may be formed of a metal (e.g., aluminum, STS, or magnesium), or at least partially, of a synthetic resin. The second rear cover 340b, along with the display assembly 320, may form the outer appearance of the electronic device 300. For example, the fourth surface (e.g., the fourth surface 202*b* of FIG. 2*b*) facing in the second direction −Z of the second rear cover 340*b* may form the outer surface of the electronic device.

According to an embodiment of the present disclosure, the electronic device 300 may include a second antenna unit 360*b* having a conductive pattern and a radiating conductor unit (not shown). The second antenna unit 360*b* may be disposed between the sub printed circuit board 350*b* and the second rear cover 340*b*. Magnetic fields generated by the conductive pattern of the second antenna unit 360*b* or radio waves transmitted or received through the conductive pattern of the second antenna unit 360*b* may be transmitted through the second rear cover 340*b*. Or, the second antenna unit 360*b* may be part of an inner structure formed by laser direct structuring (LDS).

Referring to FIG. 7, in the unfolded position of the electronic device 300, the first housing 310*a* and the second housing 310*b* may be arranged so that their respective side surfaces face each other. For example, the side surface of the first housing 310*a* and the side surface of the second housing 310*b* may be spaced apart from each other in a gap.

According to an embodiment of the present disclosure, a hinge structure 330 may be disposed between the first housing 310*a* and the second housing 310*b*. A portion forming the outer surface of the hinge structure 330 may be fitted into the gap, and the rest thereof may be seated on the inner surface of the first housing 310*a* and/or second housing 310*b*. The first middle plate 311*a* and the second middle plate 311*b* may have their respective recesses in the inner surfaces to have at least part of the hinge structure 330 seated thereon.

According to an embodiment of the present disclosure, the flexible printed circuit board 390 may be disposed across the first housing 310*a* and the second housing 310*b*. For example, the flexible printed circuit board 390 may extend from the first housing 310*a* through the hinge structure 330 to the second housing 310*b*. Connectors may be prepared at both sides of the flexible printed circuit board 390 to make electrical connections with the main printed circuit board 350*a* disposed in the first housing 310*a* and the sub printed circuit board 350*b* disposed in the second housing 310*b*.

Hereinafter, the configuration of the hinge structure of the electronic device, the configuration of the flexible printed circuit board, and the stacked structure of the display assembly are described in detail.

Figure 8:
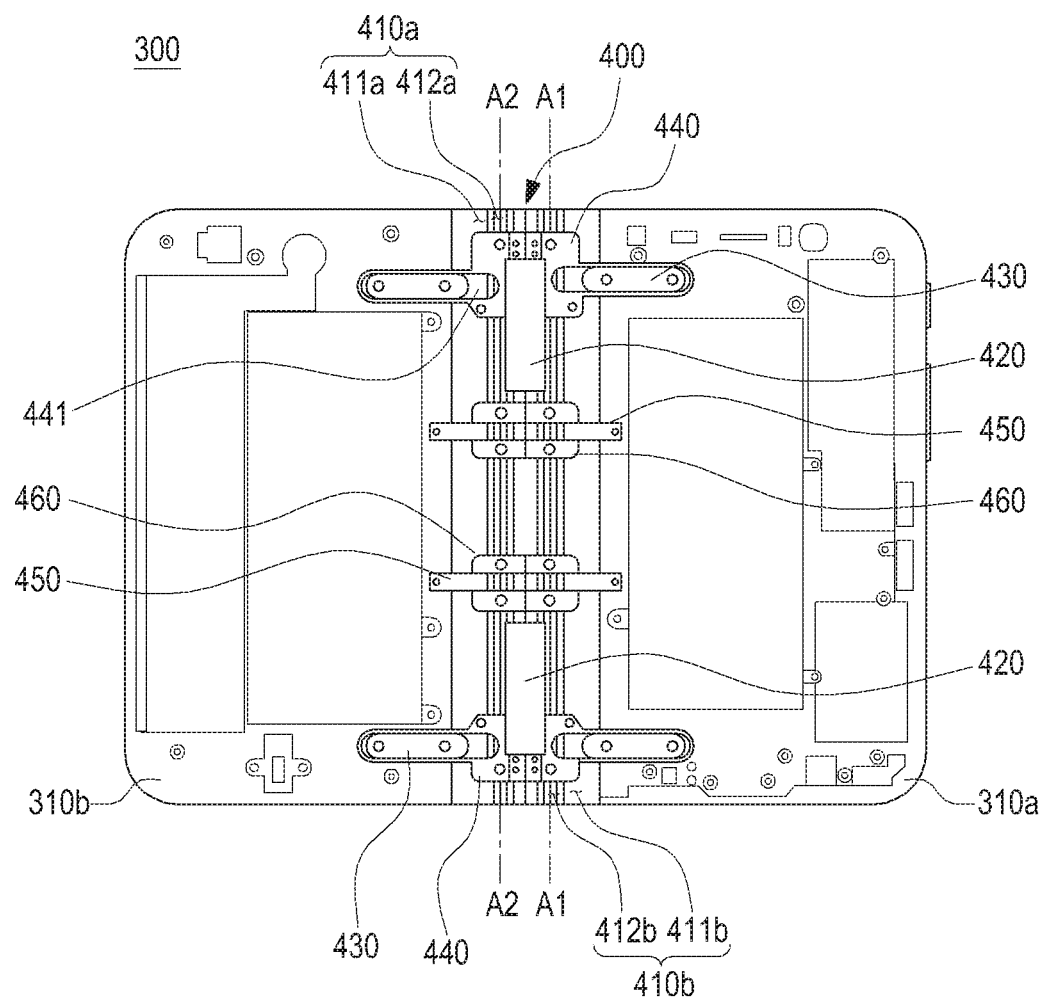
FIG. 8 is a projection view illustrating a hinge structure disposed in an electronic device unfolded, according to an embodiment of the present disclosure.
Figure 9:
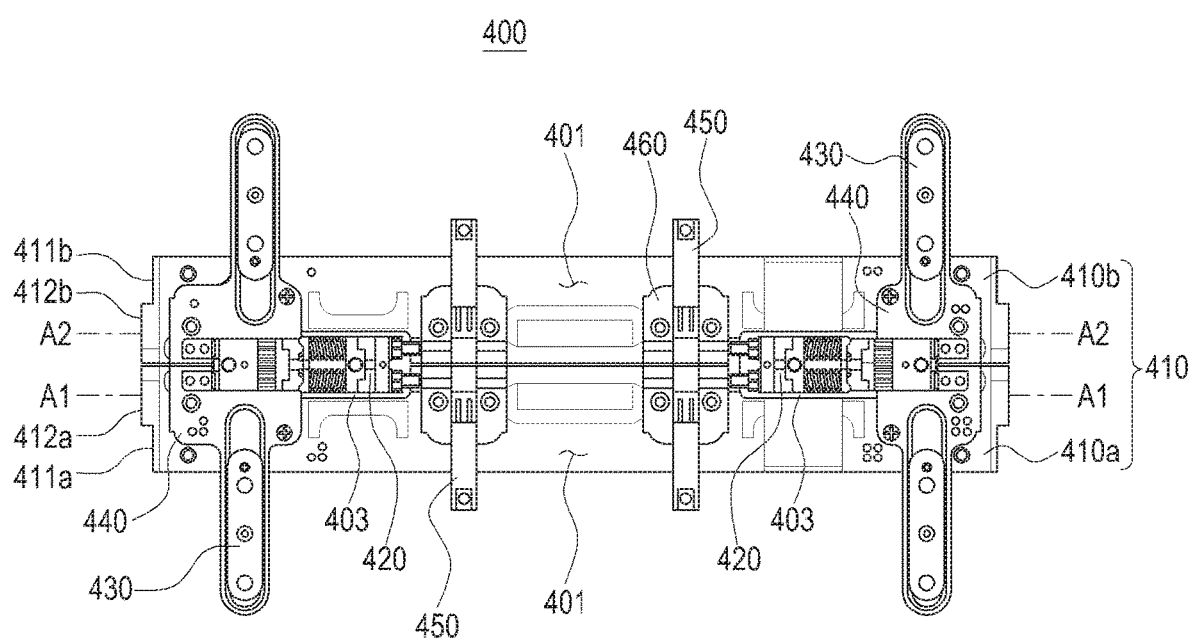
FIG. 9 is a front view illustrating the hinge structure according to an embodiment of the present disclosure.

FIG. 8 is a projection view illustrating a hinge structure 400 disposed in an electronic device 300 unfolded, according to an embodiment of the present disclosure. FIG. 9 is a front view illustrating the hinge structure 400 according to an embodiment of the present disclosure. The hinge structure 400 of the electronic device 300 shown in FIGS. 8 and 9 may be the same in whole or part as the hinge structure 330 of the electronic device 300 of FIGS. 5 to 7.

Referring to FIGS. 8 and 9, according to an embodiment of the present disclosure, the electronic device 300 may include a first housing 310*a*, a second housing 310*b*, and a hinge structure 400. The hinge structure 400 may couple the first housing 310*a* and the second housing 310*b* so that the first housing 310*a* and the second housing 310*b* may rotate about each other. For example, the first housing 310*a* may be folded or unfolded about the second housing 310*b*.

FIG. 8 illustrates the electronic device 300 unfolded and front-facing, wherein a first housing 310*a* and a second housing 310*b*, respectively, may be disposed in the right-hand and left-hand parts of the electronic device. A hinge structure 400 may be disposed between the first housing 310*a* and the second housing 310*b* in the area where they partially overlap. According to an embodiment of the present disclosure, the hinge structure 400 may include slide covers 410, dual-axis hinge modules 420, slide modules 430, rail brackets 440, slide stoppers 450, and rail stoppers 460.

According to an embodiment of the present disclosure, the slide covers 410, along with the above-described rear cover (e.g., the rear covers 340*a* and 340*b* of FIGS. 6 and 7), may cover the rear surface of the electronic device 300, and have an inner surface that forms a front-facing seating surface on which the dual-axis hinge modules 420, rail brackets 440, slide stoppers 450, and rail stoppers 460 may be seated. There may be provided a plurality of slide covers 410. For example, the slide covers 410 may include a first slide cover 410*a* and a second slide cover 410*b*. The first slide cover 410*a* may include a first portion 411*a* at least part of which is seated on the side surface of the first housing 310*a* and a second portion 412*a* that extends from the first portion 411*a* and is disposed between the first housing 310*a* and the second housing 310*b*. The first portion 411*a* may be shaped as a plate with multiple coupling holes to join the first housing 310*a*. The second portion 412*a* may have an end curved along the lengthwise direction to enable smooth rotation about at least one virtual rotational axis A1 which is formed by the dual-axis hinge module 420.

The second slide cover 410*b* may include a first portion 411*b* at least part of which is seated on the side surface of the second housing 310*b* and a second portion 412*b* that extends from the first portion 411*b* and is disposed between the first housing 310*a* and the second housing 310*b*. The first portion 411*b* may be shaped as a plate with multiple coupling holes to join the second housing 310*b*. The second portion 412*b* may have an end curved along the lengthwise direction to enable smooth rotation about at least one virtual rotational axis A2 which is formed by the dual-axis hinge module 420.

In the unfolded position, the second portion 412*a* of the first slide cover 410*a* and the second portion 412*b* of the second slide cover 410*b* may be arranged to partially contact each other. As the second slide cover 410*b* rotates about the first slide cover 410*a* (or the first slide cover 410*a* rotates about the second slide cover 410*b*), the area in which the first portion 411*a* and second portion 412*a* of the first slide cover 410*a* face the first portion 411*b* and second portion 412*b* of the second slide cover 410*b* may increase.

According to an embodiment of the present disclosure, the rail brackets 440 having the slide modules 430 seated thereon may be disposed on the inner surface 401 of the slide covers 410. The rail brackets 440 may be disposed over both ends of the slide covers 410 and may be fastened to the slide covers 410. For example, rail brackets 440 having slide modules 430 seated thereon may be disposed on both lengthwise ends of the first slide cover 410*a*, and rail brackets 440 having slide modules 430 seated thereon may be disposed on both lengthwise ends of the second slide cover 410*b*.

According to an embodiment of the present disclosure, the center of the rail bracket 440 disposed on one end of the first slide cover 410 may be aligned with the center of the rail bracket 440 disposed on one end of the second slide cover 410*b*. Accordingly, when the electronic device 300 is in the folded position, the rail brackets disposed on the first slide cover 410*a* may face the rail brackets 440 disposed on the second slide cover 410*b*. However, the rail brackets 440 are not limited by the arrangement described above, but may rather be arranged in other various ways corresponding to the position in which the battery (not shown) in the first housing 310a and/or the second housing 310b is efficiently seated.

As another example, the slide modules 430 may be disposed in holes formed in the rail brackets 440 to move back and forth along the lengthwise direction of the holes 441.

According to an embodiment of the present disclosure, dual-axis hinge modules 420 may be disposed on the inner surface 401 of the slide covers 410. For example, the dual-axis hinge modules 420 may be inserted into recesses 403 formed in the inner surface of the slide covers 410 and may, at least partially, be surrounded by the rail brackets 440. The dual-hinge modules 420 may be formed to have two virtual rotational axes A1 and A2, one of which may be aligned with the virtual rotational axis formed by the second portion 412a of the first housing 310a, and the other A2 may be aligned with the virtual rotational axis formed by the second portion 412b of the second housing 310b.

According to an embodiment of the present disclosure, there may be a plurality of dual-axis hinge modules 420. For example, separate dual-axis hinge modules may be formed so that each of the dual-axis hinge modules is positioned adjacent a corresponding one of the rail brackets disposed at both ends of the slide covers 410. As another example, the dual-axis hinge modules 420 may be disposed in expanded recesses 403 which are combinations of the recesses formed by the first slide cover 410a and the second slide cover 410b. One virtual rotational axis A1 may be disposed inside the first slide cover 410a, and the other virtual rotational axis A2 may be disposed inside the second slide cover 410b.

According to an embodiment of the present disclosure, the rail stoppers 460 and the slide stoppers 450 may be deployed on the inner surface 401 of the slide covers 410. At least one or more rail stoppers 460 and slide stoppers 450 may be arranged in a middle area of the slide covers 410 or separately on the slide covers 410a and 410b, respectively.

According to an embodiment of the present disclosure, each slide stopper 450 may be disposed to be movable between the pair of rail stoppers 460. For example, the slide stoppers 450 may move back and forth along slide lines (not shown) formed in the slide covers 410a and 410b to restrict movement of the slide modules 430. As another example, the slide stoppers 450 may slide while aiding the slide modules 430, and they, alongside the hinge structure 400, allow the electronic device to remain in balance. The slide stoppers 450 are disposed between the slide modules 430 to reinforce the electronic device.

According to an embodiment of the present disclosure, at least one pair of rail stoppers 460 may be provided adjacent the dual-axis hinge modules 420. The rail stoppers 460 are arranged close to each other in the respective portions of the first slide cover 410a and the second slide cover 420a that abut each other, restricting the hinge structure 400 from spanning and rotating at a predetermined angle or more. A detailed description is given below.

Specific configurations of the dual-axis hinge modules 420, stoppers 450 and 460, slide modules 430, and rail brackets 440 are sequentially described below.

Figure 10:
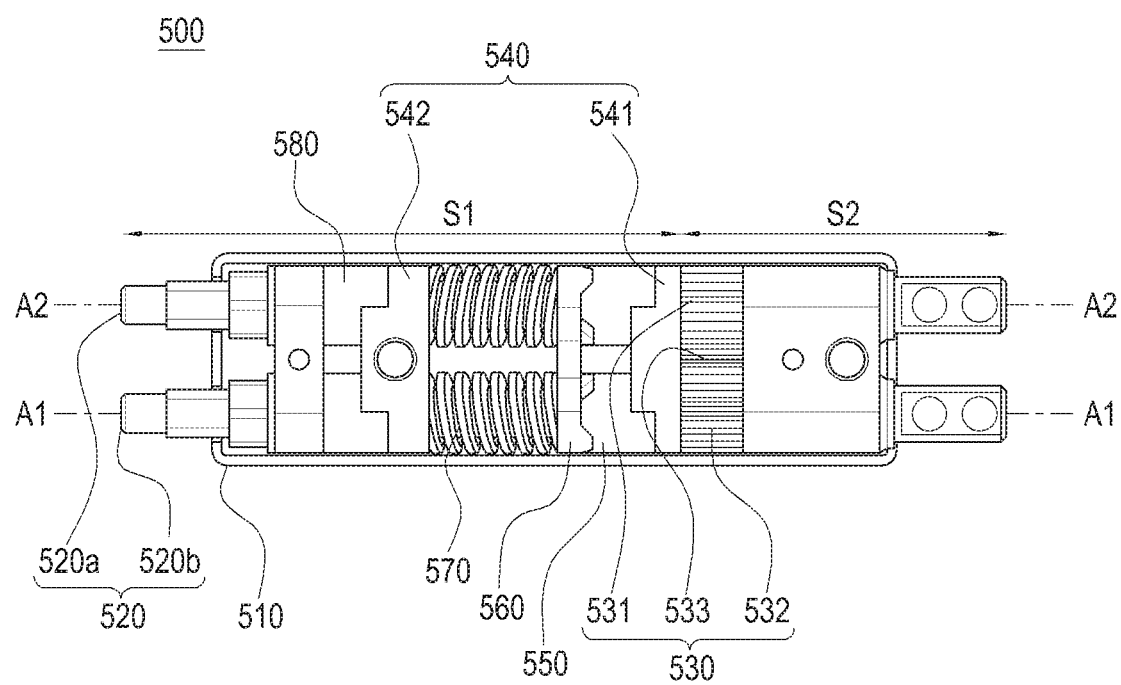
FIG. 10 is a front view illustrating parts of the dual-axis hinge module according to an embodiment of the present disclosure.
Figure 11A:
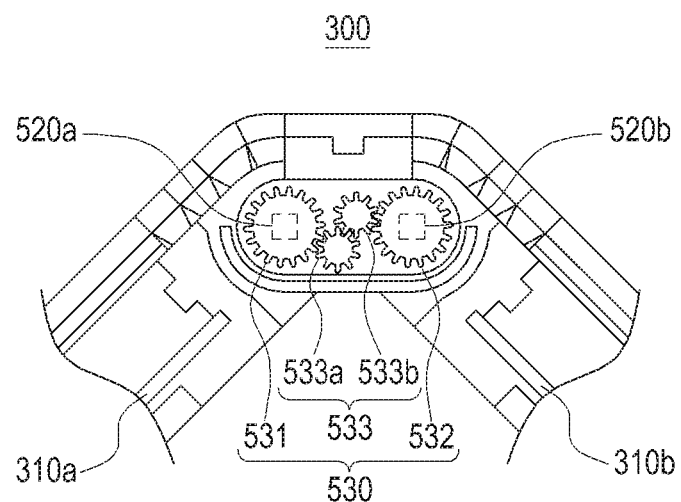
Figure 11B:
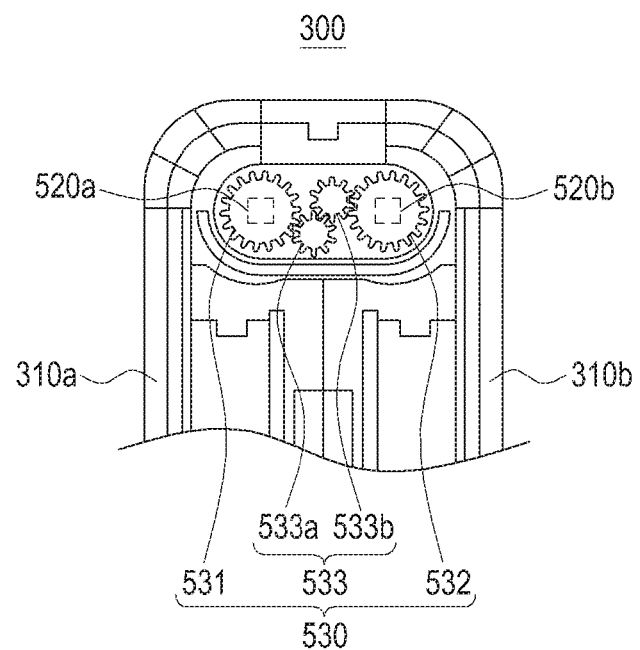

FIG. 10 is a front view illustrating parts of the dual-axis hinge module 500 according to an embodiment of the present disclosure. FIGS. 11A and 11B are diagrams illustrating a cross section of a gear unit 530 of the dual-axis hinge module 500 disposed in the electronic device 300 according to an embodiment of the present disclosure. FIG. 11A is a cross-sectional view illustrating the electronic device 300 partially folded, and FIG. 11B is a cross-sectional view illustrating the electronic device 300 fully folded. The structure of the dual-axis hinge module 500 shown in FIGS. 10 and 11A and 11B may be the same in whole or part as the structure of the dual-axis hinge module 420 of FIGS. 8 and 9.

Referring to FIGS. 10 and 11A and 11B, according to an embodiment of the present disclosure, the electronic device 300 may include a first housing 310a, a second housing 310b, and a hinge structure with the dual-axis hinge module 500. The hinge structure with the dual-axis hinge module 500 may couple the first housing 310a and the second housing 310b so that the first housing 310a and the second housing 310b may rotate about each other. For example, the first housing 310a may be folded or unfolded about the second housing 310b.

Referring to FIG. 10, the dual-axis hinge module 500 may include a hinge housing 510, hinge shafts 520, a gear unit 530 including at least two gears, hinge stoppers 540, stopper cams 550, moving cams 560, elastic bodies 570, and shaft stoppers 580.

According to an embodiment of the present disclosure, inside the hinge housing 510 may be received at least part of the hinge shafts 520, part of the cam unit (e.g., the moving cams 560 and stopper cams 550), a plurality of gears 531, 532, and 533, and the elastic bodies 570 along virtual hinge axes A1 and A2. For example, the dual-axis hinge module 500 may include two hinge shafts 520 corresponding to two virtual rotational axes A1 and A2, and the shaft stoppers 580, elastic bodies 570, stopper cams 550, and gears 531 and 532 may individually be arranged on the hinge shafts 520. As another example, the hinge stoppers 540 and the moving cams 560 may have two holes through which the hinge shafts 520 pass. Hereinafter, the components arranged on one hinge shaft 520 are described. The description applies to the components arranged on the other hinge shaft.

According to an embodiment of the present disclosure, the hinge housing 510 may be divided into a first area S1 and a second area S2; the first area S1 may be an area where the cam unit operates, and the second area S2 may be an area where the gear unit 530 operates.

According to an embodiment of the present disclosure, the first area S1 is described. Inside the hinge housing 510 may be received the above-described components (e.g., part of the hinge shaft 520, hinge stopper 540, elastic body 570, moving cam 560, and stopper cam 550). The elastic body 570 may expand or contract within the hinge housing 510, and the stopper cam 550 may be provided to have the hinge shaft 520 pass therethrough and to be rotatable. The moving cam 560 may move back and forth along the hinge shaft 520 as the stopper cam 550 rotates.

According to an embodiment of the present disclosure, the hinge shaft 520 may sequentially pass through the moving cam 560, the stopper cam 550, and the elastic body 570. The hinge stoppers 540 may be provided at the outsides of the moving cam 560 and the elastic body 570 to restrict rotation of the dual-axis hinge module 500. Couplers for fastening to the hinge housing 510 may be provided in ends of the hinge stoppers 540 and fastening pins may be inserted thereinto. The shaft stopper 580 may be disposed at an end of the hinge stoppers 540 to restrict movement of the hinge shaft 520. As another example, the hinge stoppers 540 and the shaft stopper 580 may have holes through which the two hinge shafts 520 pass to connect them together.

According to an embodiment of the present disclosure, the elastic body 570 is provided to have the hinge shaft 520 pass therethrough and applies a force to bring the moving cam 560 and the stopper cam 550 into tight contact, thereby enabling cam motion. An end of the elastic body 570 is tightly fastened to the hinge stopper 540, and the other end thereof may remain in tight contact with the moving cam 560. The elastic body 570 may expand or contract depending on the moving back and forth of the moving cam 560 inside the hinge housing 510. For example, the elastic body 570 may be a compression coil spring.

According to an embodiment of the present disclosure, in order for the dual-axis hinge module 500 to remain in horizontal balance, at least one hinge stopper 541 and the stopper cam 550 may come in surface-to-surface contact. As another example, at least one hinge stopper 542 and the shaft stopper 580 may also be brought in surface-to-surface contact to function as a stopper to let it balance horizontally.

According to an embodiment of the present disclosure, the cam motion and configurations of the moving cam 560 and the stopper cam 550 are not limited thereto, but rather, various types of cam motion and shapes are also possible as per configurations commonly known.

The second area S2 is described with reference to FIGS. 11A, 11B and 12. The dual-axis hinge module 500 may include a gear unit 530 disposed adjacent the stopper cam 550 inside the hinge housing 510 and having multiple gears 531, 532, and 533.

According to an embodiment of the present disclosure, the gear unit 530 may include a first gear 531, a second gear 532, and at least one idle gear 533. The first gear 531 and the second gear 532 are arranged to allow the hinge shafts 520 to pass therethrough. The virtual rotational axes A1 and A2 may be formed from the respective centers of the gears 531 and 532 to the hinge shafts 520. The idle gears 533 are disposed between the first gear 531 and the second gear 532 and interwork with the first gear 531 and the second gear 532 to assist in the movement of the first and second gears 531 and 532. Where the idle gears 533 are disposed in the gap between the first gear 531 and the second gear 532 may serve as a benchmark for folding or unfolding the electronic device 300.

According to an embodiment of the present disclosure, the first gear 531 (refer to FIGS. 11A and 11B) disposed on the left-hand side may be coupled to the first hinge shaft 520a to rotate while remaining seated in the recess formed in the first housing 310a. The second gear (refer to FIGS. 11A and 11B) disposed on the right-hand side may be coupled to the second hinge shaft 520b to rotate while remaining seated in the recess formed in the second housing 310b. As another example, the plurality of idle gears 533 may be rotated engaged with the first gear 531 or the second gear 532.

According to an embodiment of the present disclosure, the center of the first gear 531, along with the first hinge shaft 520a, may form part of the first virtual axis A1. The center of the second gear 532, together with the second hinge shaft 520b, may form part of the second virtual axis A2, and the second gear 532 and the first gear 531 may rotate in different directions. While the electronic device 300 turns from flat to folded position, the first virtual axis A1 and the second axis A2 may remain parallel with each other.

According to an embodiment of the present disclosure, the first gear 531 and the second gear 532 may be sized to have the same diameter, and thus, the same number of teeth. The diameter of the first gear 531 and the second gear 532 is sized not to be larger than the thickness of the first housing 310a or second housing 310b, avoiding the first and second gears 531 and 532 from protruding to the outside of the electronic device 300.

According to an embodiment of the present disclosure, the number of idle gears 533 may be an even number. For example, the idle gears 533 may include a first idle gear 533a and a second idle gear 533b that are rotatable engaged with each other. The first idle gear 533a is rotatable engaged with the first gear 531 and may rotate in a different direction from the first gear 531. The second idle gear 533b is rotatable engaged with the second gear 532 and may rotate in a different direction from the second gear 532. The first idle gear 533a and the second idle gear 533b may have the same diameter, and they may be rotated engaged with each other. Accordingly, the first gear 531, the first idle gear 533a, the second idle gear 533b, and the second gear 532 may be arranged in the order thereof so that they may sequentially be rotated in engagement.

The slide stoppers and rail stoppers are described below.

Figure 12:
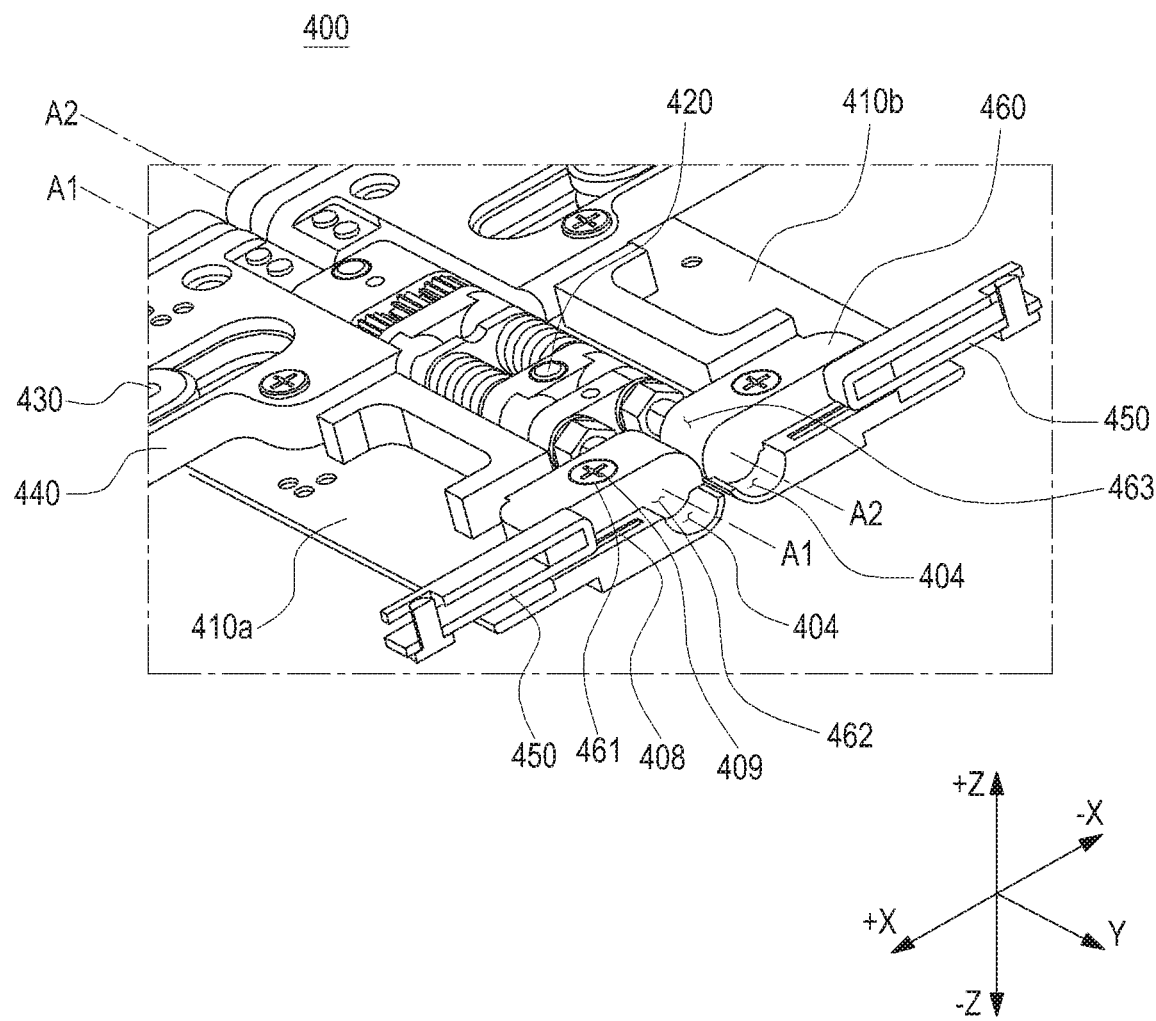
FIG. 12 is an enlarged perspective view illustrating a portion of the hinge structure of FIG. 9.

FIG. 12 is an enlarged perspective view illustrating a portion of the hinge structure 400 of FIG. 9. The rail stoppers 460 and slide stoppers 450 of FIG. 12 may be wholly or partially the same in structure as the rail stoppers 460 and slide stoppers 450 of FIGS. 8 and 9.

Referring to FIGS. 10 and 12, in the hinge structure 400 which is in the flat position where its inside (e.g., the areas arranged to face each other when the electronic device is folded and facing in a different direction from the display assembly) is flatted and faces in the first direction +Z, the rail brackets 440, the dual-axis hinge module 420, the rail stoppers 460, and the slide stoppers 450 are arranged in the order thereof along the virtual hinge axes A1 and A2.

According to an embodiment of the present disclosure, at least one pair of rail stoppers 460 may be provided adjacent the dual-axis hinge module 420. The pair of rail stoppers 460 may be spaced apart from each other to guide the movement of the slide stoppers 450, and each may be disposed on a respective one of the slide covers 410a and 410b. For example, rail brackets 440 may be disposed at both lengthwise ends of the first slide cover 410a, and two pairs of rail stoppers 460 may be disposed between the rail brackets 440. Rail brackets 440 may be disposed at both lengthwise ends of the second slide cover 410a, and two pairs of rail stoppers 460 may be disposed between the rail brackets 440. The rail stoppers 460 disposed on the first slide cover 410a may be disposed opposite the rail stoppers 460 disposed on the second slide cover 410b.

The configuration of one rail stopper 460 disposed on the first slide cover 410 is now described, and this description may apply to the other rail stoppers. According to an embodiment of the present disclosure, a coupling hole 461 may be formed in a portion of the rail stopper 460 to fasten the rail stopper 460 to the first slide cover 410 via a coupling member, e.g., a screw 409, and a protrusion 462 may be formed in an end of the rail stopper 460 to be seated in the recess 404 formed in the slide cover 410a. The surface positioned opposite the protrusion 462 may be formed as a curved surface 463 to derive smooth rotation of the hinge structure 400.

According to an embodiment of the present disclosure, one pair of rail stoppers 460 disposed on the first slide cover 410 and one pair of rail stoppers 460 disposed on the second slide cover 410b are positioned opposite and close to each other so that they are brought in contact when the hinge structure 400 is unfolded at a predetermined angle or more to restrict further rotation.

According to an embodiment of the present disclosure, the slide stoppers 450 may be disposed between the plurality of rail stoppers 460 on the slide covers 410a and 410b. The slide stoppers 450 may be disposed to be movable between the pair of rail stoppers 460. For example, since the pair of rail stoppers 460 spaced apart guide the movement of the slide stoppers 450, the slide stoppers 450 may be restricted from moving along the lengthwise direction of the rail stoppers 460.

According to an embodiment of the present disclosure, the slide stoppers 450 may be disposed between each pair of rail stoppers 460. For example, two pairs of rail stoppers 460 may be disposed in a lengthwise middle portion of the first slide cover 410a, and slide stoppers 450 may be disposed between the rail stoppers 460 of each pair. For example, two pairs of rail stoppers 460 may be disposed in a lengthwise middle portion of the second slide cover 410b, and slide stoppers 450 may be disposed between the rail stoppers 460 of each pair. The slide stoppers 450 disposed on the first slide cover 410a may be disposed opposite the slide stoppers 450 disposed on the second slide cover 410b.

According to an embodiment of the present disclosure, groove-shaped slide lines 408 may be formed in the positions of the slide covers 410a and 410b where the slide stoppers 450 are seated. The slide lines 408 may be formed along the lengthwise direction of the rail stoppers 460 and allow the protrusions (not shown) of the slide stoppers 450 to be placed therein to guide the slide stoppers 450 to move along the slide lines 408. For example, the slide lines 408 may be configured as two lines arranged in parallel with each other. However, the configuration is not limited thereto, and various design changes may be made to guide the movement of the slide stoppers 450.

The rail brackets and slide modules are described below.

Figure 13A:
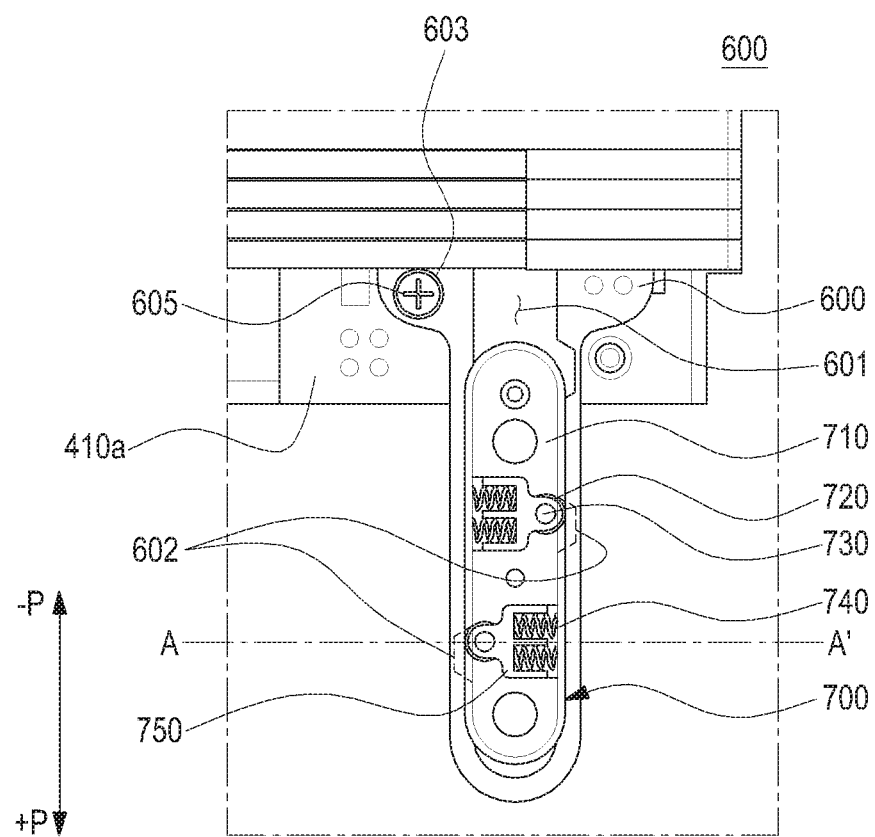
FIGS. 13A and 13B are diagrams illustrating is an enlarged plan view illustrating a rail bracket and a slide module as shown in FIG. 9 according to an embodiment of the present disclosure.
Figure 13B:
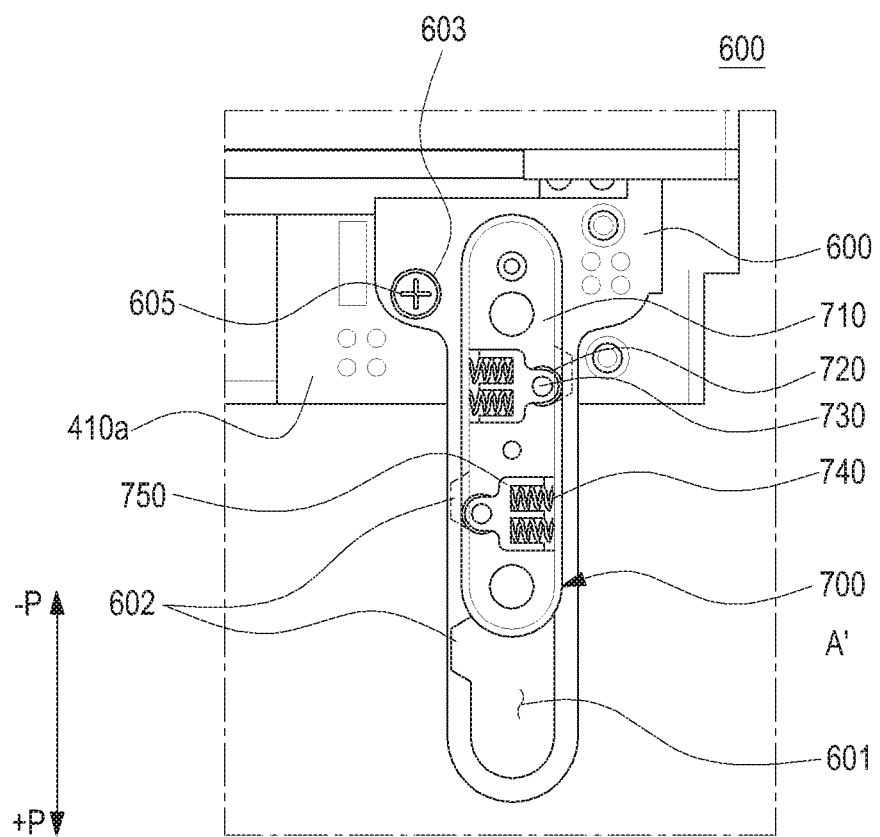
Figure 14:
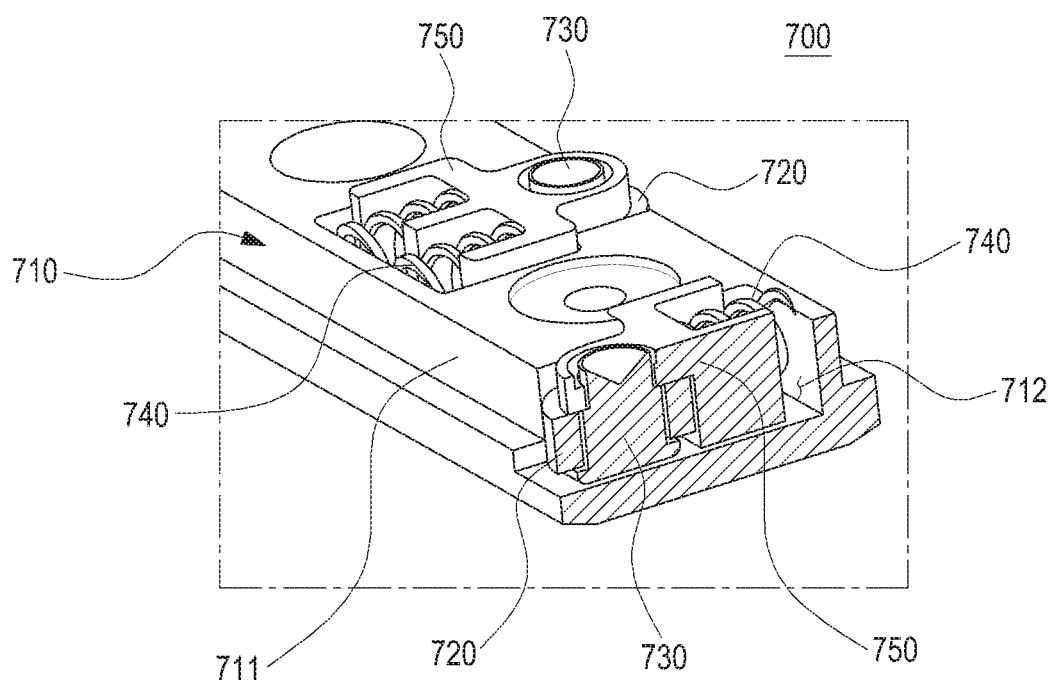
FIG. 14 is a cross-sectional perspective view of the slide module of FIG. 13, taken along line A-A' according to an embodiment of the present disclosure.
Figure 15:
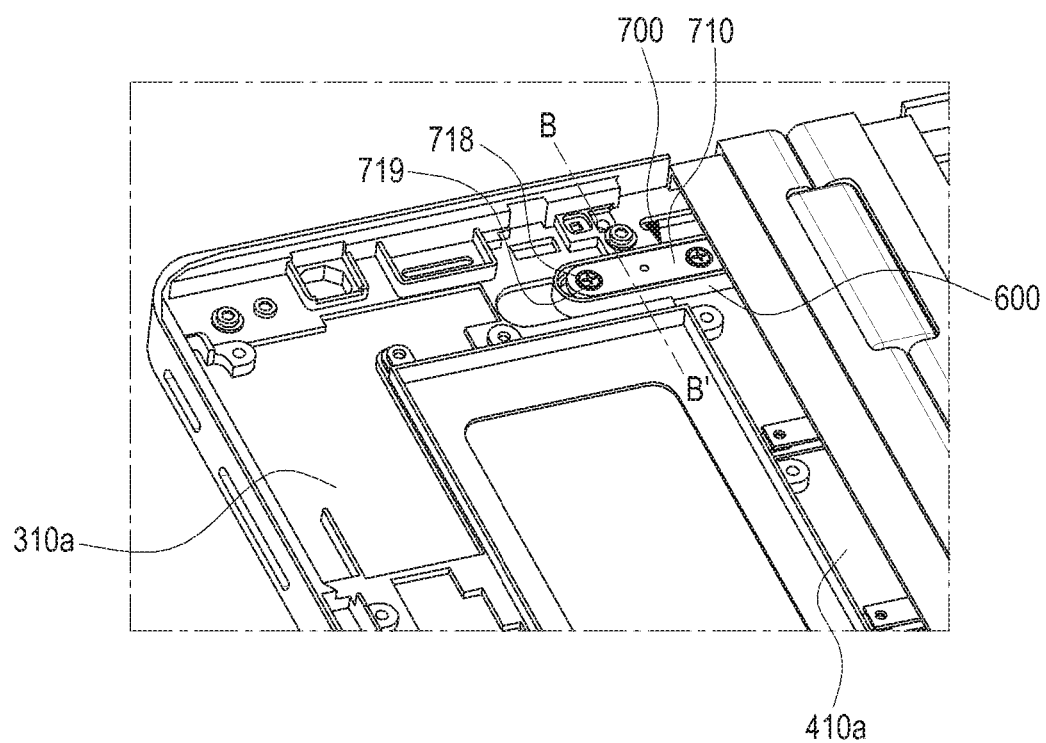
FIG. 15 is a perspective view illustrating a state in which the slide module is coupled with the first housing according to an embodiment of the present disclosure.
Figure 16:
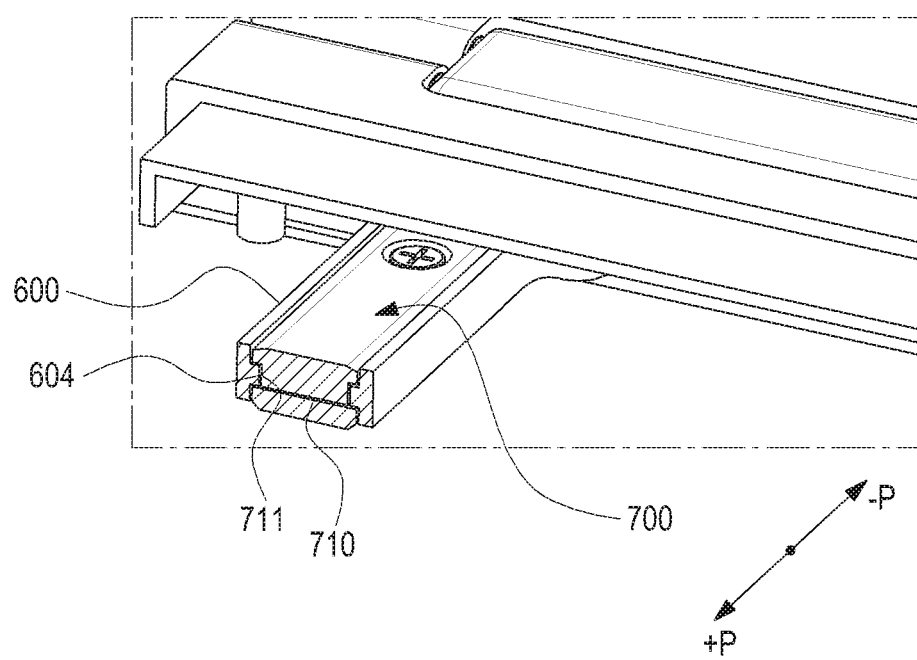
FIG. 16 is a cross-sectional prospective view obtained by cutting the slide module of FIG. 15 along line B-B' according to an embodiment of the present disclosure.

FIGS. 13A and 13B are enlarged plan views illustrating a rail bracket and a slide module as shown in FIG. 9 according to an embodiment of the present disclosure. FIG. 14 is a cross-sectional perspective view of the slide module 700 of FIG. 13A, taken along line A-A' according to an embodiment of the present disclosure. FIG. 15 is a perspective view illustrating an example in which the slide module 700 is coupled to the first housing 310a. FIG. 16 is a cross-sectional perspective view illustrating the slide module 700 of FIG. 15, taken along line B-B', according to an embodiment of the present disclosure.

The rail brackets 600 and slide modules 700 of FIGS. 13A, 13B, 14, 15 and 16 may wholly or partly be the same in structure as the rail brackets 440 and slide modules 430 of FIG. 9.

Referring to FIGS. 9 and 13A and 13B, the hinge structure 400 may include slide covers 410, dual-axis hinge modules 420, slide modules 430 and 700, rail brackets 440 and 600, slide stoppers 450, and rail stoppers 460. In the hinge structure 400 which is in the flat position where its inside is unfolded towards the direction where the front surface faces, the rail brackets 440, the dual-axis hinge module 420, the rail stoppers 460, and the slide stoppers 450 are arranged in the order thereof along the virtual hinge axes A1 and A2.

According to an embodiment of the present disclosure, the rail brackets 600 and the slide modules 700 may be independently disposed at both ends of each of the first slide cover 410a and the second slide cover 410b. The rail brackets 600 may be formed to be perpendicular to the lengthwise direction of the hinge structure 400, and the slide modules 700 may be seated in the rail brackets 600 to move along the lengthwise direction of the plate. Since the plurality of slide modules 700 disposed on the first slide cover 410a and the second slide cover 410b may be alike, the description will focus primarily on the slide module 700 disposed at an end of the first slide cover and this applies to the other slide modules as well.

According to an embodiment of the present disclosure, the rail bracket 600 may be prepared in a plate shape and have a guide hole 601 to guide the slide module 700. The slide module 700 may include a slide plate 710, rollers 720, pins 730, elastic bodies 740, and roller brackets 750. The slide module 700 may perform relative motion inside the rail bracket 600 fixed to the first slide cover 410a, and such motion may compensate for a twist and/or crumple of the display assembly that may arise while the electronic device turns from unfolded to folded position.

Referring to FIGS. 13A, 13B, 14 and 15, the rail bracket 600 may be fastened to the first slide cover 410a. For example, the rail bracket 600 may have a first coupling hole 603, and the first slide cover 410a may have a second coupling hole (not shown) corresponding to the first coupling hole 603. A coupling member, e.g., a screw, may be fitted into the first coupling hole 603 and the second coupling hole to fasten the rail bracket 600 to the first slide cover 410a.

According to an embodiment of the present disclosure, the rail bracket 600 may include a guide hole 601 allowing the slide module 700 to move back and forth along a third direction +P or a fourth direction −P which is opposite to the third direction +P. For example, the length of the guide hole 601 may be formed to be larger than the length of the slide module 700, and the width of the guide hole 601 may be formed to correspond to the width of the slide plate 710 so that the slide plate 710 is slidably fitted into the guide hole 601.

According to an embodiment of the present disclosure, the slide plate 710 of the slide module 700 is disposed to be movable in the guide hole 601 of the rail bracket 600, and the slide plate 710 may be fastened to one surface of the first housing 310a via a coupling member, e.g., a screw. For example, the slide plate 710 may have a first coupling hole 718, and the first housing 310a may have a second coupling hole (not shown) corresponding to the first coupling hole 718. A coupling member, e.g., a screw 719, may be fitted into the first coupling hole 718 and the second coupling hole to fasten the slide plate 710 to the first housing 310a (refer to FIG. 15). A linear groove 711 may be formed in the outside of the slide plate 710, corresponding to the shape of the protrusion formed inside the guide hole 601, and at least one hole 712 may be formed in the inside of the slide plate 710 to have parts for smooth sliding arranged therein.

According to an embodiment of the present disclosure, the roller 720, pin 730, elastic body 740, and roller bracket 750 may be disposed in the hole 712 of the slide plate 710. The roller 720 which is in a cylindrical structure may rotate while aiding the slide plate 710 in moving back and forth along a straight line, and the roller bracket 750 where the roller 720 is mounted and the slide plate 710 may remain fastened to each other via the pin 730. The roller 720 of the slide module 700, in its structure, may rotate about the pin 730. The elastic body 740 may expand or contract inside the hole 712.

According to an embodiment of the present disclosure, a plurality of elastic bodies 740 may be disposed to apply a force that brings the roller 720 in tight contact with the inner surface of the guide hole 601 of the rail bracket 600, thereby enabling sliding motion. An end of the elastic body 740 is tightly fastened to the inside of the hole 712 of the slide plate 710, and the other end thereof may remain in tight contact with the roller bracket 750. The elastic body 740 may expand or contract depending on the moving back and forth of the slide plate 710. For example, the elastic body 740 may be a compression coil spring.

According to an embodiment of the present disclosure, the rail bracket 600 may have trapezoidal notches 602 formed in the inner sides of the guide hole 601. The trapezoidal notches 602 may have surfaces inclined towards the inside or outside. When the rollers 720 are positioned on the inclined surfaces of the trapezoidal notches 602 of the rail bracket 600, the rollers 720 may be applied a force in a particular direction by the tension of the elastic bodies 740. The direction in which the force is applied may be a third direction +P or a fourth direction −P depending on the direction of the inclined surface. For example, as applied a force in a particular direction by the tension of the elastic bodies 740, the user may have a feeling of adjustment (e.g., the feeling of being stuck or stopped during motion) when the slide plate 710 moves back and forth or be guided for the degree of folding or unfolding.

FIG. 13A illustrates a configuration in which the slide module 700 is disposed on the guide hole 601 of the rail bracket 600 in the electronic device, and FIG. 13B illustrates a configuration in which the slide module 700 is disposed on the guide hole 601 of the rail bracket 600 in the electronic device folded.

According to an embodiment of the present disclosure, referring to FIG. 13A, in the unfolding operation, the slide plate 710 is applied a force in the third direction +P to move along the guide hole 601 in the third direction +P. After the electronic device is unfolded, the rollers 720 of the slide module 700 moving in the guide hole 601 may remain abutting the inclined surfaces of the trapezoidal notches 602. The elastic bodies 740 may pressurize the rollers 720 in the directions in which the rollers 720 abut the inclined surfaces, and the user may have a feeling of adjustment as the slide plate 710 moves back and forth. The display assembly (e.g., the display assembly 1030 of FIG. 25a) may be coupled with the middle plates (e.g., the middle plates 311a and 311b of FIGS. 5 and 6), and the middle plates may be coupled with the slide module 700 so that the display assembly may bear variations in length corresponding to the movement of the slide module 700. For example, one surface of the display assembly may ever remain flat without twists and/or crumples.

As another example, referring to FIG. 13B, in the folding operation, the slide plate 710 is applied a force in the fourth direction −P to move along the guide hole 601 in the fourth direction −P. After the electronic device is folded, the rollers 720 of the slide module 700 moving in the guide hole 601 may remain abutting the inclined surfaces of the trapezoidal notches 602. The inclined surfaces which the rollers 720 abut may have slopes opposite to the inclined surfaces which the rollers 720 abut in the unfolded position. The elastic bodies 740 may pressurize the rollers 720 in the directions in which the rollers 720 abut the inclined surfaces, and the user may have a feeling of adjustment as the slide plate 710 moves back and forth. The display assembly (e.g., display assembly 1030 of FIG. 25c) may be coupled with the middle plates (e.g., the middle plates 311a and 311b of FIGS. 5 and 6), and the middle plates may be coupled with the slide module 700 so that the display assembly may bear variations in length corresponding to the movement of the slide module 700. For example, one surface of the display assembly may have a sleek curve free of a twist and/or crumple.

Referring to FIGS. 15 and 16, a coupling structure between the rail bracket 600 and the slide plate 710 is shown. Ridges 604 may be formed along the third direction +P (or the fourth direction −P) inside the guide hole 601 of the rail bracket 600, and grooves 711 may be formed in the slide plate 710 corresponding to the ridges 604 to have the ridges 604 fitted thereinto.

For example, the slide plate 710 may be fastened to the rail bracket 600 along the ridges and grooves not to escape off, and the grooves of the slide plate 710 each may have an angled U shape. In the rail bracket 600 along the ridges and grooves, the slide plate 710 may slide back and forth.

According to an embodiment of the present disclosure, the rail bracket 600 of the slide module 700 may be fastened to the first slide cover 410a, and the slide plate 710 may be fastened to the first housing 310a. For example, the rail bracket 600, alongside the first housing 310a, may slide in the rail bracket 600. As set forth above, the slide module 700 may be prepared to be applied a force in a particular direction by the interacting configurations between the rollers 720 and the elastic bodies 740 due to the trapezoidal notches (e.g., the notches 602 of FIG. 13), and thus, when the electronic device 300 is unfolded to become flat, the first housing and the second housing may be applied a force in the outside direction (e.g., the third direction +P of FIG. 13).

Now described in greater detail are the structure and couplings of the center bar and multi bars of the hinge structure.

Figure 17:
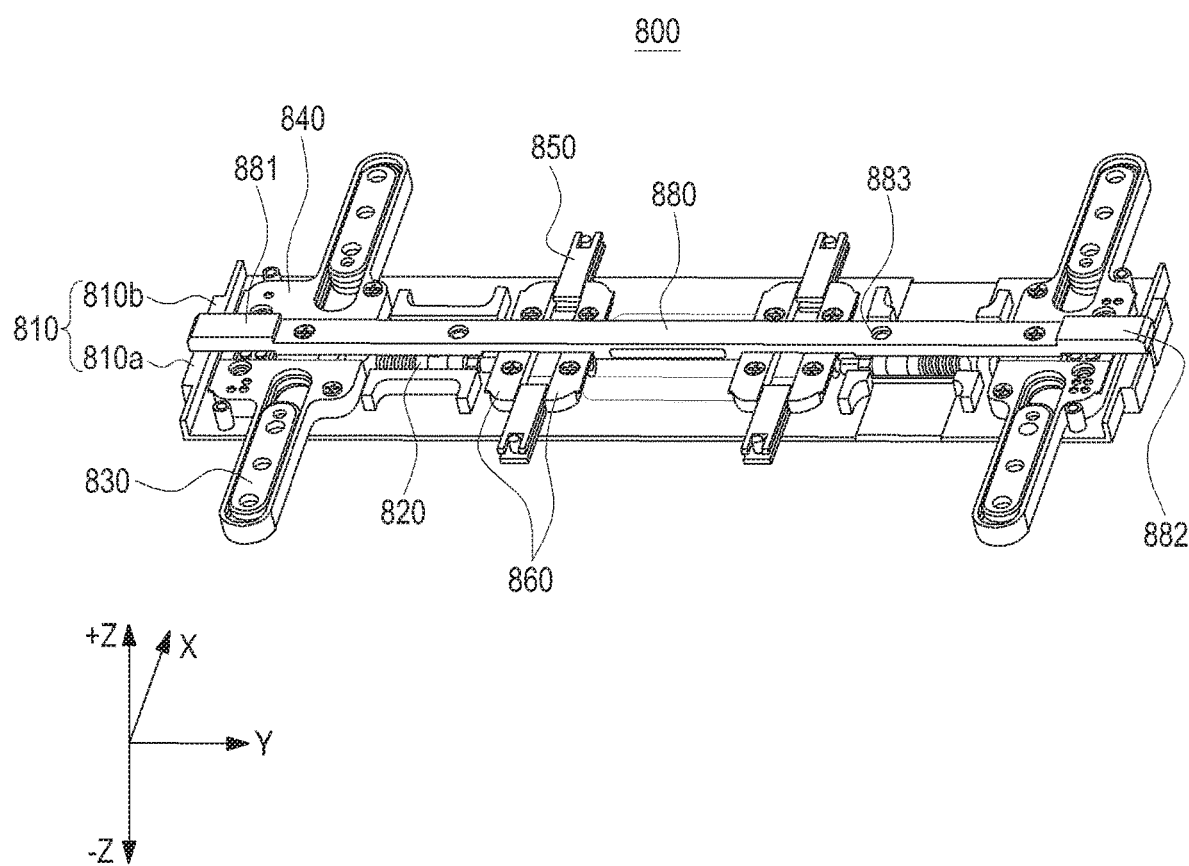
FIG. 17 is a perspective view illustrating a structure in which a center bar is disposed on one surface of a hinge structure in an unfolded position according to an embodiment of the present disclosure.
Figure 18:
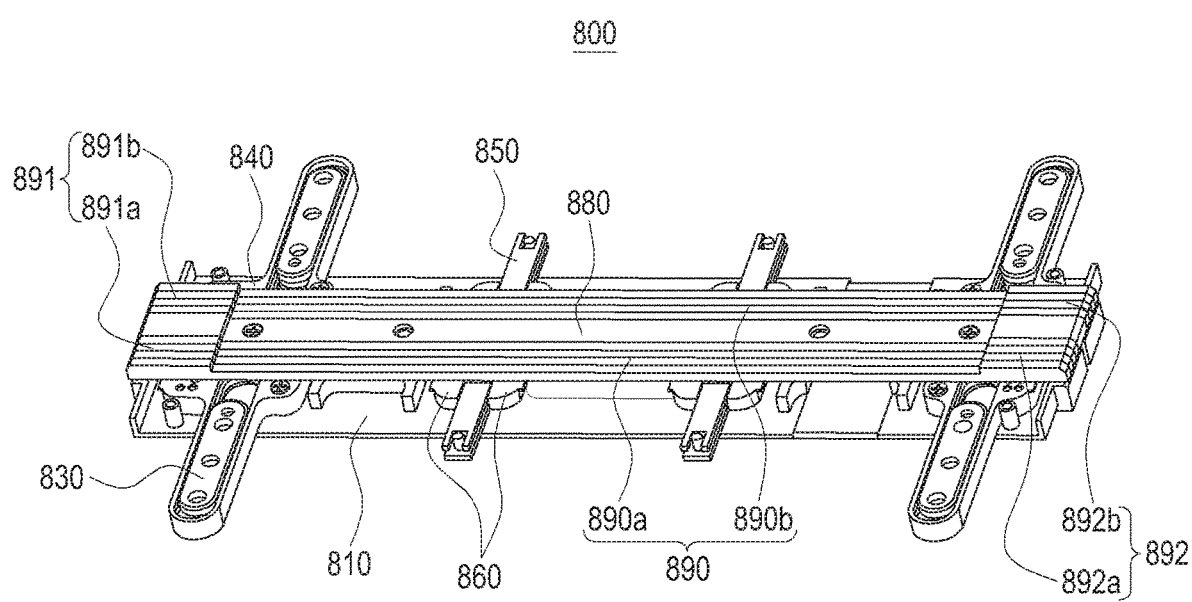
FIG. 18 is a perspective view illustrating a structure in which multi bars are disposed on one surface of a hinge structure in a flat position according to an embodiment of the present disclosure.
Figure 19:
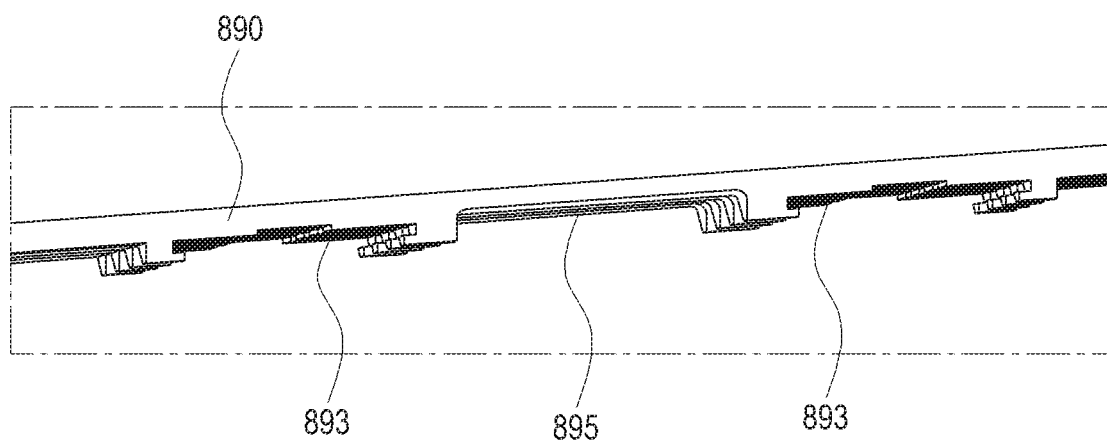
FIG. 19 is a perspective view illustrating a side surface of a multi bar in the flat position according to an embodiment of the present disclosure.
Figure 20:
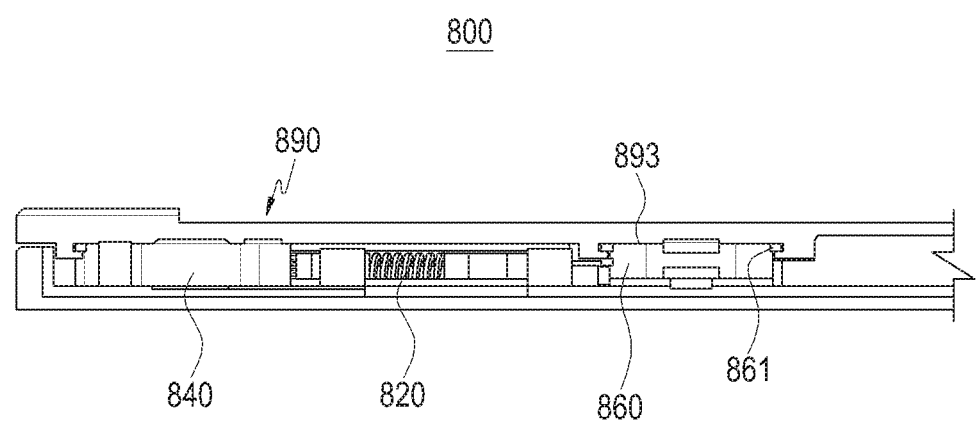
FIG. 20 is a side view illustrating the hinge structure of FIG. 18 according to an embodiment of the present disclosure.

FIG. 17 is a perspective view illustrating a structure in which a center bar 880 is disposed on one surface of a hinge structure 800 in an unfolded position according to an embodiment of the present disclosure. FIG. 18 is a perspective view illustrating a structure in which multi bars 890 are disposed on one surface of a hinge structure 800 in a flat position according to an embodiment of the present disclosure. FIG. 19 is a perspective view illustrating a side surface of the flat multi bar 890 according to an embodiment of the present disclosure, and FIG. 20 is a cross-sectional view illustrating the hinge structure of FIG. 18, according to an embodiment of the present disclosure.

The hinge structure 800 of FIGS. 17, 18, 19 and 20 may be the same in whole or part as the hinge structure 400 of FIG. 9.

Referring to FIG. 17, the hinge structure 800 may include slide covers 810, dual-axis hinge modules 820, slide modules 830, rail brackets 840, slide stoppers 850, and rail stoppers 860. The hinge structure 800 may include the first slide cover 810a and the second slide cover 810b, and the dual-axis hinge modules 820 may couple the first slide cover 810a and the second slide cover 810b to rotate about each other. For example, the first slide cover 810a may be unfolded or folded about the second slide cover 810b.

According to an embodiment of the present disclosure, the center bar 880 may be disposed along the lengthwise direction on one surface of the hinge structure 800 that faces in the first direction +Z. The first slide cover 810a and the second slide cover 810b may be positioned opposite and parallel with each other, and the center bar 880 may be disposed to overlap a portion of the first slide cover 810a and a portion of the second slide cover 810b. The center bar 880 may be disposed along the lengthwise direction of the slide covers 810a and 810b to be placed on portions of the dual-axis hinge modules 820, slide stoppers 850, and rail stoppers 860 which are disposed along the lengthwise direction of the slide covers 810a and 810b.

According to an embodiment of the present disclosure, the center bar 80 may be shaped as a bar with stepped jaws 881 and 882, which protrude in the first direction +Z, at both ends thereof. The stepped jaws 881 and 882 may be formed to correspond to the structure of the multi bars 890 described below. As another example, the center bar 880 may include at least one coupling hole 883 in the position corresponding to the coupling hole (not shown) of the hinge structure 800 to lead to a coupling to the hinge structure 800 via, e.g., a screw. For example, the center bar 880 may be coupled to the dual-axis hinge modules 820 disposed opposite each other with respect to the central line between the slide covers 810.

According to an embodiment of the present disclosure, the center bar 880 may be fastened to one surface of the hinge structure 800, supporting the display assembly. Accordingly, the display assembly may be prevented and/or reduced from bending inward of the electronic device. Since the structure of the center bar 880 is able to support a side-facing portion of the display assembly when the electronic device is substantially in the folded position, the thickness of the center bar 880 may be designed to have a variety of sizes corresponding to the side portion of the display assembly.

Referring to FIGS. 18 and 19, the center bar 880 may be disposed along the lengthwise direction on one surface of the hinge structure 800 which faces in the first direction +Z, and a plurality of multi bars 890 may be disposed with the center bar 880 therebetween. For example, the first slide cover 810a and the second slide cover 810b may be positioned opposite and parallel with each other, and the center bar 880 may be disposed to overlap a portion of the first slide cover 810a and a portion of the second slide cover 810b. The multi bars 890 may include a first multi bar 890a and a second multi bar 890b. The first multi bar 890a may be disposed on the first slide cover 810a, and the second multi bar 890b may be disposed on the second slide cover 810b.

According to an embodiment of the present disclosure, the first multi bar 890a may be an array of multiple bars, with stepped jaws 891a and 892a, which project in the first direction +Z, at both ends thereof. Holes 893 may be formed in an inner surface of the first multi bar 890a to enable a coupling with the hinge structure 800. As another example, the second multi bar 890b may be an array of multiple bars, with stepped jaws 891b and 892b, which project in the first direction, at both ends thereof. Holes 893 may be formed in an inner surface of the second multi bar 890b to enable a coupling with the hinge structure 800.

According to an embodiment of the present disclosure, the first multi bar 890a and/or the second multi bar 890b may have other holes 895 each of which is positioned between two adjacent ones of the holes 893. The holes 895 may provide a pathway through which a flexible printed circuit board (e.g., the flexible printed circuit board of FIG. 19) described below passes. According to an embodiment of the present disclosure, the multi bars 890 are fastened to one surface of the hinge structure 800, supporting, along with the center bar 880, the display assembly not to bend inward of the electronic device. When the electronic device is substantially folded, the multi bars 890, in their structure, may be positioned in the portion corresponding to the folded area formed by the display assembly, and the plurality of bars are separated sideways, forming a curved surface. Accordingly, they may support the display assembly corresponding to the structure of the display assembly forming the curve. Although the first multi bar 890a and the second multi bar 890b each are comprised of four bars, each multi bar is not limited thereto, but may rather be subject to various design changes to have different shapes or numbers of bars to make the curve more perfect.

Referring to FIG. 20, the structure of coupling the multi bars 890 with other components of the hinge structure 800 is shown. The holes 893 of the multi bars 890 may be designed in the configuration corresponding to the shape of the rail stopper 860—for example, the holes 893 may be formed in the bottom surfaces of the multi bars 890 with L-shaped stepped jaws included. The rail stoppers 860 may be fitted into the stepped jaw-containing holes 893. For example, ridges 861 corresponding to the stepped jaw-containing holes 893 may be formed on the top surfaces of the rail stoppers, and the ridges 861 may be fitted into the holes 893 to be prevented and/or reduced from escaping off.

According to an embodiment of the present disclosure, each of the multiple bars of each multi bar 890 may independently include stepped jaw-containing holes 893, and the multiple bars may stretch or contract sideways along the ridges 861 of the rail stoppers 860.

Figure 21:
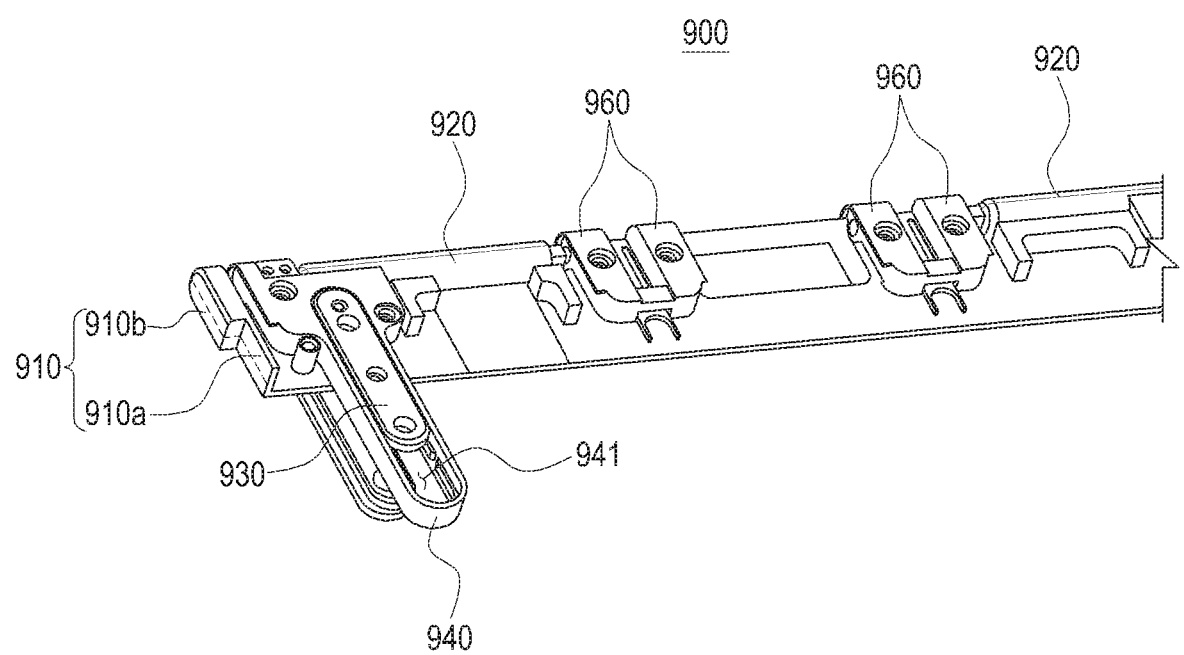
FIG. 21 is a perspective view illustrating a hinge structure in a folded position according to an embodiment of the present disclosure.
Figure 22:
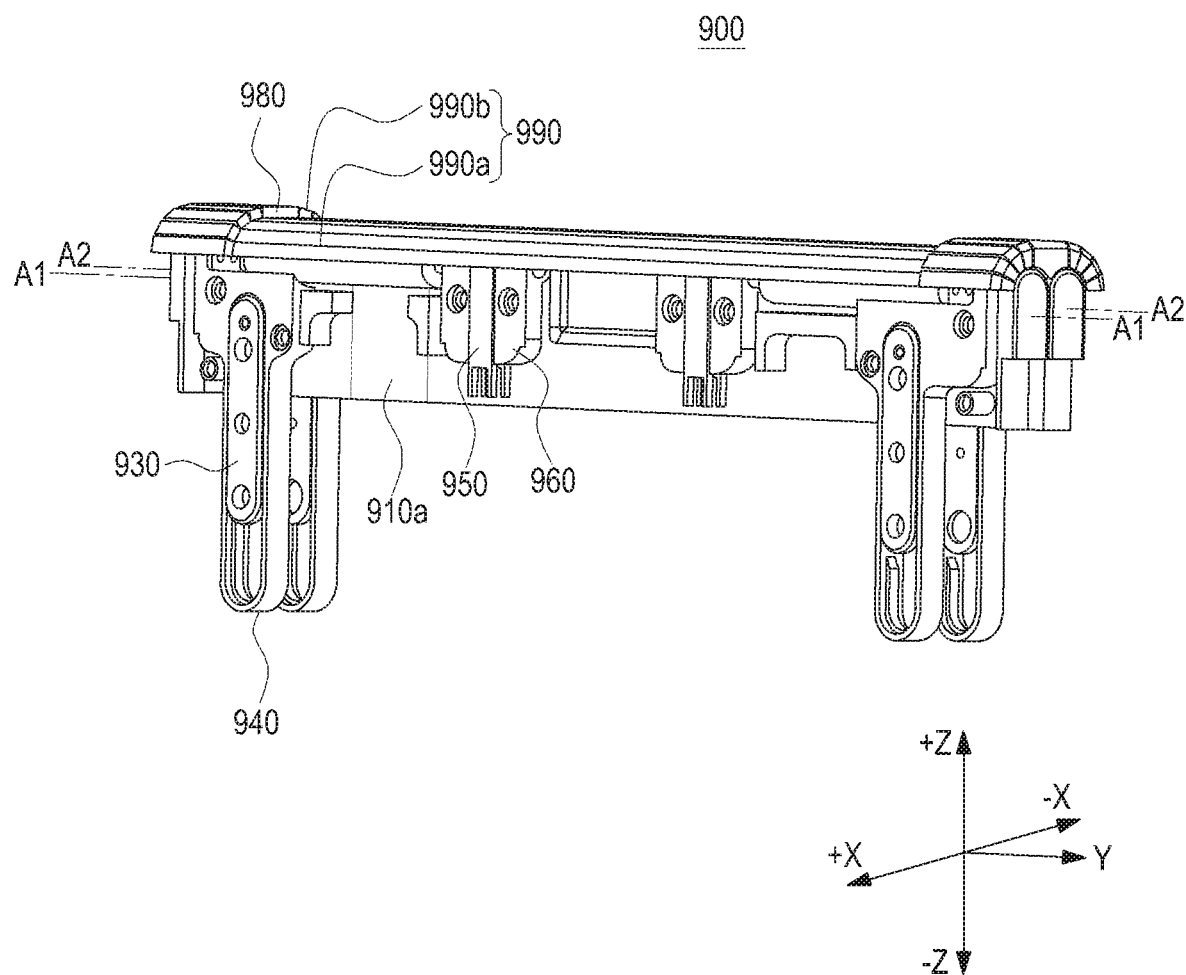
FIG. 22 is a perspective view illustrating a structure in which a center bar and multi bars are disposed on one surface of a hinge structure in a folded position according to an embodiment of the present disclosure.
Figure 23:
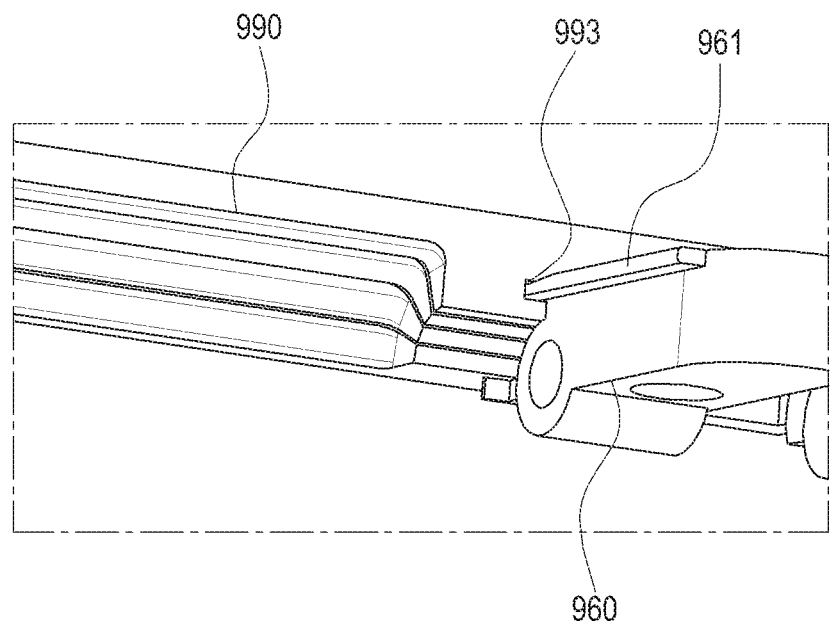
FIG. 23 is a perspective view illustrating a bottom surface of a multi bar in a hinge structure in a folded position according to an embodiment of the present disclosure.

FIG. 21 is a perspective view illustrating a hinge structure 900 in a folded position according to an embodiment of the present disclosure. FIG. 22 is a perspective view illustrating a structure in which a center bar 980 and multi bars 990 are disposed on one surface of a hinge structure 900 in a folded position according to an embodiment of the present disclosure. FIG. 23 is a perspective view illustrating a bottom surface of a multi bar 990 in a hinge structure 900 in a folded position according to an embodiment of the present disclosure.

The hinge structure 900 of FIGS. 21, 22 and 23 may be the same in whole or part as the hinge structure 800 of FIGS. 17 to 20.

Referring to FIG. 21, the hinge structure 900 may include slide covers 910, dual-axis hinge modules 920, slide modules 930, rail brackets 940, slide stoppers 950, and rail stoppers 960. The hinge structure 900 may include the first slide cover 910a and the second slide cover 910b, and the dual-axis hinge modules 920 may couple the first slide cover 910a and the second slide cover 910b to rotate about each other. For example, the first slide cover 910a may be unfolded or folded about the second slide cover 910b.

According to an embodiment of the present disclosure, in a folding operation, one surface of the first slide cover 910a of the hinge structure 900 may be disposed opposite one surface of the second slide cover 910b. The dual-axis hinge modules 920 disposed in the recesses of the first slide cover 910a and the second slide cover 910b may form two virtual rotational axes A1 and A2, and the first slide cover 910a and the second slide cover 910b may rotate about each other along the virtual rotational axes A1 and A2. For example, the first slide cover 910a may rotate about the second slide cover 910b and the first virtual rotational axis A1, and the second slide cover 910b may rotate about the first slide cover 910a and the second virtual rotational axis A2.

According to an embodiment of the present disclosure, in the folding operation, the slide modules 930 and the rail stoppers 960 disposed on the first slide cover 910a and the second slide cover 910b may be disposed opposite each other.

Referring to FIGS. 21 and 22, the state of the center bar 980 and multi bars 990 disposed on the hinge structure 900 folded being varied and the operation of the slide modules 930 may be illustrated.

According to an embodiment of the present disclosure, the center bar 980 and a plurality of multi bars 990 may be disposed along the lengthwise direction on one surface of the hinge structure 900 that faces in the first direction +Z. The cooperation beam 980 may be disposed so that its whole area faces in the first direction +Z, and the multi bars 990 may be disposed to form a curved surface from the first direction +Z to the third direction +Z or fourth direction −Z which is perpendicular to the first direction +Z.

According to an embodiment of the present disclosure, the multi bars 990 may include a first multi bar 990a and a second multi bar 980b with the center bar 980 disposed therebetween. The first multi bar 990a may be disposed on the first slide cover 910a, and the second multi bar 990b may be disposed on the second slide cover 910b.

According to an embodiment of the present disclosure, in the folding operation of the hinge structure 900, the plurality of bars comprising the first multi bar 990a are arranged from the first direction +Z to the third direction +X, and their cross section may be shaped as a fan. Each of the bars comprising the first multi bar 990a may be designed so that its outer surface is longer in width than its inner surface, and its cross section may be shaped as a trapezoid. The plurality of bars comprising the first multi bar 990a are positioned, when folded, so that their respective inner surfaces are brought in contact with each other while their respective outer surfaces are relatively spaced away from each other, forming a curved surface.

According to an embodiment of the present disclosure, in the folding operation of the hinge structure 900, the plurality of bars comprising the second multi bar 990b are arranged from the first direction +Z to the fourth direction −X, and their cross section may be shaped as a fan. Each of the bars comprising the second multi bar 990b may be designed so that its outer surface is longer in width than its inner surface, and its cross section may be shaped as a trapezoid. The plurality of bars comprising the second multi bar 990b are positioned, when folded, so that their respective inner surfaces are brought in contact with each other while their respective outer surfaces are relatively spaced away from each other, forming a curved surface.

Referring to FIG. 23, the structure of coupling the multi bars 990 with the rail stoppers 960 of the hinge structure is shown. The holes 993 of the multi bars 990 may be designed in the configuration corresponding to the shape of the ridges of the rail stopper 960—for example, the holes 993 may be formed in the bottom surfaces of the multi bars 990 with projecting stepped jaws included. The rail stoppers 960 may be fitted into the stepped jaw-containing holes 993. Although the plurality of bars of the multi bars 990 transform into the fan shape as the electronic device folds, the ridges 961 on the top surface of the rail stopper 860 may remain fitted to the holes 993, prevented and/or reduced from escaping off.

Figure 24A:
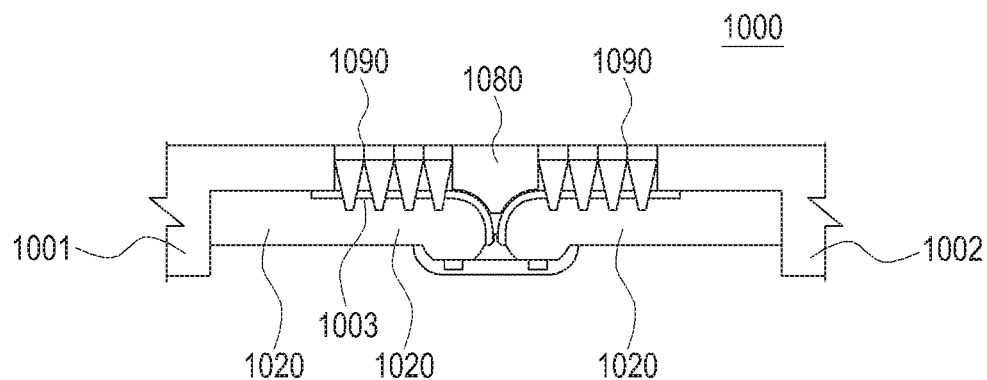
FIG. 24A is a top view illustrating a hinge structure disposed between the first housing and the second housing with the slide covers and excluded, according to an embodiment of the present disclosure.
Figure 24B:
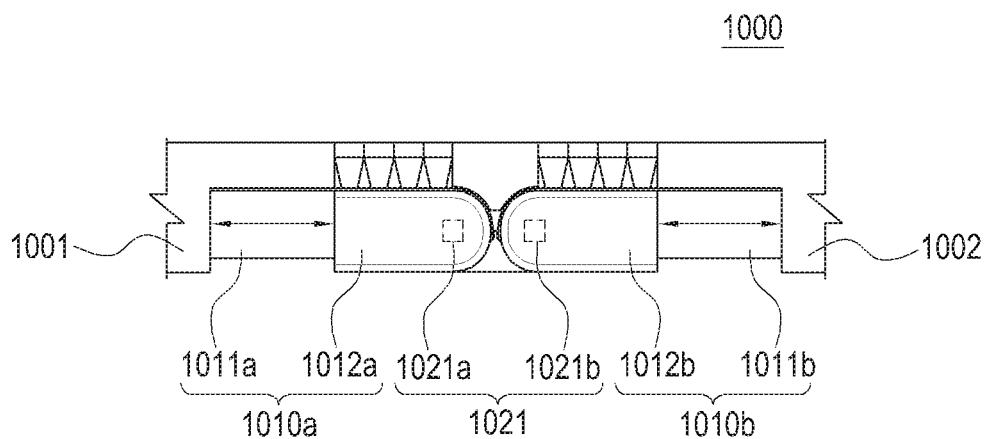
FIG. 24B is a top view illustrating the structure of FIG. 26 with the slide covers 1010a and 1010b arranged, according to an embodiment of the present disclosure.

FIG. 24A is a top view illustrating a hinge structure 1000 disposed between the first housing 1001 and the second housing 1002 with the slide covers 1010a and 1010b excluded, according to an embodiment of the present disclosure. FIG. 24B is a top view illustrating the structure of FIG. 26 with the slide covers 1010a and 1010b arranged, according to an embodiment of the present disclosure.

The hinge structure 1000 of FIGS. 24A and 24B may be the same in whole or part as the hinge structure 1000 of FIGS. 17 to 23.

Referring to FIG. 24A, when the first housing 1001 and the second housing 1002 are position parallel with each other, in the structure with the slide covers (the slide covers 1010a and 1010b of FIG. 24B) excluded, the side surfaces of the center bar 1080 and multi bars 1090 disposed at the outsides of the first housing 1001 and the second housing 1002 may be exposed to the outside. The couplings between the exposed center bar 1080 and the dual-axis hinge modules 1020 are exposed, resulting in easier infiltration of foreign bodies and a deterioration of the aesthetic appearance. As another example, as a plurality of bars whose both ends are shaped as trapezoids are arranged in the exposed multi bars 1090, gaps 1003 may be left therebetween. The gaps 1003, when exposed to the outside, may be readily subject to infiltration of foreign bodies and a deterioration of its look in terms of aestheticism.

Referring to FIG. 24B, the hinge structure 1000 may be implemented which includes the slide covers 1010a and 1010b to prevent and/or reduce exposure to the outside of the center bar 1080, multi bars 1090, and dual-axis hinge modules that would otherwise be exposed to the outside. The slide covers 1010a and 1010b may provide air-tight sealing, against the outside, for the couplings of the center bar 1080 and dual-axis hinge modules 1020 and the gaps formed by the multi bars 1090, preventing and/or reducing infiltration of foreign bodies and achieving a more aesthetic look.

According to an embodiment of the present disclosure, the slide covers 1010a and 1010b may include the first slide cover 1010a disposed in the first housing 1001 and the second slide cover 1010b disposed in the second housing 1002. The slide covers 1010a and 1010b may be restricted by the hinge shafts 1021a and 1021b and rotate along the virtual rotational axes formed in the lengthwise directions of the hinge shafts 1021a and 1021b. Where the electronic device is unfolded and remains flat, the first slide cover 1010a and the second slide cover 1010b may also remain parallel with each other. Where the electronic device is folded, the first slide cover 1010a and the second slide cover 1010b may slide and move.

According to an embodiment of the present disclosure, the first slide cover 1010a may include a first portion 1011a at least part of which is seated on the side surface of the first housing 1001 and a second portion 1012a that extends from the first portion 1011a and is disposed between the first housing 1001 and the second housing 1002. The second portion 1012a may protrude beyond the first portion 1011a towards the hinge shaft 1021a, and as the electronic device is unfolded and folded, it may be moved in a direction perpendicular to the hinge shaft 1021a. As another example, the second portion 1012a may have an end curved along the lengthwise direction to enable smooth rotation about the rotational axis formed by the hinge shaft 1021a.

As another example, the second slide cover 1010b may include a first portion 1011b at least part of which is seated on the side surface of the second housing 1002 and a second portion 1012b that extends from the first portion 1011b and is disposed between the first housing 1001 and the second housing 1002. The second portion 1012b may protrude beyond the first portion 1011b towards the hinge shaft 1021b, and as the electronic device is unfolded and folded, it may be moved in a direction perpendicular to the hinge shaft 1021b. As another example, the second portion 1012b may have an end curved along the lengthwise direction to enable smooth rotation about the rotational axis formed by the hinge shaft 1021b.

The rotational state of an electronic device with a hinge structure is described below.

Figure 25A:
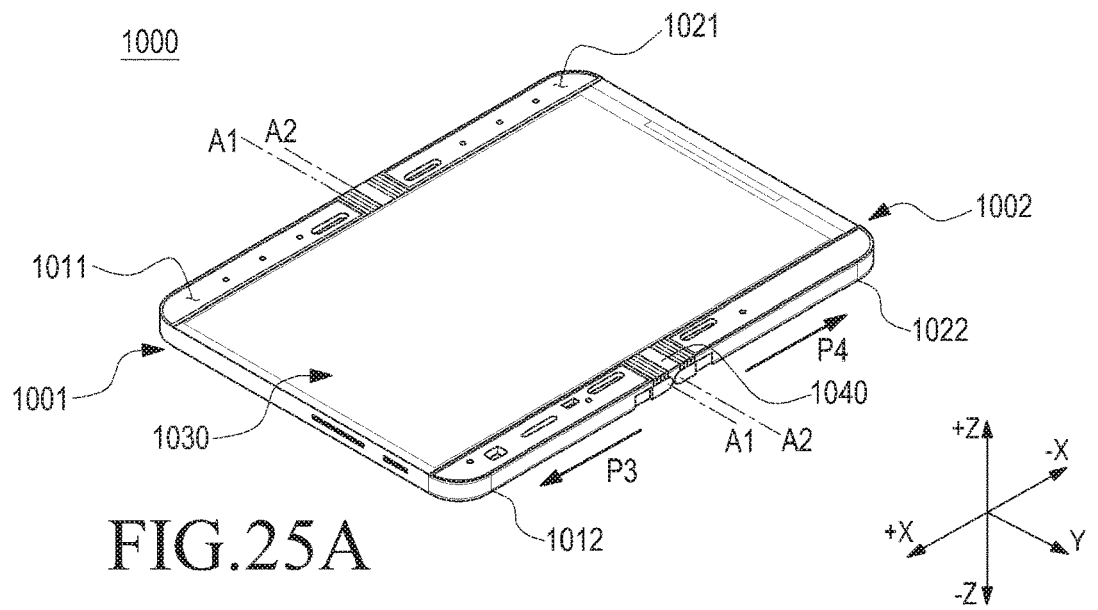
FIGS. 25A, 25B and 25C are perspective views sequentially illustrating the operation of an electronic device with a hinge structure that transforms from an unfolded to a folded position, according to an embodiment of the present disclosure.
Figure 25B:
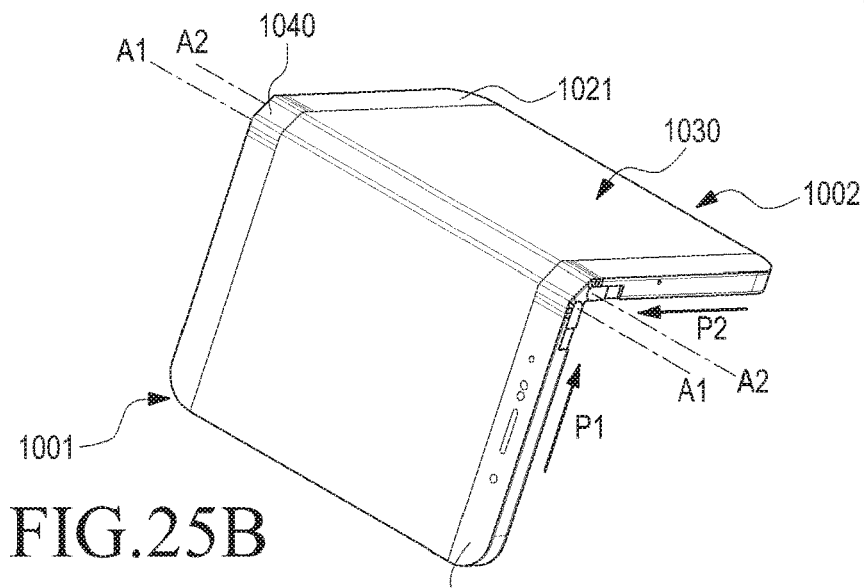
Figure 25C:
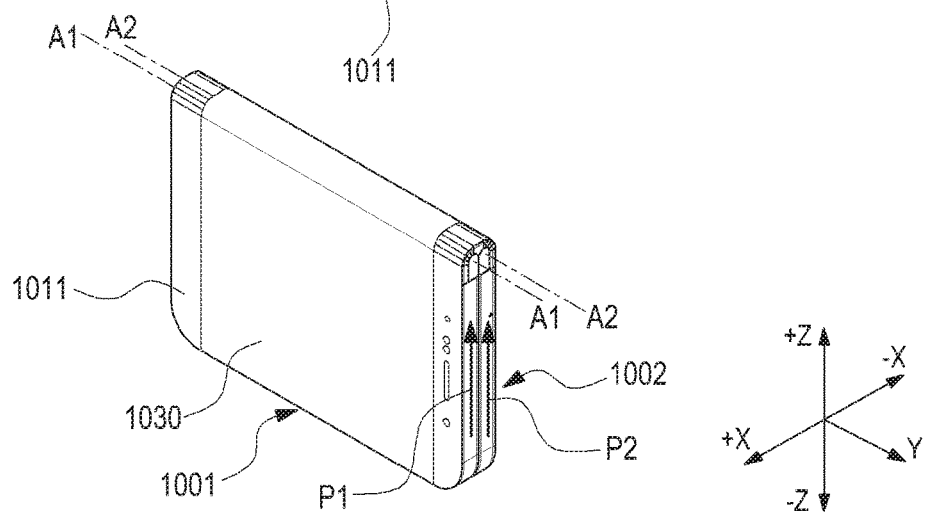
Figure 26A:
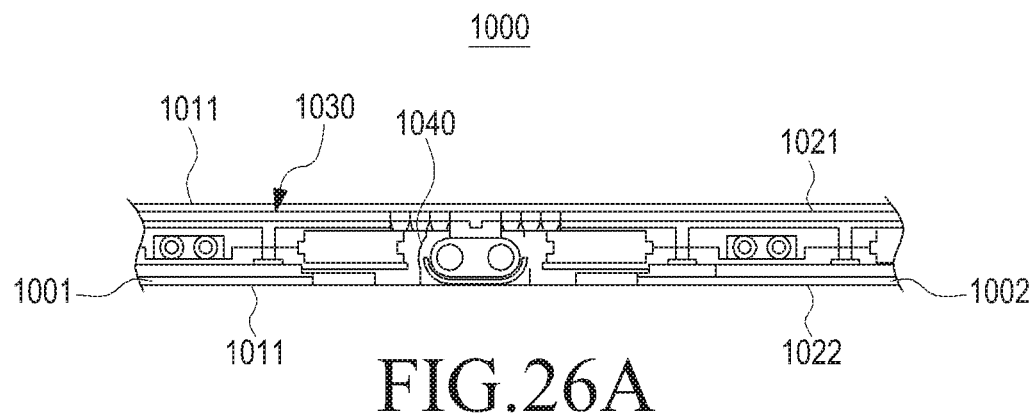
FIGS. 26A, 26B and 26C are cross-sectional views sequentially illustrating the operation of the electronic device that transforms from an unfolded to a folded position, where a side thereof has been cut away, according to an embodiment of the present disclosure.
Figure 26B:
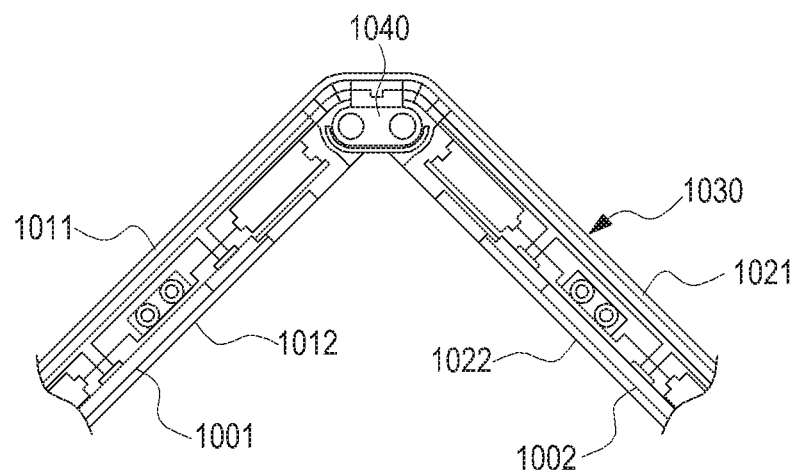
Figure 26C:
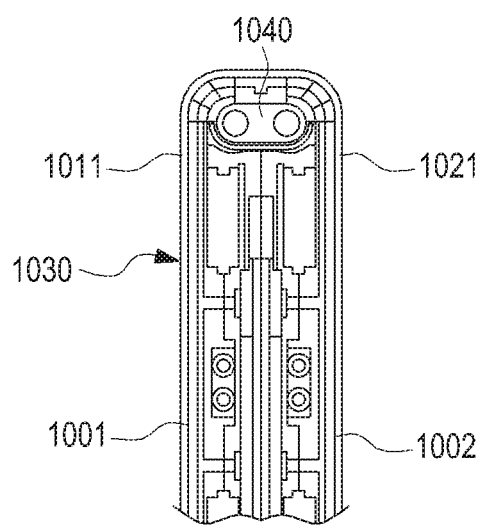

FIGS. 25A, 25B and 25C are perspective views sequentially illustrating the operation of an electronic device 1000 with a hinge structure 1040 that transforms from an unfolded to a folded position, according to an embodiment of the present disclosure. FIGS. 26A, 26B and 26C are cross-sectional views sequentially illustrating the operation of the electronic device 1000 that transforms from an unfolded to a folded position, where a side thereof has been cut away, according to an embodiment of the present disclosure. Referring to FIGS. 25a, 25B, 25C, 26A, 26B and 26C, the electronic device 1000 with the hinge structure 1040 may be the same in whole or part as the electronic device 1000 with the hinge structure 1040 of FIGS. 17 to 23.

According to an embodiment of the present disclosure, in the electronic device 1000, a first virtual rotational axis A1 and a second virtual rotational axis A2 may be formed via the structure of dual-axis hinge modules (e.g., the dual-axis hinge modules 820 of FIG. 17) disposed inside the hinge structure 1040. The first housing 1001 may have the first virtual rotational axis A1 and rotate around the first virtual rotational axis A1. As another example, the second housing 1002 may have the second virtual rotational axis A2 and rotate about the second virtual rotational axis A2.

According to an embodiment of the present disclosure, as the first housing 1001 and the second housing 1002 rotate about different hinge axes (e.g., the first virtual rotational axis A1 and the second virtual rotational axis A2), the first housing 1001 may rotate about the second housing 1002 at an angle from 0 degrees to 180 degrees. For ease of description, the angle from 0 degrees to 180 degrees may be the angle of the first housing 1001 with respect to the second housing 1002. In this disclosure, the following states may be defined for illustration purposes: a first state in which the angle between the first housing 1001 and the second housing 1002 is 180 degrees, a second state in which the angle between the first housing 1001 and the second housing 1002 is more than 0 degrees and less than 180 degrees, and a third state in which the angle between the first housing 1001 and the second housing 1002 is 0 degrees. However, although the angle between the first housing 1001 and the second housing 1002 is 180 degrees in the first state and 0 degrees in the third state, embodiments of the present disclosure are not limited thereto. For example, the first state may be a state in which the electronic device is substantially unfolded so that the first housing 1001 and the second housing 1002 are positioned substantially parallel with each other (e.g., the angle between the two housings is substantially 180 degrees), and the third state may be a state in which the electronic device is folded so that the first housing 1001 and the second housing 1002 are positioned substantially opposite each other (e.g., the angle between the two housings is substantially 0 degrees). One state between the first state and the third state may be the second state.

Referring to FIGS. 25A and 26A, the electronic device unfolded may be defined as being in the first state where the first housing 1001 and the second housing 1002 are flat with respect to each other. The angle between the first housing 1001 and the second housing 1002 is 180 degrees, and the angle between the first slide cover (parts disposed on the first slide cover) of the hinge structure 1040 and the second slide cover (parts disposed on the second slide cover) may be 180 degrees accordingly.

According to an embodiment of the present disclosure, in the first state, the first surface 1011 of the first housing 1001 and the third surface 1021 of the second housing 1002 may be disposed side-by-side while facing in the same direction, and the second surface 1012 of the first housing 1001 and the fourth surface 1022 of the second housing 1002 may also be disposed side-by-side (opposite the first surface 1011 and the third surface 1021) while facing in the same direction. For example, the first surface 1011 of the first housing 1001 may be disposed to face in the first direction +Z, and the third surface 1021 of the second housing 1002 may be disposed to face in the first direction +Z. Further, the second surface 1012 of the first housing 1001 may be disposed to face in the second direction −Z, and the fourth surface 1022 of the second housing 1002 may be disposed to face in the third direction −Z.

According to an embodiment of the present disclosure, the display assembly 1030 may be disposed to extend from the first housing 1001 through the hinge structure 1040 to the second housing 1002, and the display assembly 1030 may be disposed to face in the first direction +Z in the first state.

In the electronic device being unfolded, the first housing 1001 and the second housing 1002 may be applied a force that faces externally (e.g., a force facing in the P3 direction and P4 direction or a force facing in the third direction +X and fourth direction −X). For example, the P3 direction may be a direction from the hinge structure 1040 to the display assembly 1030 disposed in the first housing 1001, and the P4 direction may be a direction from the hinge structure 1040 to the display assembly disposed in the second housing 1002.

According to an embodiment of the present disclosure, the first housing 1001 and the second housing 1002 may receive a force (e.g., a force facing in the P3 direction and P4 direction) towards the outside from the neutral surface of the display assembly 1030 by the tension of the elastic bodies (the elastic bodies 740 of FIG. 13) disposed inside the slide modules (e.g., the slide modules 700 of FIG. 13) in the hinge structure 1040 disposed inside the electronic device 1000. Accordingly, the slide plates (e.g., the slide plates 710 of FIG. 13) may be disposed outside of the guide holes of the rail brackets (e.g., the rail brackets 600 of FIG. 13).

According to an embodiment of the present disclosure, the display assembly 1030 coupled with the slide modules via the housings may be controlled for its varying length as the slide modules operate. For example, the length of the unfolded electronic device along the +X and −X axes may be relatively smaller than the length of the folded electronic device along the +X and −X axes. Accordingly, the display assembly disposed in the electronic device unfolded may be subject to a deformation, e.g., floating. To prevent and/or reduce such deformation, the display assembly, along with the slide modules, may move to the outside (e.g., in the P3 direction and P4 direction) from the neutral surface. The display assembly 1030 whose varying length has been controlled may ever remain flat while delivering an even quality of screen to the user.

Referring to FIGS. 25B and 26B, one state of the first housing 1001 and the second housing 1002 while transforming between the flat and folded position may be defined as the second state. The angle between the first housing 1001 and the second housing 1002 may be more than 0 degrees and less than 180 degrees, and the angle between the first slide cover (parts disposed on the first slide cover) of the hinge structure 1040 and the second slide cover (parts disposed on the second slide cover) may be more than 0 degrees and less than 180 degrees accordingly.

According to an embodiment of the present disclosure, in the second state, the first surface 1011 of the first housing 1001 and the third surface 1021 of the second housing 1002 may be disposed to have a predetermined angle (more than 0 degrees and less than 180 degrees) therebetween, and the second surface 1012 of the first housing 1001 and the fourth surface 1022 of the second housing 1002 may also be disposed to have a predetermined angle (more than 0 degrees and less than 180 degrees) therebetween. For example, the first surface 1011 of the first housing 1001 and the third surface 1021 of the second housing 1002 may be positioned to form the Greek letter 'A' with respect to the standing surface. As another example, the first surface 1011 of the first housing 1001 and the third surface 1021 of the second housing 1002 may be disposed to have substantially 90 degrees therebetween, and the third surface 1021 of the second housing 1002 may be disposed to face in the first direction +Z while the first surface 1011 of the first housing 1001 may be disposed to be angled by substantially 90 degrees with respect to the third surface 1021. As another example, the first surface 1011 of the first housing 1001 may be disposed to face in the first direction +Z, and the third surface 1021 of the second housing 1002 may be disposed to be angled by substantially 90 degrees with respect to the first surface 1011.

According to an embodiment of the present disclosure, the display assembly 1030 may be disposed from the first housing 1001 through the hinge structure 1040 to the second housing 1002. In the second state, the display assembly may be positioned in the direction in which the first surface of the first housing 1001 faces, the direction in which the third surface 1021 of the second housing 1002 faces, and the direction in which the hinge structure 1040 with multiple folding lines faces. For example, the display assembly 1030 disposed on the hinge structure 1040 may form a curved surface.

According to an embodiment of the present disclosure, in the electronic device transforming from the unfolded to folded position, the first housing 1001 and the second housing 1002 may be applied a force that faces internally (e.g., a force facing in the P1 direction and P2 direction). For example, the P1 direction may be a direction from the display assembly 1030 disposed in the first housing 1001 to the hinge structure 1040, and the P2 direction may be a direction from the display assembly 1030 disposed in the second housing 1002 to the hinge structure 1040. As another example, the P1 direction may be opposite to the P3 direction, and the P2 direction may be opposite to the P4 direction.

According to an embodiment of the present disclosure, the first housing 1001 and the second housing 1002 may receive a force (e.g., a force facing in the P1 direction and P2 direction) towards the inside from the neutral surface of the display assembly 1030 by the tension of the elastic bodies (the elastic bodies 740 of FIG. 13) disposed inside the slide modules (e.g., the slide modules 700 of FIG. 13) in the hinge structure 1040 disposed inside the electronic device 1000. Accordingly, the slide plates (e.g., the slide plates 710 of FIG. 13) may be disposed inside along the guide holes of the rail brackets (e.g., the rail brackets 600 of FIG. 13).

According to an embodiment of the present disclosure, the display assembly 1030 coupled with the slide modules via the housings may be controlled for its varying length as the slide modules operate. For example, the top-to-bottom length of the electronic device in the unfolded position may be relatively smaller than in the folded position. As the electronic device folds, the display assembly disposed in the electronic device may receive a force that pulls up from both sides, causing its portion to deform due to expansion. To prevent and/or reduce such deformation, the display assembly, along with the slide modules, may move to the neutral surface (e.g., in the P1 direction and P2 direction). The display assembly 1030 whose varying length has been controlled may ever remain flat while delivering an even quality of screen to the user.

Referring to FIGS. 25C and 26C, the electronic device may be defined as being in the third state where the first housing 1001 and the second housing 1002 are folded about each other. The angle between the first housing 1001 and the second housing 1002 is 0 degrees, and the angle between the first slide cover (parts disposed on the first slide cover) of the hinge structure 1040 and the second slide cover (parts disposed on the second slide cover) may be 0 degrees accordingly.

According to an embodiment of the present disclosure, in the third state, the first surface 1011 of the first housing 1001 and the third surface 1021 of the second housing 1002 may be disposed opposite each other, and the second surface 1012 of the first housing 1001 and the fourth surface 1022 of the second housing 1002 may also be disposed opposite each other. For example, the first surface 1011 of the first housing 1001 may be disposed to face in the third direction +X, and the third surface 1021 of the second housing 1002 may be disposed to face in the fourth direction −X. Further, the second surface 1012 of the first housing 1001 may be disposed to face in the fourth direction −X, and the fourth surface 1022 of the second housing 1002 may be disposed to face in the third direction +X. Accordingly, only the first surface 1011 and third surface 1021 where the display assembly 1030 has been exposed may be exposed to the user.

According to an embodiment of the present disclosure, the display assembly 1030 may be disposed from the first housing 1001 through the hinge structure 1040 to the second housing 1002. In the third state, the portion disposed in the first housing 1001 may be disposed to face in the third direction +X while the portion disposed in the second housing 1002 may be disposed to face in the fourth direction −X. As another example, the portion disposed on the hinge structure 1040 may be disposed to form a curved surface along the third direction +X and/or the fourth direction −X with respect to the first direction +Z.

In the electronic device being folded, the first housing 1001 and the second housing 1002 may be applied a force that faces internally (e.g., a force facing in the P1 direction and P2 direction or a force facing in the first direction +Z). For example, the P1 direction may be a direction from the display assembly 1030 disposed in the first housing 1001 to the hinge structure 1040, and the P2 direction may be a direction from the display assembly 1030 disposed in the second housing 1002 to the hinge structure 1040. As another example, the P1 direction may be opposite to the P3 direction, and the P2 direction may be opposite to the P4 direction.

According to an embodiment of the present disclosure, the first housing 1001 and the second housing 1002 may receive a force (e.g., a force facing in the P1 direction and P2 direction) towards the inside from the neutral surface of the display assembly 1030 by the tension of the elastic bodies (the elastic bodies 740 of FIG. 13) disposed inside the slide modules (e.g., the slide modules 700 of FIG. 13) in the hinge structure 1040 disposed inside the electronic device 1000. Accordingly, the slide plates (e.g., the slide plates 710 of FIG. 13) may be disposed inside along the guide holes of the rail brackets (e.g., the rail brackets 600 of FIG. 13).

According to an embodiment of the present disclosure, the display assembly 1030 coupled with the slide modules via the housings may be controlled for its varying length as the slide modules operate. The display assembly 1030 whose varying length has been controlled may ever remain flat while delivering an even quality of screen to the user. For example, by the varying structure of the multi bars (e.g., the multi bars 890 of FIG. 18) supporting the display assembly 1030 and the operational structure of the slide modules allowing the housings to slide, the display assembly disposed over the first housing 1001 and the second housing 1002 may be restricted for deformation even in the folded or unfolded position while remaining flat and wrinkle-free all the time.

Figure 27:
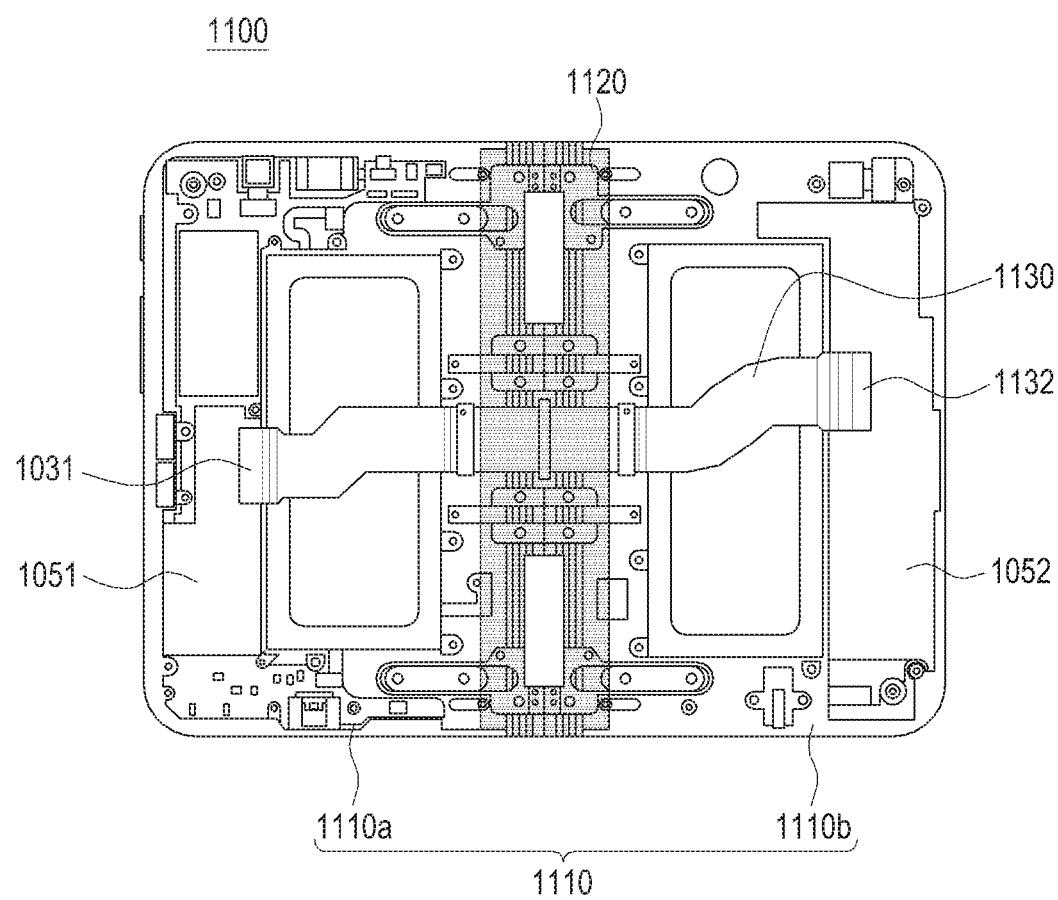
FIG. 27 is a diagram illustrating a state of a main flexible printed circuit board disposed inside a housing according to an embodiment of the present disclosure.
Figure 28:
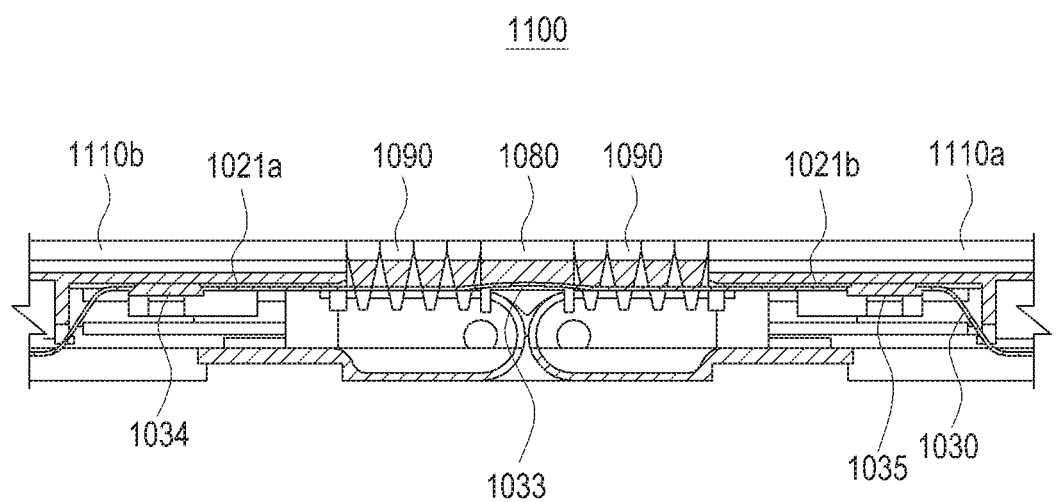
FIG. 28 is a cross-sectional view of a main flexible printed circuit board disposed in an electronic device in a flat position according to an embodiment of the present disclosure.

FIG. 27 is a diagram illustrating a state of a main flexible printed circuit board 1030 disposed inside a housing 1110 according to an embodiment of the present disclosure. FIG. 28 is a cross-sectional view of the main flexible printed circuit board 1030 disposed in the electronic device 1100 which is in the flat position, according to an embodiment of the present disclosure, and FIG. 29 is a cross-sectional view of the main flexible printed circuit board 1030 disposed in the electronic device 1100 which is in the folded position, according to an embodiment of the present disclosure.

Figure 29:
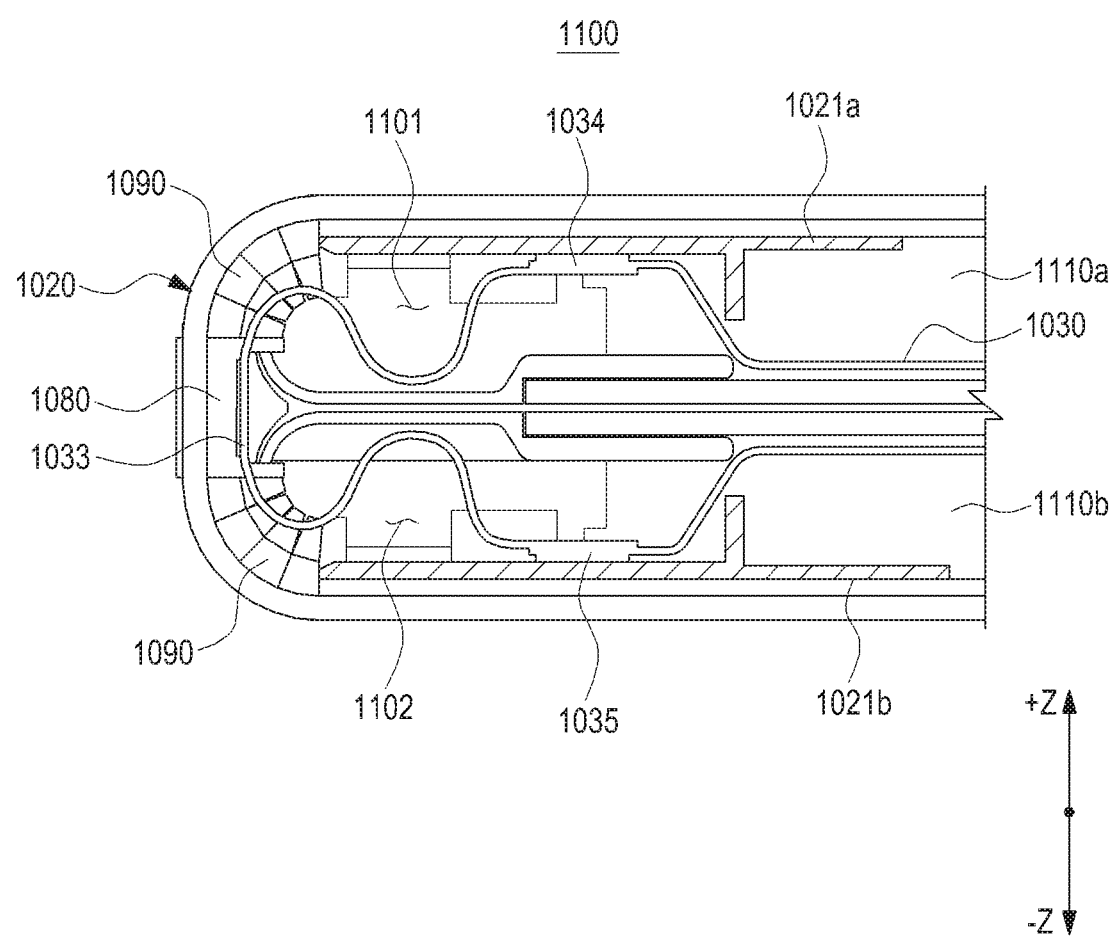
FIG. 29 is a cross-sectional view of a main flexible printed circuit board disposed in an electronic device in a folded position according to an embodiment of the present disclosure.

Referring to FIGS. 27, 28 and 29, the structure of the first housing 1110a and the second housing 1110b may be the same in whole or part as the structure of the first housing 310a and the second housing 310b of FIGS. 5 to 7.

Referring to FIG. 27, the electronic device 1110 may include the first housing 1110a, the second housing 1110b, the hinge structure 1020, and a flexible printed circuit board 1030. The hinge structure 1020 may couple the first housing 1110 with the second housing 1110b so that they may rotate about each other. For example, the first housing 1110a may be folded or unfolded about the second housing 1110b. The flexible printed circuit board 1030 may electrically connect the circuit parts disposed on the first housing 1110a and the second housing 1110b.

According to an embodiment of the present disclosure, the flexible printed circuit board 1030 may be disposed across the first housing 1110a and the second housing 1110b. For example, the flexible printed circuit board 1030 may extend from the first housing 1110a through the hinge structure 1020 to the second housing 1110b. Connectors 1031 and 1032 may be prepared at both sides of the flexible printed circuit board 1030 to make electrical connections with the main printed circuit board 1051 disposed in the first housing 1110a and the sub printed circuit board 1052 disposed in the second housing 1110b.

According to an embodiment of the present disclosure, the flexible printed circuit board 1030 may include a straight portion and a curved portion. The flexible printed circuit board 1030 may include at least one signal line which may include, for example, and without limitation, a power line, a ground line, and digital and analog signal lines, or the like.

Referring to FIG. 28, the flexible printed circuit board 1030 disposed inside the electronic device 1100 unfolded may be shown. The flexible printed circuit board 1030 passing through the area where the hinge structure 1020 is disposed may be disposed between the surface where the center bar 1080 or multi bars 1090 of the hinge structure 1020 are disposed and the inside surface of the hinge structure 1020. A hole (e.g., the hole 895 of FIG. 19) may be formed at the lengthwise center of the multi bars 1090 in the inside where the flexible printed circuit board 1030 may traverse.

According to an embodiment of the present disclosure, as the electronic device 1100 unfolds to become flat or folds, the space where the flexible printed circuit board 1030 increases or decreases, influencing the flexible printed circuit board 1030. For example, the flexible printed circuit board 1030 disposed in the electronic device 1100 unfolded may remain the flattest. On the other hand, the flexible printed circuit board 1030 disposed in the electronic device 1100 folded may be disposed in the space which is relatively narrow lengthwise.

According to an embodiment of the present disclosure, the flexible printed circuit board 1030 may be coupled to a portion of the electronic device 1100 so that the position where it is overall mounted is not varied by the transformation of the electronic device 1100. The flexible printed circuit board 1030 may include a first portion 1033 coupled with one surface of the center bar 1080, a second portion 1034 coupled with the first slide cover 1021a disposed on the first housing 1110a, and a third portion 1035 coupled with the second slide cover 1021b disposed on the second housing 1110b. As another example, free motion may be achieved with no coupling made to the electronic device 1100 between the first portion 1033 and the second portion 1034 and/or between the first portion 1033 and the third portion 1035.

Referring to FIG. 29, the flexible printed circuit board 1030 disposed inside the electronic device 1100 folded may be shown. The flexible printed circuit board 1030 passing through the area where the hinge structure 1020 is disposed may be disposed between the surface where the center bar 1080 or multi bars 1090 are disposed and the hinge structure 1020.

According to an embodiment of the present disclosure, the flexible printed circuit board 1030 disposed in the electronic device 1100 when the electronic device 1100 is in the folded position may be disposed in a relatively small space as compared with when the electronic device 1100 is in the flat position, so that a portion of the flexible printed circuit board 1030 may be bent towards the inner space 1101 or 1102. The inner space 1101 or 1102 disposed in the first housing 1110a or the second housing 1110b may prevent and/or reduce disconnection of the signal lines disposed in the flexible printed circuit board 1030.

According to an embodiment of the present disclosure, the first portion 1033 of the flexible printed circuit board 1030 disposed in the folded electronic device 1100 may be coupled to one surface of the center bar 1080, the second portion 1034 may be coupled to the first slide cover 1021a disposed on the first housing 1110a, and the third portion 1035 may remain coupled with the second slide cover 1021b disposed on the second housing 1110b. As another example, the area between the first portion 1033 and second portion 1034 of the flexible printed circuit board 1030 may form a curve that faces in the second direction −Z in the inner space 1101 disposed in the first housing 1110a. The area between the first portion 1033 and third portion 1035 of the flexible printed circuit board 1030 may form a curve that faces in the first direction +Z in the inner space 1102 disposed in the second housing 1110b.

Figure 30:
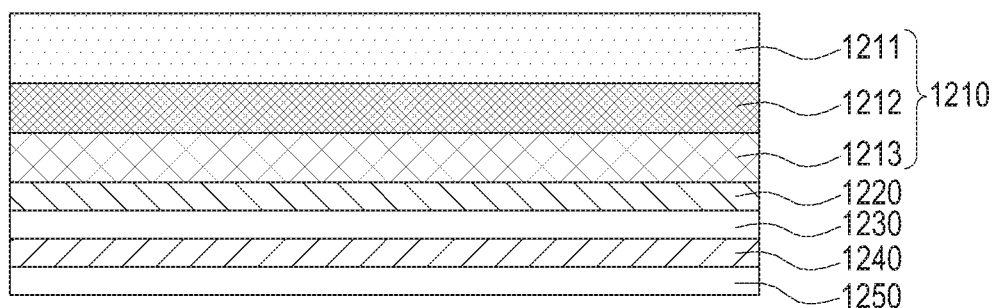
FIG. 30 is a cross-sectional view illustrating a stacked structure of a display assembly according to an embodiment of the present disclosure.
Figure 31:
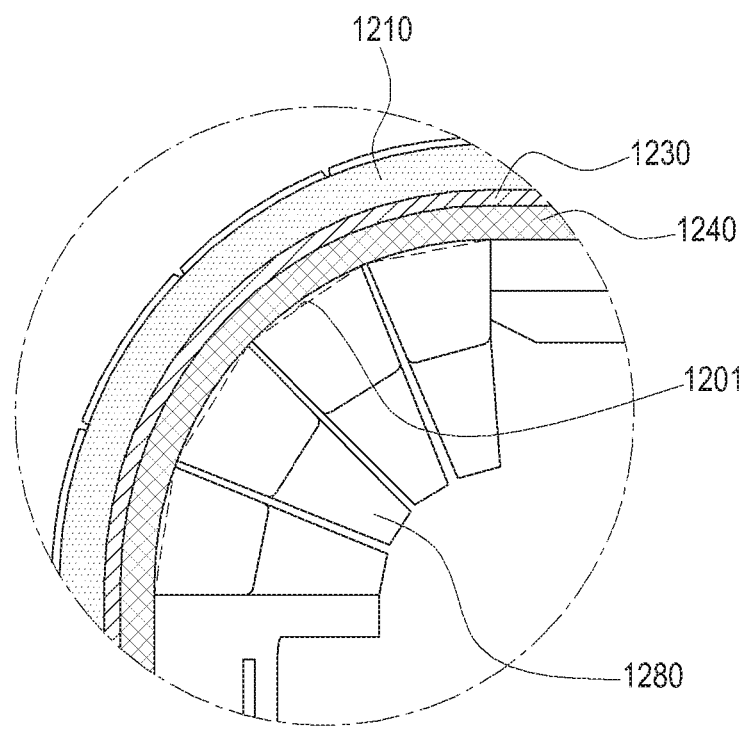
FIG. 31 is a cross-sectional view illustrating a variation to a stacked structure of a display assembly disposed in an electronic device folded, according to an embodiment of the present disclosure.

FIG. 30 is a cross-sectional view illustrating a stacked structure of a display assembly 1200 according to an embodiment of the present disclosure. FIG. 31 is a cross-sectional view illustrating a variation to a stacked structure of a display assembly 1200 disposed in an electronic device folded, according to an embodiment of the present disclosure.

Referring to FIGS. 30 and 31, the structure of the electronic device and display assembly 1200 may be the same in whole or part as the structure of the electronic device 200 or display assembly 220 of FIG. 2. According to an embodiment of the present disclosure, the electronic device 200 may include a housing 210 and a display assembly 220 or 1200.

Referring to FIGS. 2, 30, and 31, various films for coupling to the housings 210 may be stacked on the bottom surface of the display assembly 1200 disposed in the housings 210.

According to an embodiment of the present disclosure, in the display assembly 1200, a display module 1210, a first adhesive member 1220, a supporting member 1230, an elastic member 1240, and a second adhesive member 1250 may sequentially be disposed in the order thereof along the second direction −Z. As an example, the display module 1210 may include a window member 1211, a touch panel 1212, and a display panel 1213 that are sequentially disposed in the order thereof along the second direction −Z. The window member 1211 may form the outer appearance of the electronic device, and the window member 1211 may contain, e.g., polyimide film (PI). The display panel 1213 (e.g., OLED) may be mounted on an inner surface of the window member 1211. The touch panel 1212 may be disposed between the window member 1211 and the display panel 1213. For example, the display module 1210 may be utilized as an input device equipped with touchscreen functionality, not alone as an output device for outputting screen. According to an embodiment of the present disclosure, the display module 1210 may include a separate digitizer panel (not shown), as an input panel, on the rear surface of the display panel 1213. For example, the digitizer panel may detect a handwriting that is made by an input module (e.g., a pen) while communicating with the electronic device 300 in a wired or wireless manner, and the digitizer panel may deliver the detected handwriting to the electronic device.

According to an embodiment of the present disclosure, the variety of films stacked on the bottom surface of the display module 1210 may be disposed on the first bracket (e.g., the first bracket 312*a* of FIG. 5) of the first housing 210 and the second bracket (e.g., the second bracket 312*b* of FIG. 5) of the second housing 210 and may maintain adhesivity on the folding hinge structure 230 without deteriorating surface quality.

According to an embodiment of the present disclosure, the elastic member 1240 may be disposed between the multi bar 1280 and the display module 1210 and may be used to form a uniform surface between the display module 1210 and the multi bars 1280 that form a curved surface as the electronic device folds. For example, the multi bar 1280 may form a flat surface in the electronic device in the flat position and a curved surface in the electronic device in the folded position. Since the multi bar 1280 is formed as straight bars, the curved surface formed upon folding may leave a gap 1201 from the opposite surface where they are substantially stacked. Where the elastic member 1240 formed of an elastic material is disposed on one surface of the multi bar 1280, a compensation may be made to remove the gap 1201, preventing and/or reducing the display module 1210 disposed on the multi bar 1280 from crumpling and resultantly enhancing the surface quality of the display assembly 1200.

According to an embodiment of the present disclosure, the elastic member 1240 may be disposed on the whole surface where the multi bar 1280 is disposed, and the elastic member 1240 may contain various elastic materials, e.g., rub or sponge.

According to an embodiment of the present disclosure, the supporting member 1230 may be disposed between the display module 1210 and the elastic member 1240, mitigating defective factors, e.g., air bubbles, of the elastic member 1240. For example, where the elastic member 1240 alone is in use, the air bubbles of the elastic member 1240 may infiltrate into the inside the display module 1210, likely deteriorating the surface quality of display. Where the supporting member 1230 is stacked on one surface of the elastic member 1240, the supporting member 1230 may cover the air pores of the elastic member 1240, preventing and/or reducing infiltration of air bubbles.

According to an embodiment of the present disclosure, the supporting member 1230 may be disposed on the overall surface where the multi bar 1280 is placed, and the supporting member 1230 may be formed of a material flexible and with low roughness to make the surface even, even upon folding. For example, the supporting member 1230 may include, for example, and without limitation, a polyimide film (PI) or polyurethane film (PU), or the like.

According to an embodiment of the present disclosure, the first adhesive member 1220 may be disposed between the display module 1210 and the supporting member 1230 to attach the display module 1210 and the supporting member 1230. The first adhesive member 1220 may be formed of various materials unlikely to damage surfaces that are attached at room temperature under low pressure, such as, for example, and without limitation, pressure sensitive adhesive (PSA), or the like.

According to an embodiment of the present disclosure, the second adhesive member 1250 may be disposed between the elastic member 1240 and the multi bar 1280 to attach the elastic member 1240 and the multi bar 1280. The second adhesive member 1250 may be formed of various materials unlikely to damage surfaces that are attached at room temperature under low pressure, e.g., pressure sensitive adhesive (PSA).

According to an embodiment of the present disclosure, the display assembly 1200 configured of composite films arranged and stacked on the bottom surface of the display module 1210 may maintain adhesivity without deteriorating the quality of surface that is bend on the folding hinge structure 230.

According to an example embodiment of the present disclosure, an electronic device may comprise a foldable housing structure including a first housing structure including a first surface and a second surface, a second housing structure including a third surface and a fourth surface, and a connection structure connected between the first housing structure and the second housing structure, including a fifth surface and a sixth surface, and configured to be bendable to allow the second surface to face the fourth surface when the connection surface is fully bent, a flexible touchscreen display assembly extending along the first surface, the fifth surface, and the third surface, a first sliding structure including a first rail bracket connected with the connection structure and extending from the first structure to the connection structure in a first direction, and a first slide module positioned inside the first rail bracket, connected with the first housing structure, and movable in the first direction when the connection structure is bent, and a second sliding structure including a second rail bracket connected with the connection structure and extending from the second structure to the connection structure in a second direction and a second slide module positioned inside the second rail bracket, connected with the second housing structure, and movable in the second direction when the connection structure is bent.

According to an embodiment of the present disclosure, the electronic device may further comprise a third sliding structure including a third rail bracket connected with the connection structure and extending parallel with the first rail bracket and a third slide module positioned inside the third rail bracket, connected with the first housing structure, and movable in the first direction when the connection structure is bent and a fourth sliding structure including a fourth rail bracket connected with the connection structure and extending parallel with the second rail bracket and a fourth slide module positioned inside the fourth rail bracket, connected with the second housing structure, and movable in the second direction when the connection structure is bent.

According to an embodiment of the present disclosure, the first rail bracket may include an inner surface facing in a third direction perpendicular to the first surface and perpendicular to the first direction and at least one recess in the inner surface, and the first slide module may include at least one elastic member that moves to the inside of the at least one recess while the first slide module moves in the first direction.

According to an embodiment of the present disclosure, the display may include a first area. The first area may include an organic light emitting display (OLED) layer, a foam layer disposed between the OLED layer and the first housing structure, and a polyimide layer disposed between the foam layer and the OLED layer.

According to an embodiment of the present disclosure, the display may further include a second area. The second area may include an organic light emitting display (OLED) layer, a foam layer disposed between the OLED layer and the second housing structure, and a polyimide layer disposed between the foam layer and the OLED layer.

According to an embodiment of the present disclosure, the display may further include a third area connected between the first area and the second area. The third area may include an organic light emitting display (OLED) layer, a foam layer disposed between the OLED layer and the sixth surface, and a polyimide layer disposed between the foam layer and the OLED layer.

According to an embodiment of the present disclosure, an electronic device may comprise a first housing including a first surface and a second surface facing in a direction opposite to the first surface, a second housing including a third surface and a fourth surface facing in a direction opposite to the third surface, a hinge structure disposed between the first housing and the second housing to provide rotational motion between the first housing and the second housing, and a flexible display assembly disposed from the first surface of the first housing through the hinge structure to the third surface of the second housing, at least part of the flexible display assembly forming a curved surface as the hinge structure is folded.

The hinge structure may include dual-axis hinge modules providing a first rotational axis allowing the first housing to rotate about the second housing and a second rotational axis allowing the second housing to rotate about the first housing and slide modules coupled with the first housing and the second housing to provide sliding motion perpendicular to a lengthwise direction of the first housing and the second housing.

According to an embodiment of the present disclosure, the flexible display assembly may include a first area disposed in at least part of a first surface of the first housing, a second area disposed in at least part of a front surface of the second housing, and a third area extending from the first area and the second area and disposed in at least part of an outer surface of the hinge structure. Corresponding to folding of the electronic device, the first area may rotate about the second area, and a virtual folding line forming the curved surface may be disposed in the third area.

According to an embodiment of the present disclosure, the slide modules may include a first slide module and a second slide module. The first slide module may be connected with the first housing, and the second slide module may be connected with the second housing. When the first housing is folded about the second housing, the first slide module and the second slide module may slide towards the third area of the flexible display assembly.

According to an embodiment of the present disclosure, the slide modules may include a first slide module and a second slide module. The first slide module may be connected with the first housing, and the second slide module is connected with the second housing. When the first housing and the second housing are positioned in parallel with each other, the first slide module and the second slide module may slide away from the third area of the flexible display assembly.

According to an embodiment of the present disclosure, the hinge structure may include a first slide cover and a second slide cover covering at least part of a rear surface of the electronic device, the dual-axis hinge modules disposed in recesses formed in the first slide cover and the second slide cover and providing a virtual rotational axis and another virtual rotational axis to the first slide cover and the second slide cover, respectively, rail brackets each fastened to a respective one of the respective inner surfaces of the first slide cover and the second slide cover, and the slide modules sliding along guide holes formed in the rail brackets.

According to an embodiment of the present disclosure, the hinge structure may further include a pair of rail stoppers coupled to the respective inner surfaces of the first slide cover and the second slide cover and restricting rotational motion of the first slide cover and the second slide cover and slide stoppers disposed between the pair of rail stoppers and movable along slide lines disposed inside the slide covers.

According to an embodiment of the present disclosure, the slide modules each may include a slide plate including at least one hole having an opening at a side thereof, a roller disposed in the hole, exposed towards the opening, and rotating in contact with a side surface of the rail bracket, at least one elastic body disposed inside the hole and providing tension to allow the roller to face the rail bracket, and a bracket supporting the elastic body and the roller.

According to an embodiment of the present disclosure, the rail brackets each may include at least one trapezoidal notch formed in an inner side of the guide hole. The roller of the slide module which moves in the guide hole may receive a force to pressurize from the elastic body to accelerate or decelerate along a direction of an inclined surface of the trapezoidal notch.

According to an embodiment of the present disclosure, the slide modules may include a first slide module and a second slide module. The first slide module may be connected with the first housing, and the second slide module may be connected with the second housing.

When the first housing is unfolded about the second housing, the roller disposed in the first slide module and the roller disposed in the second slide module may be positioned to abut the inclined surfaces of the trapezoidal notches. The elastic bodies may provide forces to the rollers in directions along which the rollers abut the inclined surfaces.

According to an embodiment of the present disclosure, the first area of the display assembly may be connected with the first slide module, and the second area of the display assembly may be connected with the second slide module. Corresponding to movements of the first slide module and the second slide module, the first area and the second area may receive forces that face in directions opposite to the third area, and the first area, the second area, and the third area may form surfaces positioned parallel with each other.

According to an embodiment of the present disclosure, the slide modules may include a first slide module and a second slide module. The first slide module may be connected with the first housing, and the second slide module may be connected with the second housing.

When the first housing is folded about the second housing, the roller disposed in the first slide module and the roller disposed in the second slide module may be positioned to abut the inclined surfaces of the trapezoidal notches. The elastic bodies may provide forces to the rollers in directions along which the rollers abut the inclined surfaces.

According to an embodiment of the present disclosure, the first area of the display assembly may be connected with the first slide module, and the second area of the display assembly may be connected with the second slide module. Corresponding to movements of the first slide module and the second slide module, the first area and the second area may receive forces that face the third area, and the third area which is disposed in one surface of the hinge structure may remain an even curved surface. The slide plate may be coupled to an inner surface of the first housing or the second housing. The first housing or the second housing may move back and forth corresponding to a movement of the slide module.

According to an embodiment of the present disclosure, a ridge protruding in a lengthwise direction may be formed in the inner side of the guide hole of the rail bracket, and a groove corresponding to the protruding ridge may be formed in the slide plate, so that the ridge fits into the groove.

According to an embodiment of the present disclosure, the hinge structure may include a center bar disposed in a middle of an outer surface of the hinge structure and supporting the flexible display assembly and multi bars disposed at both sides of the center bar and transforming the third area of the flexible display assembly into the curved surface.

According to an embodiment of the present disclosure, the multi bars may include a first multi bar and a second multi bar disposed opposite each other with the center bar disposed therebetween. The first multi bar and the second multi bar each may include an array of a plurality of bars.

According to an embodiment of the present disclosure, the bars of each multi bar, each, may be formed so that an outer surface thereof is longer in width than an inner surface thereof. When the electronic device is folded, the respective inner surfaces of the bars may contact each other, and the respective outer surfaces of the bars may be spaced away from each other.

According to an embodiment of the present disclosure, an inner surface of each multi bar may have a hole formed corresponding to a shape of an outer surface of the rail stopper to be coupled with the rail stopper. The multi bar may rotate corresponding to rotational motion of the rail stopper.

According to an embodiment of the present disclosure, when the electronic device is in an unfolded position, the first surface of the first housing and the third surface of the second housing may be disposed to face in the same direction, and when the electronic device is in a folded position, the second surface of the first housing and the fourth surface of the second housing may be disposed opposite each other.

According to an embodiment of the present disclosure, when the electronic device is the folded position, the outer surface of the hinge structure may have a protruding structure on a side surface thereof. The protruding structure may include a flat surface disposed perpendicular to the second surface of the first housing or the fourth surface of the second housing to support a portion of the flexible display assembly and a curved surface extending from both sides of the flat surface to the first housing or the second housing.

According to an embodiment of the present disclosure, the electronic device may further comprise a flexible printed circuit board disposed to extend from an inner side of the first housing through the hinge structure to an inner side of the second housing. Corresponding to folding of the electronic device, the flexible printed circuit board may form at least one curved portions.

According to an embodiment of the present disclosure, the curved portion of the flexible printed circuit board may be disposed to pass through an inside of the hinge structure. The curved portion may include a first portion coupled with a surface of the center bar, a second portion coupled with the slide cover disposed on the first housing, and a third portion coupled with the slide cover disposed on the second housing.

According to an embodiment of the present disclosure, the flexible display assembly may include a flexible display module, an elastic member disposed between the hinge structure and the display module to fill a gap formed by a curved shape of the hinge structure or the display module, and a supporting member disposed between the display module and the elastic member and supporting the elastic member.

According to an embodiment of the present disclosure, the flexible display assembly may further include an adhesive member disposed between the display module and the supporting member or between the elastic member and the hinge structure. The elastic member may provide an elastic force to allow the multi bars of the hinge structure transforming as the electronic device unfolds or folds to form a virtual surface with the same height.

As is apparent from the foregoing description, according to an embodiment of the present disclosure, an electronic device with a flexible display may freely vary between a small screen mode and a large screen mode depending on the structure in which the flexible display is flattened or folded by the user's manipulation.

According to an embodiment of the present disclosure, an electronic device with a flexible display has a hinge structure in an area where the flexible display folds to cancel off variations in length to the flexible display, delivering an even quality of screen to the user all the time.

According to an embodiment of the present disclosure, an inner space is prepared in an area where a flexible printed circuit board is folded inside an electronic device with a flexible display, allowing the printed circuit board to withstand stress or large external tension steadily applied thereto.

According to an embodiment of the present disclosure, a flexible, elastic film is stacked on a flexible display of an electronic device, delivering an even quality of screen to the user all the time.

While the disclosure has been illustrated and described with reference to various example embodiments thereof, it will be understood by those skilled in the art that various changes in form and details may be made therein without departing from the spirit and scope of the disclosure as defined by the appended claims and their equivalents.

What is claimed is:

1. An electronic device, comprising:
a first housing and a second housing;
a flexible display accommodated by the first housing and the second housing;
a hinge structure connecting the first housing and the second housing, and configured to facilitate rotational motion of the first housing and the second housing toward or away from each other such that the flexible display is folded or unfolded with respect to the hinge structure;

a guide extending from the hinge structure;

a slider attached to the first housing or the second housing, and disposed to be slid along the guide away from the hinge structure such that the first housing or the second housing to which the slider is attached is moved with the slider away from the hinge structure to pull a portion of the flexible display away from the hinge structure when the flexible display is unfolded; and an elastic element disposed in contact with the slider to provide an elastic force that causes the slider to slide along the guide away from the hinge structure.

2. The electronic device according to claim 1, wherein the hinge structure comprises hinges for providing a plurality of rotational axes for the rotational motion between the first housing and the second housing, wherein the slider configured to provide sliding motion in direction substantially perpendicular with respect to the rotational axes when the flexible display is unfolded, and wherein the guide comprises rail brackets, connected to the hinges, configured to guide the sliding motion of the slider.

3. The electronic device according to claim 2, wherein the slider includes a first slider and a second slider, wherein the first slider is configured to provide the sliding motion in a first direction substantially perpendicular to the rotational axes, and wherein the second slider is configured to provide the sliding motion in a second direction opposite to the first direction.

4. The electronic device according to claim 3, wherein the flexible display includes a first area positioned on a first surface side of the first housing, a second area positioned on a third surface side of the second housing, and a folding area extending between the first area and the second area and positioned over at least part of an outer surface of the hinge structure.

5. The electronic device according to claim 4, wherein, when the first housing and the second housing are unfolded, the first slider and the second slider each slides away from the folding area of the flexible display.

6. The electronic device according to claim 2, wherein the slider is disposed adjacent to a folding area of the flexible display, the slider includes a first slider coupled with the first housing and a second slider coupled with the second housing, and wherein the first slider provides a force in a first direction to one portion of the folding area, and the second slider provides a force in a second direction opposite to the first direction to other portion of the folding area.

7. The electronic device according to claim 3, wherein the elastic element is provide a force in a direction substantially perpendicular of the first direction or the second direction.

8. The electronic device according to claim 1, wherein the slider comprises at least one slide plate is coupled with the first housing or the second housing, and wherein the elastic element is disposed in contact with the at least one slide plate.

9. The electronic device according to claim 1, wherein the elastic element is configured to provide the elastic force between the hinge structure and the first housing so as to provide a force on opposite sides of the flexible display along a substantially perpendicular direction to a lengthwise direction of the first housing.

10. The electronic device according to claim 1, wherein the elastic element is configured to provide the elastic force between the hinge structure and first housing so as to provide a force in a lengthwise direction of the flexible display.

11. The electronic device according to claim 1, wherein the slider comprise first and second slider aligned in a lengthwise direction of the flexible display, and third and fourth sliders aligned in the lengthwise direction of the flexible display.

12. The electronic device according to claim 11, wherein the first and third sliders are connected with the first housing and the second and fourth sliders are connected with the second housing, and wherein, when the first housing is folded around the second housing, the first, second, third, and fourth sliders each slides in the lengthwise direction of the flexible display toward a folding area of the flexible display.

13. The electronic device according to claim 12, wherein, when the first housing and the second housing are unfolded, the first, second, third, and fourth sliders each slides in the lengthwise direction of the flexible display away from the folding area of the flexible display.

14. The electronic device according to claim 1, further comprising:

at least one slide stopper configured to restrict movement of the slider.

15. The electronic device according to claim 14, further comprising at least one pair of rail stoppers, wherein each slide stopper of the at least one slide stopper is movable between a corresponding one of the at least one pair of rail stoppers.

16. The electronic device of claim 1, wherein the elastic element comprises an elastic body.

17. The electronic device of claim 16, wherein the elastic body comprises a spring.

18. The electronic device of claim 1, wherein the elastic element comprises a roller configured to contact the guide and an elastic body configured to apply force to the roller.

19. The electronic device of claim 18, further comprising a pin about which the roller rotates.

20. An electronic device, comprising:

a housing comprising a first housing including first and second opposed surfaces, and a second housing comprising third and fourth opposed surfaces;

a hinge structure disposed between the first housing and the second housing, and configured to provide for rotational motion between the first housing and the second housing; and a flexible display disposed from the first surface of the first housing across the hinge structure to the third surface of the second housing, wherein the hinge structure comprises:

a plurality of rotation shafts;

a first slide plate coupled to at least one of the first housing or the second housing, and configured to provide sliding motion in a first direction substantially perpendicular with respect to the rotation shafts;

a first rail bracket configured to guide the sliding motion of the first slide plate; and at least one elastic element configured to provide an elastic force between the hinge structure and the housing structure, wherein the first slide plate is disposed adjacent to a folding area of the flexible display, to provide a force in the first direction corresponding to the sliding motion to the folding area of the flexible display.

21. The electronic device according to claim 20, wherein the hinge structure further comprises:

a second slide plate coupled to at least one of the first housing or the second housing, and configured to provide sliding motion in a second direction opposite to the first direction; and a second rail bracket configured to guide the sliding motion of the second slide plate, wherein the second slide plate is disposed adjacent to the folding area of the flexible display, to provide a force in the second direction corresponding to the sliding motion to the folding area of the flexible display.

22. The electronic device according to claim 20, comprising a mobile phone.

23. The electronic device according to claim 20, wherein the at least one elastic element comprises a spring.

24. The electronic device according to claim 20, wherein the folding area of the flexible display is configured to form a curved surface as the hinge structure is folded.

25. A portable communication device comprising:
a flexible display including a first display area and a second display area;
a housing accommodating the flexible display, and including a first housing portion corresponding to the first display area and a second housing portion corresponding to the second display area;
a hinge coupled between the first housing portion and the second housing portion to facilitate folding of the flexible display with respect to the hinge such that the first display area faces a first direction and the second display area faces a second direction substantially opposite to the first direction when the flexible display is folded with respect to the hinge;
a slide member coupled with the first housing portion or the second housing portion, and disposed to slide along a guide extending from the hinge; and
an elastic member disposed in contact with the slide member to provide an elastic force that causes the slide member to slide along the guide away from the hinge such that the first housing portion or the second housing portion coupled with the slide member moves away from the hinge.

26. The portable communication device of claim 25, wherein the slide member includes a first slide member coupled with the first housing portion, and a second slide member coupled with the second housing portion, and
wherein the elastic member includes a first elastic member coupled with the first slide member and a second elastic member coupled with the second slide member.

27. The portable communication device of claim 26, wherein the first elastic member is configured to provide a first elastic force between the first housing portion and a first portion of the hinge via the first slide member, and the second elastic member is configured to provide a second elastic force between the second housing portion and a second portion of the hinge via the second slide member.

28. The portable communication device of claim 25, further comprising:
first circuitry accommodated in the first housing portion;
second circuitry accommodated in the second housing portion; and
a flexible printed circuit board (FPCB) connected between the first circuitry and the second circuitry and disposed through the hinge.

29. The portable communication device of claim 25, further comprising:
a polymer layer disposed between the flexible display and the hinge.

30. The portable communication device of claim 29, wherein the polymer layer includes at least one of polyimide, polyurethane or polyethylene terephthalate.

* * * * *